US00RE50417E

(19) United States
(12) Reissued Patent
Konda

(10) Patent Number: US RE50,417 E
(45) Date of Reissued Patent: May 6, 2025

(54) VLSI LAYOUTS OF FULLY CONNECTED GENERALIZED NETWORKS

(71) Applicant: Konda Technologies Inc., San Jose, CA (US)

(72) Inventor: Venkat Konda, San Jose, CA (US)

(73) Assignee: Konda Technologies Inc., San Jose, CA (US)

(21) Appl. No.: 16/202,067

(22) Filed: Nov. 27, 2018

Related U.S. Patent Documents

Reissue of:
(64) Patent No.: 8,269,523
Issued: Sep. 18, 2012
Appl. No.: 12/601,275
PCT Filed: May 22, 2008
PCT No.: PCT/US2008/064605
§ 371 (c)(1),
(2) Date: May 31, 2010
PCT Pub. No.: WO2008/147928
PCT Pub. Date: Dec. 4, 2008

U.S. Applications:
(60) Provisional application No. 60/940,394, filed on May 25, 2007.

(51) Int. Cl.
*H03K 19/177* (2020.01)
*G09G 3/3266* (2016.01)

(52) U.S. Cl.
CPC ..... *G09G 3/3266* (2013.01); *H03K 19/177* (2013.01)

(58) Field of Classification Search
CPC ..... H03K 19/177
(Continued)

(56) References Cited

U.S. PATENT DOCUMENTS 4,813,038 A * 3/1989 Lee ..... 370/390
5,153,843 A 10/1992 Batcher
(Continued)

FOREIGN PATENT DOCUMENTS

WO WO2008109756 9/2008
WO WO 2008/147928 A1 12/2008
(Continued)

OTHER PUBLICATIONS

Guy Lemieux et.al., Generating highlyroutablesparse crossbars for PLDs. In ACMISIGDA Int'l. Symposium on Field Programmable Gate Arrays, pp. 155-164, Monterey, CA, Feb. 2000.
(Continued)

*Primary Examiner* — My Trang Ton

(57) ABSTRACT

In accordance with the invention, VLSI layouts of generalized multi-stage networks for broadcast, unicast and multicast connections are presented using only horizontal and vertical links. The VLSI layouts employ shuffle exchange links where outlet links of cross links from switches in a stage in one sub-integrated circuit block are connected to inlet links of switches in the succeeding stage in another sub-integrated circuit block so that said cross links are either vertical links or horizontal and vice versa. In one embodiment the sub-integrated circuit blocks are arranged in a hypercube arrangement in a two-dimensional plane. The VLSI layouts exploit the benefits of significantly lower cross points, lower signal latency, lower power and full connectivity with significantly fast compilation.

The VLSI layouts presented are applicable to generalized multi-stage networks $V(N_1, N_2, d, s)$, generalized folded multi-stage networks $V_{fold}(N_1, N_2, d, s)$, generalized butter-
(Continued)

fly fat tree networks $V_{bft}(N_1, N_2, d, s)$, generalized multi-link multi-stage networks $V_{mlink}(N_1, N_2, d, s)$, generalized folded multi-link multi-stage networks $V_{fold\text{-}mlink}(N_1, N_2, d, s)$, generalized multi-link butterfly fat tree networks $V_{mlink\text{-}bft}(N_1, N_2, d, s)$, and generalized hypercube networks $V_{hcube}(N_1, N_2, d, s)$ for s=1, 2, 3 or any number in general. The embodiments of VLSI layouts are useful in wide target applications such as FPGAs, CPLDs, pSoCs, ASIC placement and route tools, networking applications, parallel & distributed computing, and reconfigurable computing.

13 Claims, 39 Drawing Sheets

(58) Field of Classification Search
USPC ..... 326/38–41; 370/312, 360, 388, 390, 412
See application file for complete search history.

(56) References Cited

U.S. PATENT DOCUMENTS

| | | | | |
|---|---|---|---|---|
| 5,406,556 | A * | 4/1995 | Widjaja et al. | 370/381 |
| 5,451,936 | A | 9/1995 | Yang et al. | |
| 5,856,977 | A * | 1/1999 | Yang et al. | 370/395.72 |
| 6,018,523 | A | 1/2000 | Even | |
| 6,049,542 | A * | 4/2000 | Prasad | 370/386 |
| 6,157,643 | A * | 12/2000 | Ma | 370/389 |
| 6,185,220 | B1 | 2/2001 | Muthukrishnan et al. | |
| 6,567,858 | B1 * | 5/2003 | Yang et al. | 709/238 |
| 6,940,308 | B2 * | 9/2005 | Wong | 326/41 |
| 7,130,920 | B1 * | 10/2006 | Sailor | 709/238 |
| 7,136,380 | B2 * | 11/2006 | Li | 370/388 |
| 7,154,887 | B2 * | 12/2006 | Wu et al. | 370/388 |
| 7,161,906 | B2 * | 1/2007 | Dell | H04L 49/3081 370/231 |
| 7,346,049 | B2 * | 3/2008 | Towles | 370/386 |
| 7,349,387 | B2 * | 3/2008 | Wu | 370/360 |
| 7,397,796 | B1 * | 7/2008 | Smiljani | 370/390 |
| 7,424,010 | B2 * | 9/2008 | Konda | 370/388 |
| 7,424,011 | B2 * | 9/2008 | Konda | 370/388 |
| 7,468,974 | B1 * | 12/2008 | Carr et al. | 370/388 |
| 7,924,052 | B1 * | 4/2011 | Feng et al. | 326/41 |
| 8,098,081 | B1 * | 1/2012 | Trimberger | 326/41 |
| 8,170,040 | B2 | 5/2012 | Konda | |
| 8,270,400 | B2 | 9/2012 | Konda | |
| 8,363,649 | B2 | 1/2013 | Konda | |
| 2010/0135286 | A1 | 6/2010 | Konda | |
| 2010/0172349 | A1 | 7/2010 | Konda | |
| 2011/0037498 | A1 | 2/2011 | Konda | |
| 2011/0044329 | A1 | 2/2011 | Konda | |

FOREIGN PATENT DOCUMENTS

| | | |
|---|---|---|
| WO | WO2008147926 | 12/2008 |
| WO | WO2008147927 | 12/2008 |

OTHER PUBLICATIONS

S. Sivaswamy et al., "HARP: hard-wired routing pattern FPGAs", FPGA'05, Monterey, California, USA, Feb. 20-22, 2005.

Yeh, C.-H., E.A. Varvarigos, and B. Parhami, "Efficient VLSI layouts of hypercubic networks," Proc. Symp. Frontiers of Massively Parallel Computation, Feb. 1999.

C. Clos, "A Study of Non-Blocking Switching Networks," Bell System Technical Journal, 32:406-424, 1953.

A. DeHon, "Balancing Interconnect and Computation in a Reconfigurable Computing Array," ACM Int. Symp. on FPGA, pp. 69-78, Feb. 1999.

Chihming Chang, Rami Melhem, "Arbitrary Size Benes Networks", Journal: Parallel Processing Letters—PPL , vol. 7, No. 3, pp. 279-284, 1997.

Hoda El-Sayed and Abdou Youssef; "The r-truncated Benes Networks and their Randomized Routing Algorithms" 1997 Intl Conf on Parallel and Dist Sys, Seoul, Korea, Dec. 1997.

Guy Lemieux and David Lewis, "Using Sparse Crossbars within LUT Clusters", Procds of the ACM/SIGDA Intl Symp on Field Prog Gate Arrays 2001, Feb. 11-13, 2001, Monterey, CA.

P. Manuel, W. K. Qureshi, A. William, A. Muthumalai, "VLSI layout of Benes networks,", J. of Discrete Math. Sci. & Cryptography, vol. 10, No. 4, pp. 461-472, 2007.

Quinn, Michael J, "Parallel Computing: Theory and Practice", 2nd. ed., 1994, McGraw Hill Series in computer Science, Networks, and parallel computing, ISBN 0-07-051294-9.

Ronald I. Greenberg, "The Fat-Pyramid and Universal Parallel Computation Independent of wire delay" IEEE Trans. Computers, 43(12):1358-1364, Dec. 1994.

Hypertree: A Multiprocessor Interconnection Topology , by James R. Goodman and Carlo H Sequin, Computer Science Technical Report #427, Dept , of EECS, University of California.

Data Movement Techniques for the pyramid computer, Russ Miller and Quentin F. Stout, SIAM Journal on Computing, vol. 16, No. 1, pp. 38-60, Feb. 1987.

A. DeHon, "Unifying Mesh- and Tree-Based Programmable Interconnect," IEEE Trans. on Very Large Scale Int. Systems, vol. 12, No. 10, pp. 1051-1065, Oct. 2004.

Guy Lemieux and David Lewis. Analtyical framework for switch block design. In Intl. Conference on Field Programmable Logic and Applications, pp. 122-131, Sep. 2002.

Chen, G; Lau, FCM, "A tight layout of the cube-connected cycles", The 4th International Conference on High Perf. Computing, Bangalore, India, Dec. 18-21, 1997, p. 422-427.

Michael Shyu, Yu-Dong Chang, Guang-Ming Wu, and Yao-Wen Chang, Generic universal switch blocks. IEEE Transactions on Computers,49(4):348-359, Apr. 2000.

Y. Yamada, et al. , "Folded Fat H-Tree: an interconnection topology for Dynamically Reconfigurable Processor Array", Embed and Ubiq. Cmpting, Intl Conf. EUC 2004.

A. DeHon. Balancing Interconnect and Computation in a Reconfigurable Computing Array (or, why you don't really want 100% LUT utili). In Proc. of intl. symp. on FPGAs, Feb. 1999.

André DeHon. Compact, Multilayer Layout for Butterfly Fat-Tree. In Twelfth Annual ACM Symposium on Parallel Algs and Architectures (SPAA 2000), pp. 206-215, Jul. 9-12, 2000.

V. P. Roychdowdhury et. al., "Segmented Channel Routing," IEEE Trans on Computer-Aided Design of Integrated Circuits and Systems, vol. 12, No. 1, pp. 79-95, Jan. 1993.

Ivo Dobbelaere, Mark Horowitz, and Abbas El Gamal. Regenerative feedback repeaters for programmable interconnections. IEEE Journal of Solid-State Circuits, 30(11), 1995.

F. Petrini et. al., k-ary n-trees: High performance networks for massively parallel architectures, in: Proceedings of the 11th Intl Parallel Proc. Symp. , IPPS'97, pp. 87-93.

P.Pande et al. "Evaluation of MP-Soc Interconnect Architectures: a Case Study", Proceedings of 4th IWSOC, Banff, Alberta, Canada, Jul. 19-21, 2004.

Yeh, C.-H., Varvarigos, E.A., Parhami, B.: Multilayer VLSI layout for interconnection networks. In: Proc. Intl. Conf. on Parallel Processing, 2000.

M. Lin, A. El Gamal, "A Low-Power Field-Programmable Gate Array Routing Fabric," IEEE Transactions on Very Large Scale Integration, vol. 17, No. 10, pp. 1481-1494, Oct. 2009.

Avior, A et. al., A Tight Layout of the Butterfly Network. Proc. 8-th Annual ACM Symp. on Parallel Alg. and Arch. (SPAA '96), ACM Press Ed., 1996, pp. 170-175.

A. El Gamal et. al., "An Architecture for Electrically Configurable Gate Arrays," IEEE Jrnl of Solid-State Circuits, vol. 24, No. 2, pp. 394-398, Apr. 1989.

Vaughn Betz et. al., Directional bias and non-uniformity in FPGA global routing architectures. In IEEE/ACM Intl. Conference on Computer-Aided Design, pp. 652-659, san jose, 96.

(56) References Cited

OTHER PUBLICATIONS

André DeHon. Rent's Rule Based Switching Requirements. In System-Level Interconnect Prediction (SLIP 2001), pp. 197-204, Mar. 31-Apr. 1, 2001.

* cited by examiner

FIG. 1K1
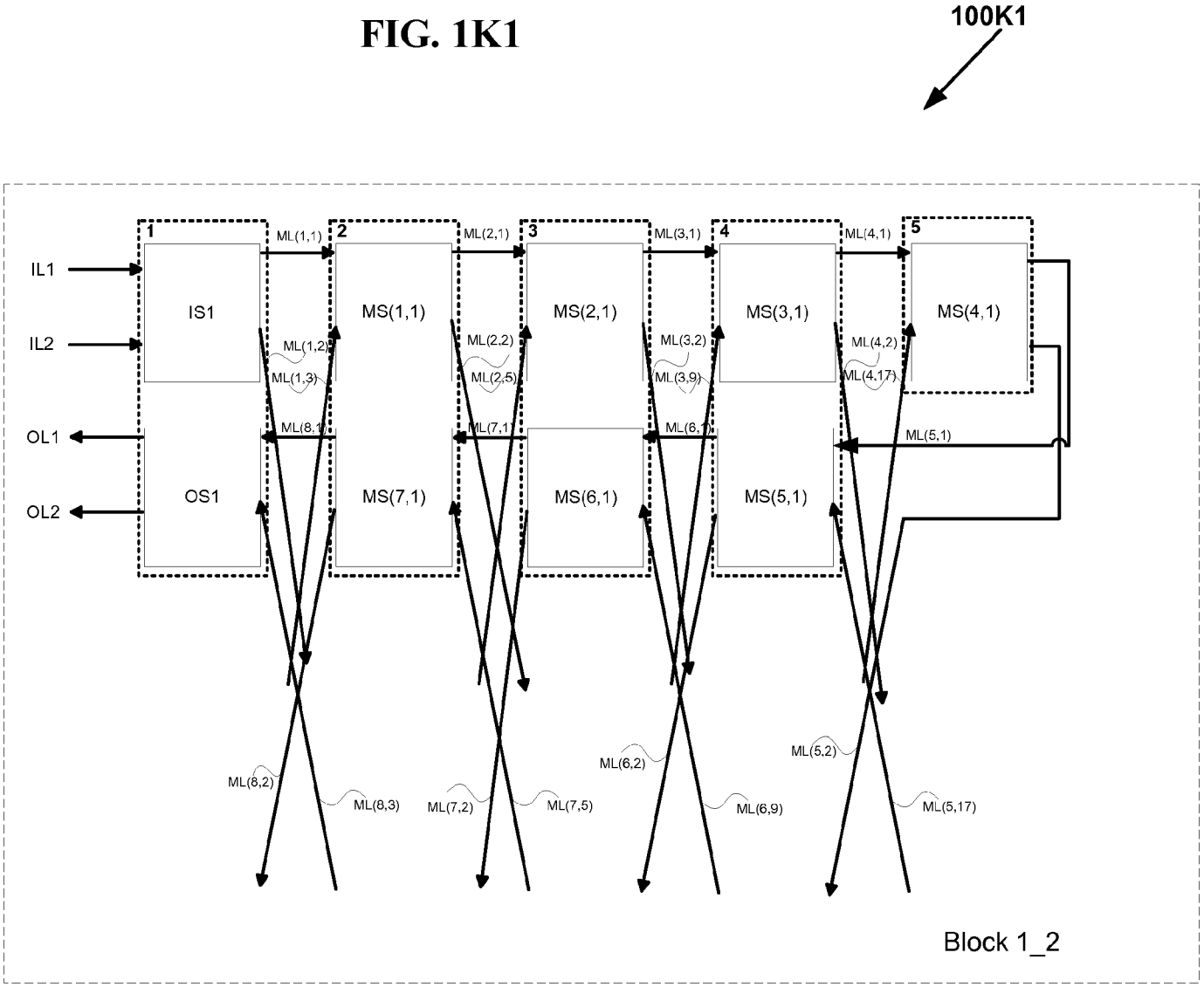

FIG. 1L1
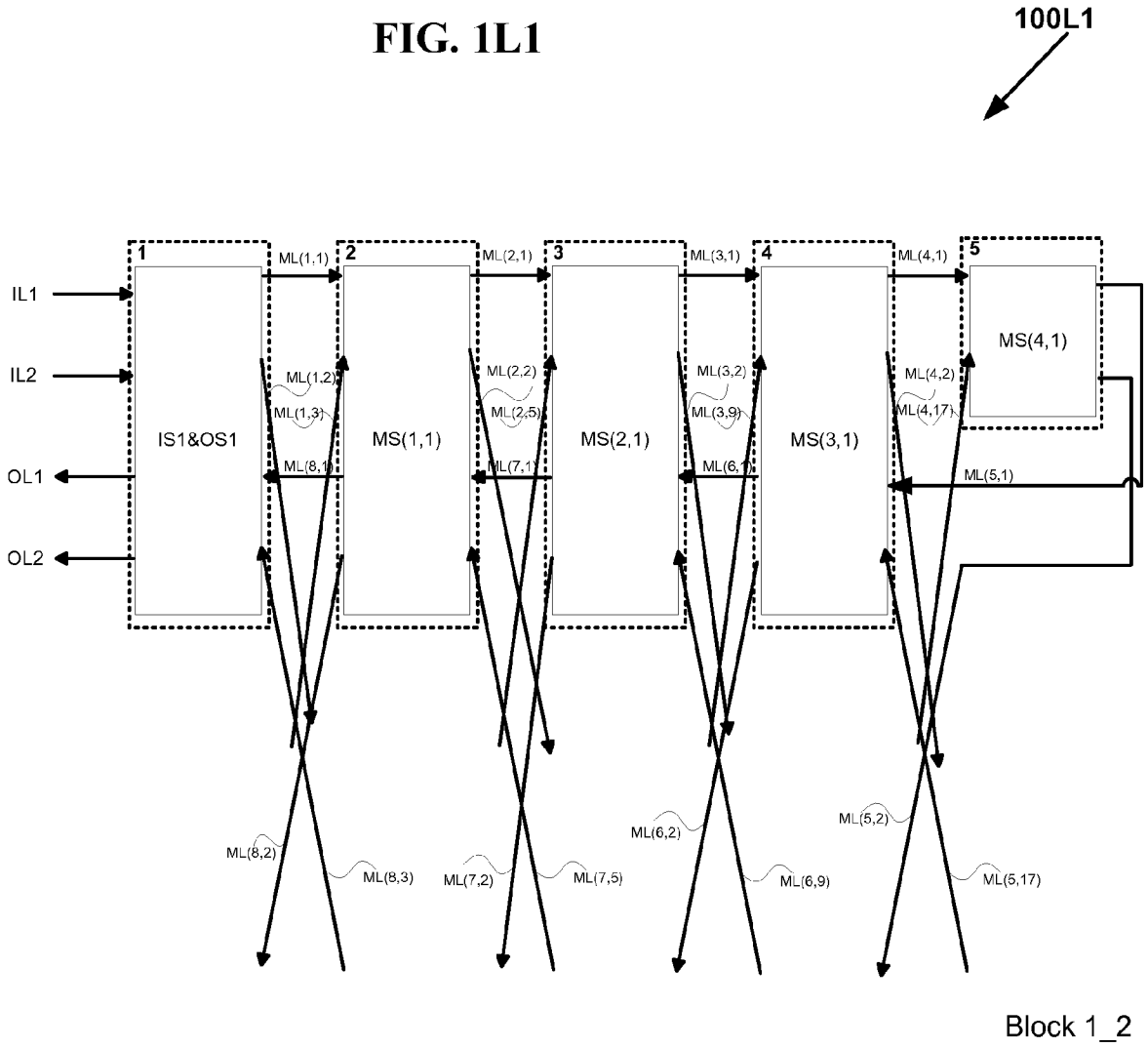

FIG. 2A2
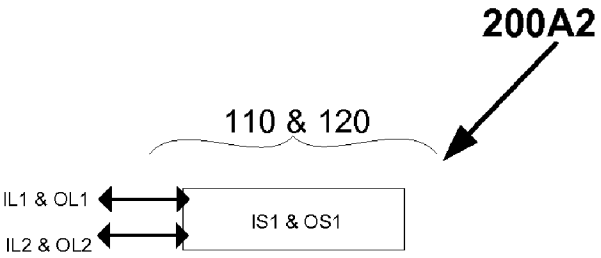
FIG. 2A3
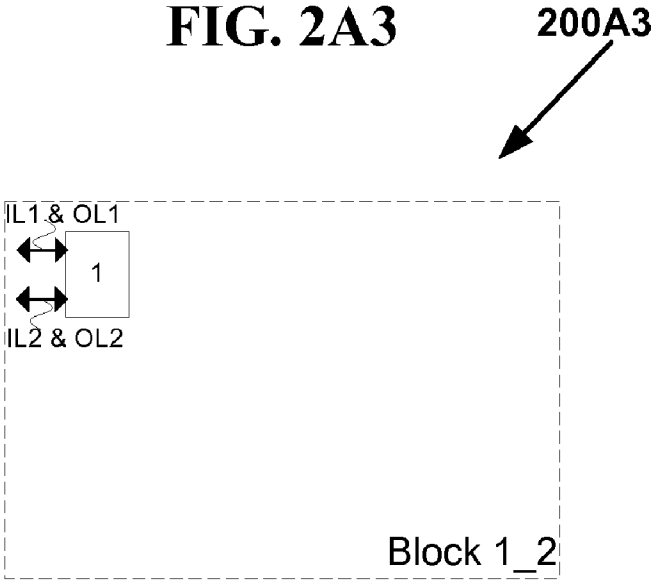
FIG. 2A1
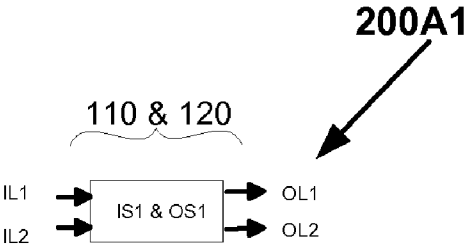

FIG. 2B1
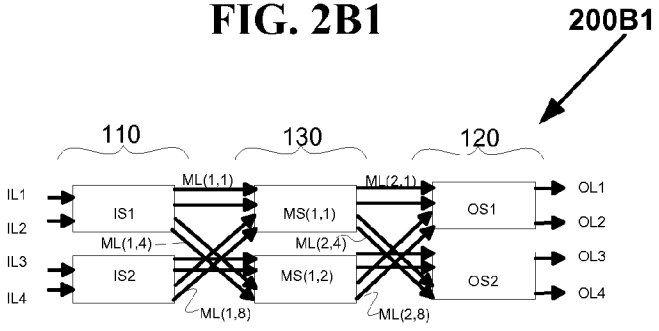
FIG. 2B2
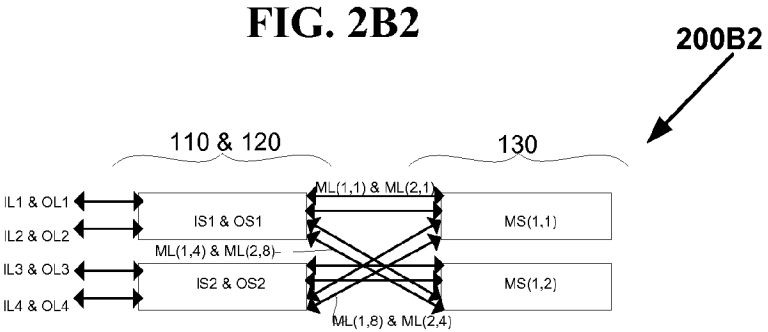
FIG. 2B3
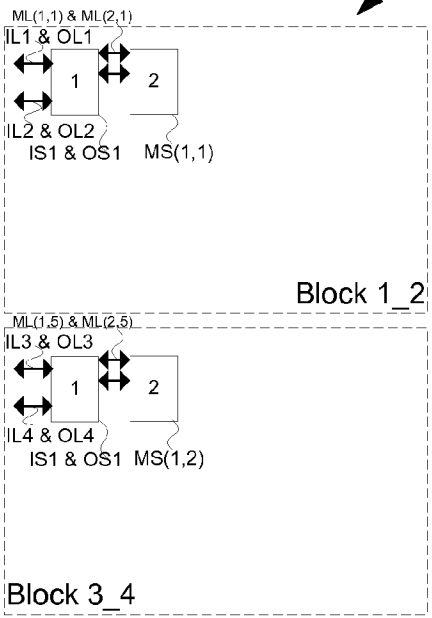
FIG. 2B4
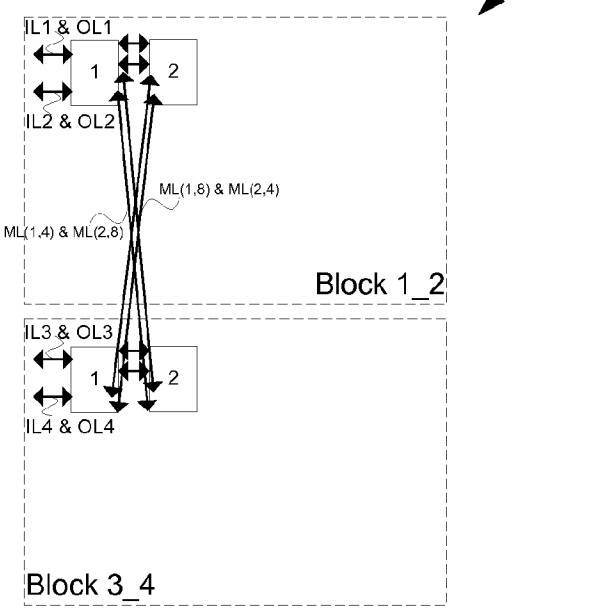

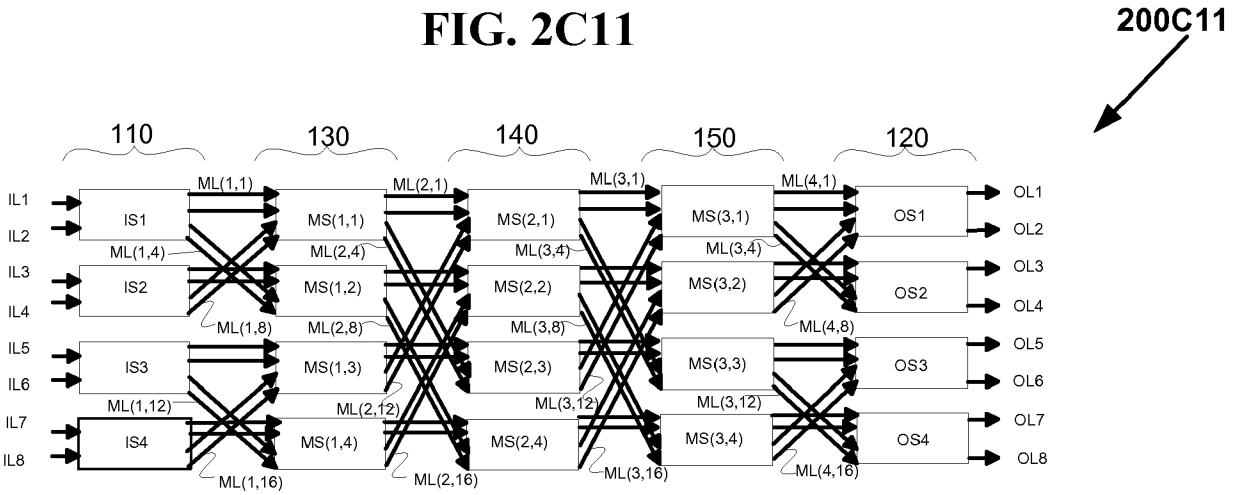
FIG. 2C11
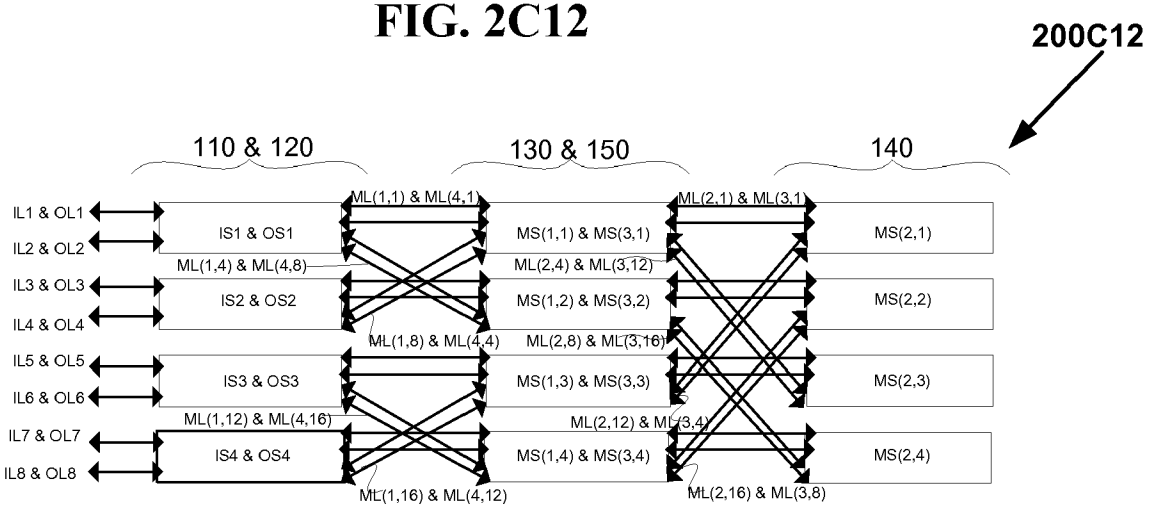
FIG. 2C12

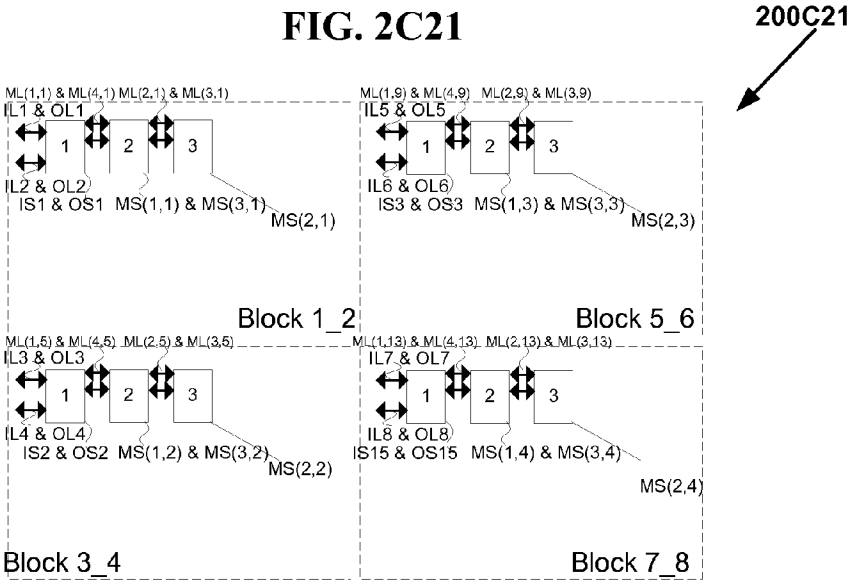
FIG. 2C21
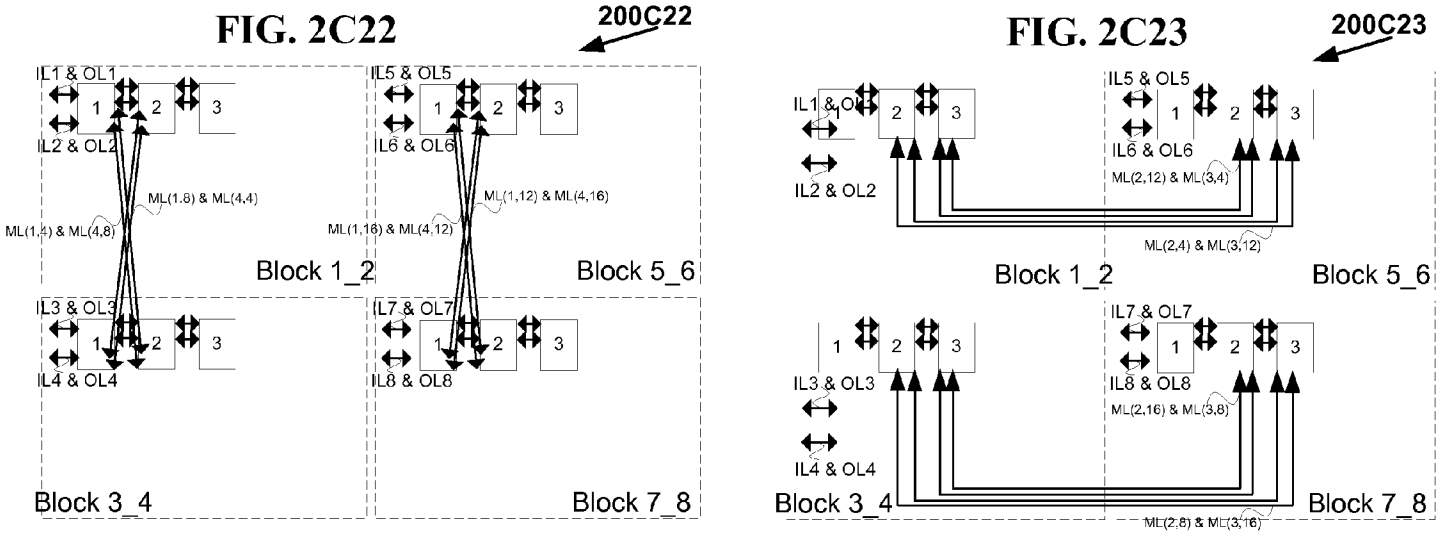
FIG. 2C22
FIG. 2C23

FIG. 2D1
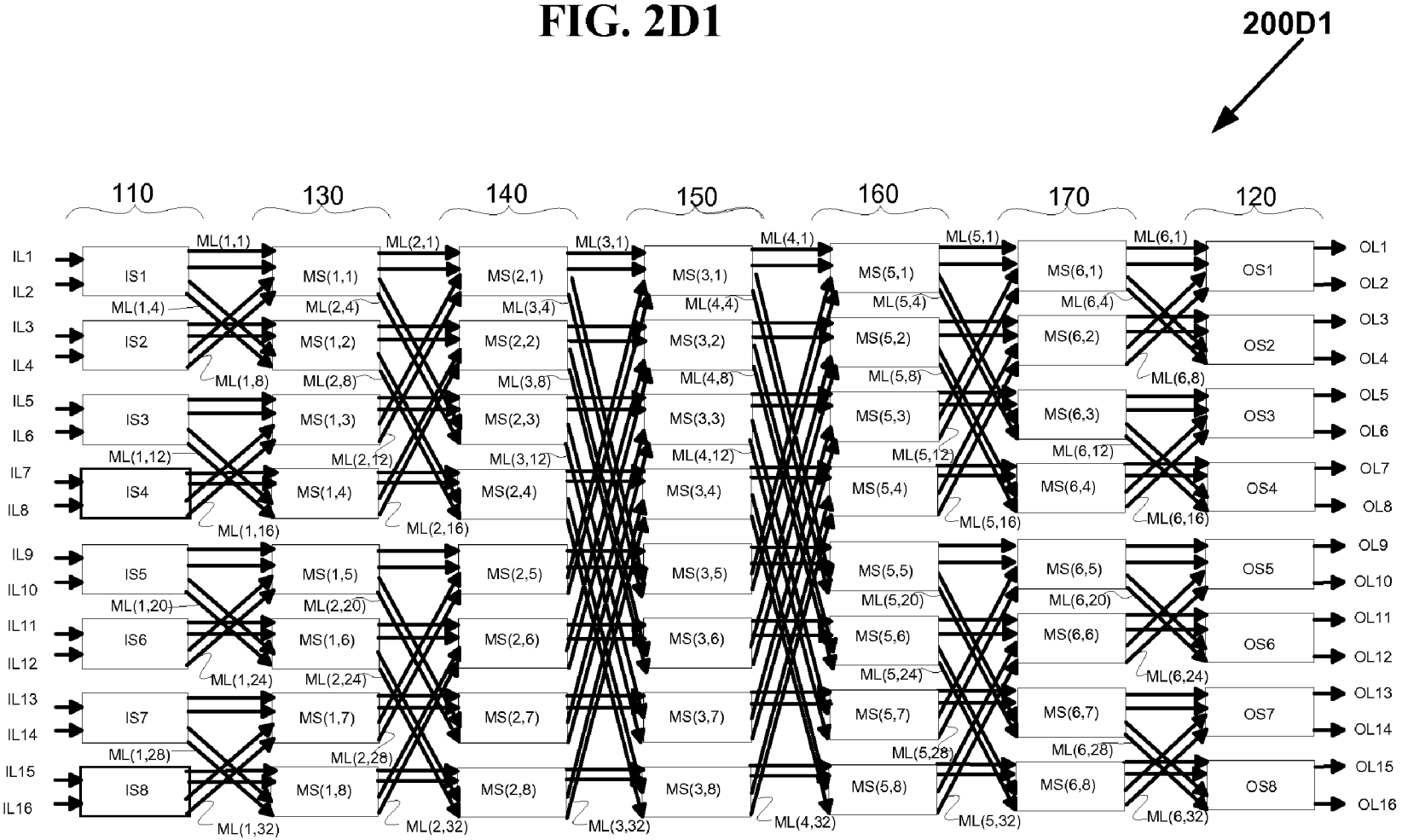

FIG. 2D2
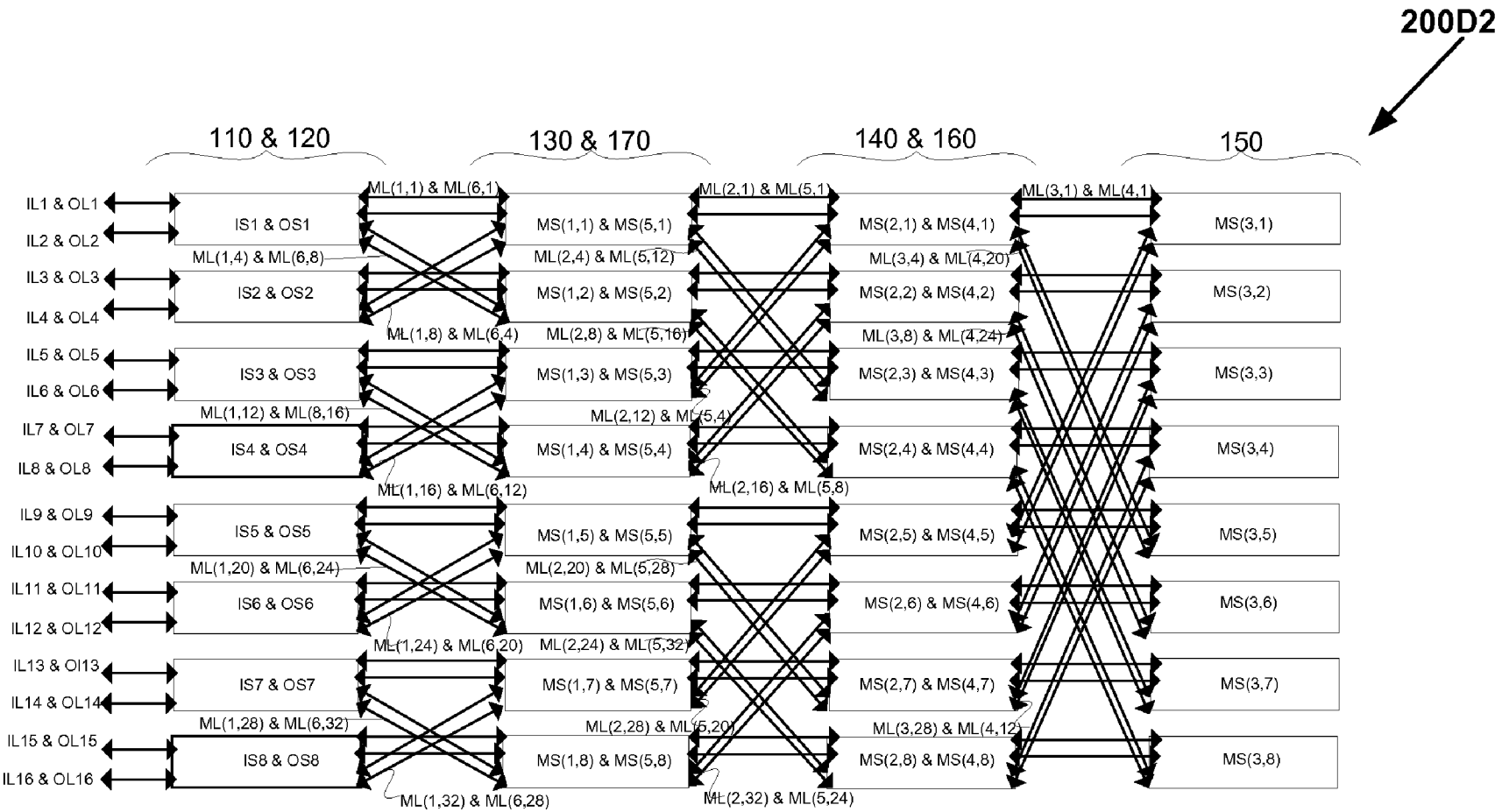

FIG. 2D3
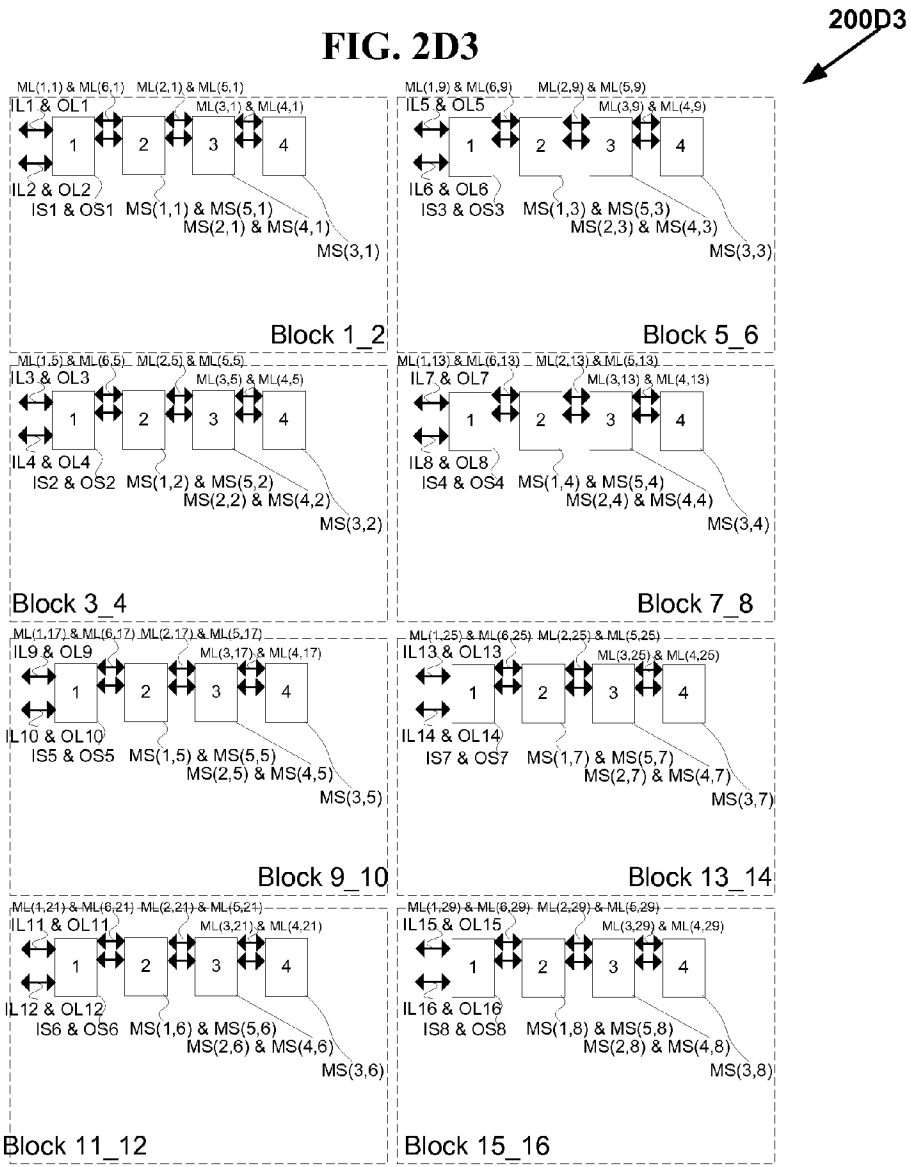

FIG. 2D4
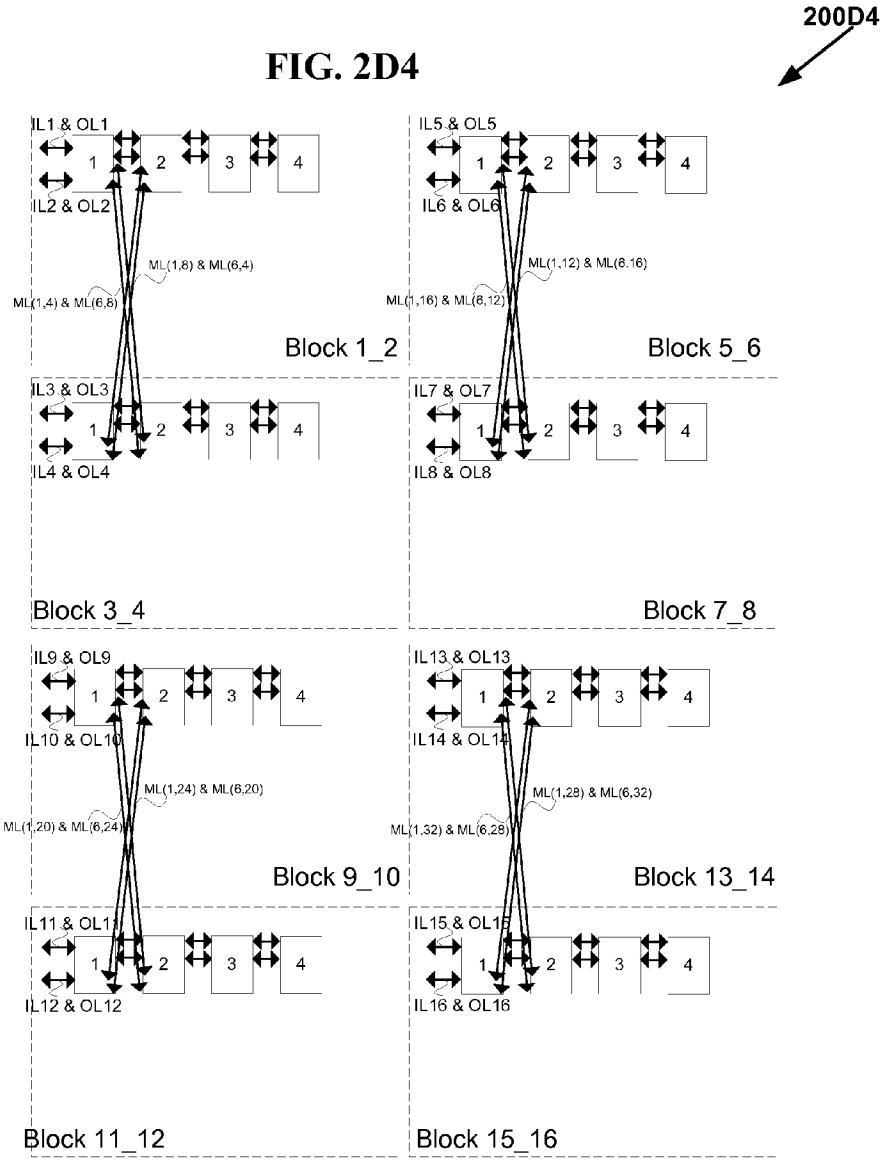

FIG. 2D5
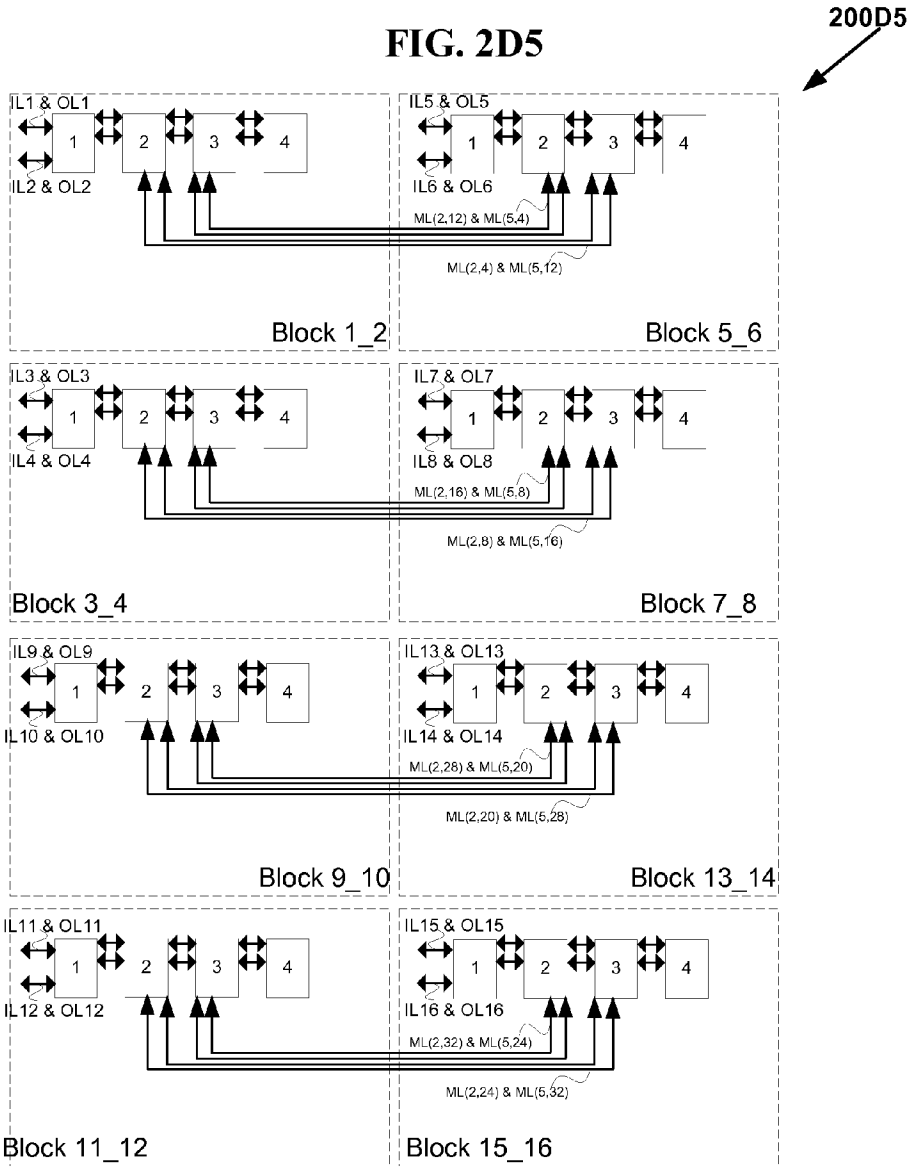

FIG. 2D6
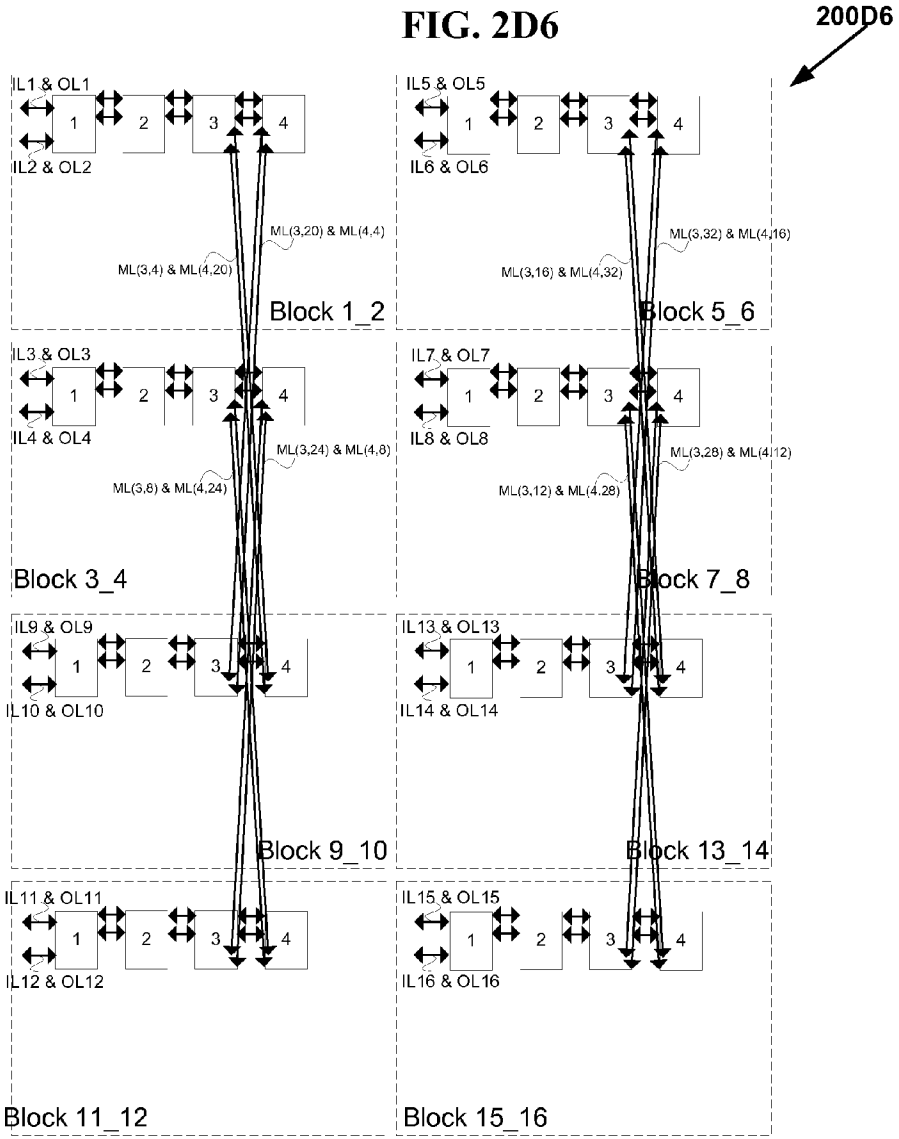

FIG. 4C1
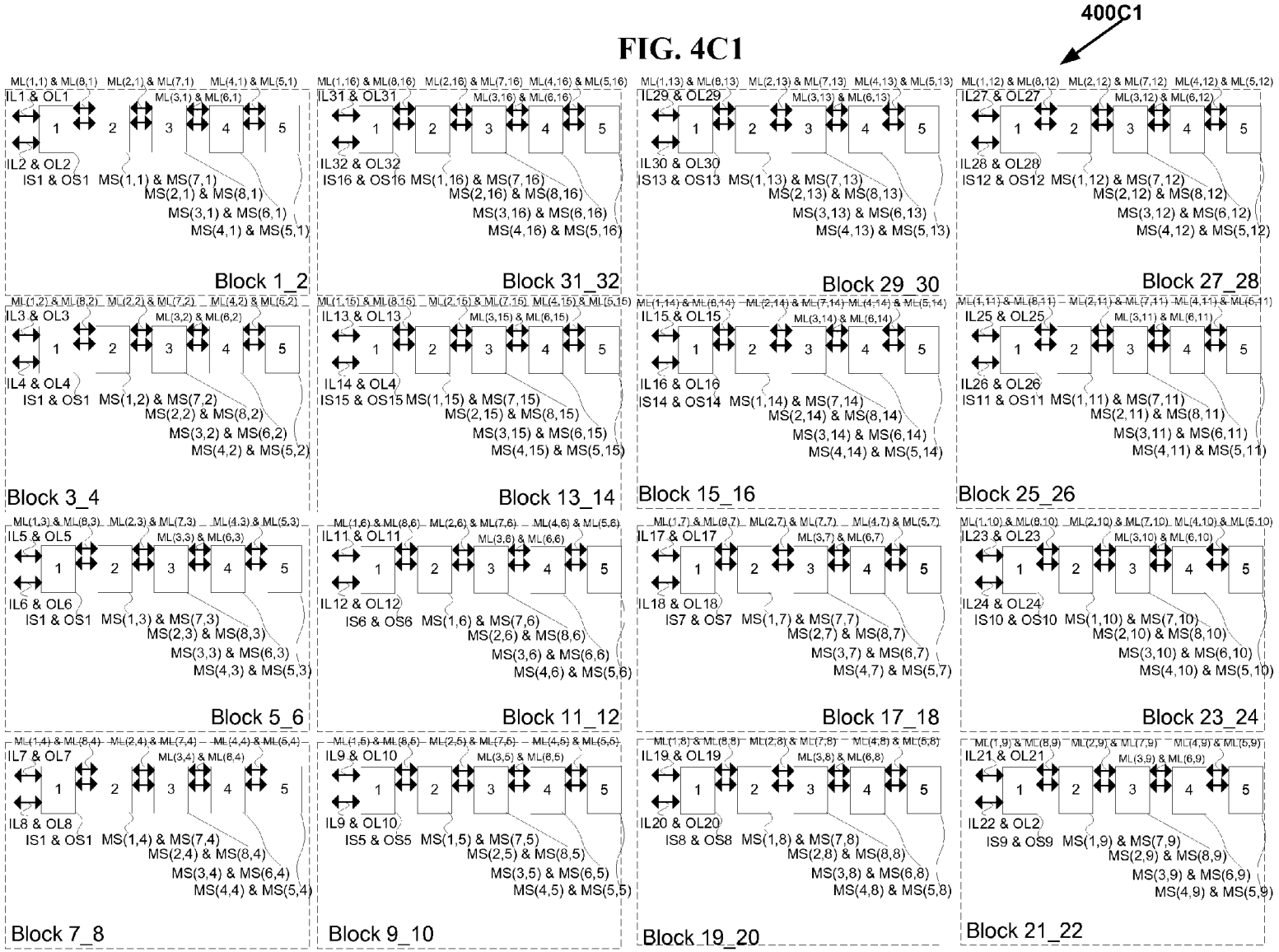

FIG. 5A
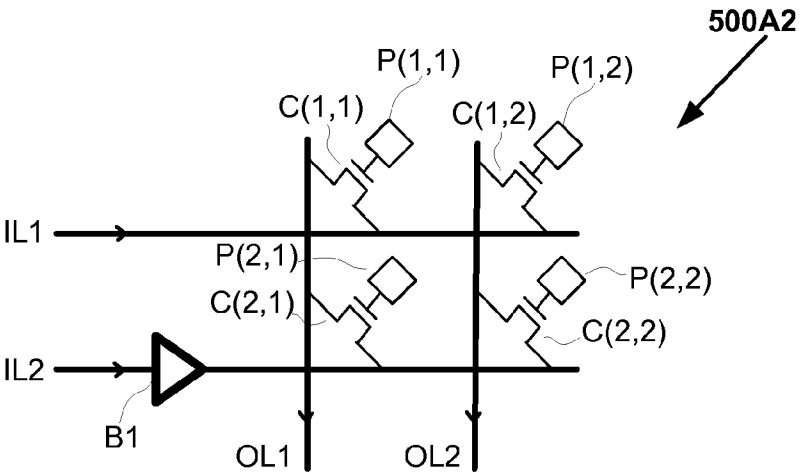
FIG. 5A2
(Prior Art)
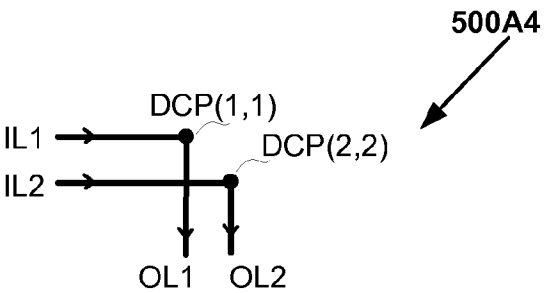
FIG. 5A4
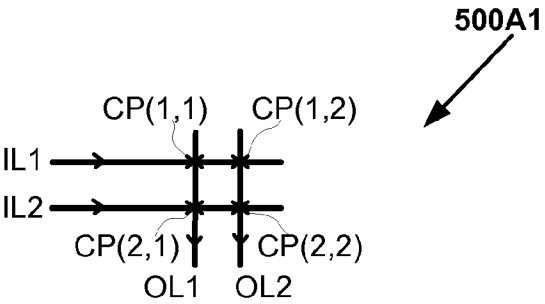
FIG. 5A1
(Prior Art)
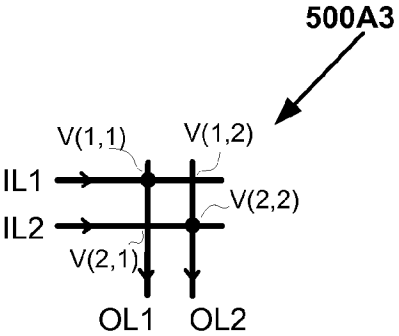
FIG. 5A3
(Prior Art)

VLSI LAYOUTS OF FULLY CONNECTED GENERALIZED NETWORKS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This application [is related to and] *is an application for reissue of U.S. Pat. No. 8,269,523 which* claims priority of the PCT Application Serial No. PCT/US08/64605 entitled "VLSI LAYOUTS OF FULLY CONNECTED GENERALIZED NETWORKS" by Venkat Konda assigned to the same assignee as the current application, filed May 22, 2008, [and] *which in turn claims priority of* the U.S. Provisional Patent Application Ser. No. 60/940,394 entitled "VLSI LAYOUTS OF FULLY CONNECTED GENERALIZED NETWORKS" by Venkat Konda assigned to the same assignee as the current application, filed May 25, 2007.

This application is related to and incorporates by reference in its entirety the U.S. application Ser. No. 12/530,207 entitled "FULLY CONNECTED GENERALIZED MULTI-STAGE NETWORKS" by Venkat Konda assigned to the same assignee as the current application, filed Sep. 6, 2009, the PCT Application Serial No. PCT/US08/56064 entitled "FULLY CONNECTED GENERALIZED MULTI-STAGE NETWORKS" by Venkat Konda assigned to the same assignee as the current application, filed Mar. 6, 2008, the U.S. Provisional Patent Application Ser. No. 60/905,526 entitled "LARGE SCALE CROSSPOINT REDUCTION WITH NONBLOCKING UNICAST & MULTICAST IN ARBITRARILY LARGE MULTI-STAGE NETWORKS" by Venkat Konda assigned to the same assignee as the current application, filed Mar. 6, 2007, and the U.S. Provisional Patent Application Ser. No. 60/940,383 entitled "FULLY CONNECTED GENERALIZED MULTI-STAGE NETWORKS" by Venkat Konda assigned to the same assignee as the current application, filed May 25, 2007.

This application is related to and incorporates by reference in its entirety the U.S. patent application Ser. No. 12/601,273 entitled "FULLY CONNECTED GENERALIZED BUTTERFLY FAT TREE NETWORKS" by Venkat Konda assigned to the same assignee as the current application filed concurrently, the PCT Application Serial No. PCT/US08/64603 entitled "FULLY CONNECTED GENERALIZED BUTTERFLY FAT TREE NETWORKS" by Venkat Konda assigned to the same assignee as the current application, filed May 22, 2008, the U.S. Provisional Patent Application Ser. No. 60/940, 387 entitled "FULLY CONNECTED GENERALIZED BUTTERFLY FAT TREE NETWORKS" by Venkat Konda assigned to the same assignee as the current application, filed May 25, 2007, and the U.S. Provisional Patent Application Ser. No. 60/940, 390 entitled "FULLY CONNECTED GENERALIZED MULTI-LINK BUTTERFLY FAT TREE NETWORKS" by Venkat Konda assigned to the same assignee as the current application, filed May 25, 2007.

This application is related to and incorporates by reference in its entirety the U.S. patent application Ser. No. 12/601,274 entitled "FULLY CONNECTED GENERALIZED MULTI-LINK MULTI-STAGE NETWORKS" by Venkat Konda assigned to the same assignee as the current application filed concurrently, the PCT Application Serial No. PCT/US08/64604 entitled "FULLY CONNECTED GENERALIZED MULTI-LINK MULTI-STAGE NETWORKS" by Venkat Konda assigned to the same assignee as the current application, filed May 22, 2008, the U.S. Provisional Patent Application Ser. No. 60/940, 389 entitled "FULLY CONNECTED GENERALIZED REARRANGEABLY NONBLOCKING MULTI-LINK MULTI-STAGE NETWORKS" by Venkat Konda assigned to the same assignee as the current application, filed May 25, 2007, the U.S. Provisional Patent Application Ser. No. 60/940, 391 entitled "FULLY CONNECTED GENERALIZED FOLDED MULTI-STAGE NETWORKS" by Venkat Konda assigned to the same assignee as the current application, filed May 25, 2007 and the U.S. Provisional Patent Application Ser. No. 60/940,392 entitled "FULLY CONNECTED GENERALIZED STRICTLY NON-BLOCKING MULTI-LINK MULTI-STAGE NETWORKS" by Venkat Konda assigned to the same assignee as the current application, filed May 25, 2007.

This application is related to and incorporates by reference in its entirety the U.S. Provisional Patent Application Ser. No. 61/252, 603 entitled "VLSI LAYOUTS OF FULLY CONNECTED NETWORKS WITH LOCALITY EXPLOITATION" by Venkat Konda assigned to the same assignee as the current application, filed Oct. 16, 2009.

This application is related to and incorporates by reference in its entirety the U.S. Provisional Patent Application Ser. No. 61/252, 609 entitled "VLSI LAYOUTS OF FULLY CONNECTED GENERALIZED AND PYRAMID NETWORKS" by Venkat Konda assigned to the same assignee as the current application, filed Oct. 16, 2009.

BACKGROUND OF INVENTION

Multi-stage interconnection networks such as Benes networks and butterfly fat tree networks are widely useful in telecommunications, parallel and distributed computing. However VLSI layouts, known in the prior art, of these interconnection networks in an integrated circuit are inefficient and complicated.

Other multi-stage interconnection networks including butterfly fat tree networks, Banyan networks, Batcher-Banyan networks, Baseline networks, Delta networks, Omega networks and Flip networks have been widely studied particularly for self routing packet switching applications. Also Benes Networks with radix of two have been widely studied and it is known that Benes Networks of radix two are shown to be built with back to back baseline networks which are rearrangeably nonblocking for unicast connections.

The most commonly used VLSI layout in an integrated circuit is based on a two-dimensional grid model comprising only horizontal and vertical tracks. An intuitive interconnection network that utilizes two-dimensional grid model is 2D Mesh Network and its variations such as segmented mesh networks. Hence routing networks used in VLSI layouts are typically 2D mesh networks and its variations. However Mesh Networks require large scale cross points typically with a growth rate of $O(N^2)$ where N is the number of computing elements, ports, or logic elements depending on the application.

Multi-stage interconnection with a growth rate of $O(N\times \log N)$ requires significantly small number of cross points. U.S. Pat. No. 6,185,220 entitled "Grid Layouts of Switching and Sorting Networks" granted to Muthukrishnan et al. describes a VLSI layout using existing VLSI grid model for Benes and Butterfly networks. U.S. Pat. No. 6,940,308 entitled "Interconnection Network for a Field Programmable Gate Array" granted to Wong describes a VLSI layout where switches belonging to lower stage of Benes Network are layed out close to the logic cells and switches belonging to higher stages are layed out towards the center of the layout.

Due to the inefficient and in some cases impractical VLSI layout of Benes and butterfly fat tree networks on a semiconductor chip, today mesh networks and segmented mesh networks are widely used in the practical applications such as field programmable gate arrays (FPGAs), programmable logic devices (PLDs), and parallel computing interconnects. The prior art VLSI layouts of Benes and butterfly fat tree networks and VLSI layouts of mesh networks and segmented mesh networks require large area to implement the switches on the chip, large number of wires, longer wires, with increased power consumption, increased latency of the signals which effect the maximum clock speed of operation. Some networks may not even be implemented practically on a chip due to the lack of efficient layouts.

SUMMARY OF INVENTION

When large scale sub-integrated circuit blocks with inlet and outlet links are layed out in an integrated circuit device in a two-dimensional grid arrangement, (for example in an FPGA where the sub-integrated circuit blocks are Lookup Tables) the most intuitive routing network is a network that uses horizontal and vertical links only (the most often used such a network is one of the variations of a 2D Mesh network). A direct embedding of a generalized multi-stage network on to a 2D Mesh network is neither simple nor efficient.

In accordance with the invention, VLSI layouts of generalized multi-stage networks for broadcast, unicast and multicast connections are presented using only horizontal and vertical links The VLSI layouts employ shuffle exchange links where outlet links of cross links from switches in a stage in one sub-integrated circuit block are connected to inlet links of switches in the succeeding stage in another sub-integrated circuit block so that said cross links are either vertical links or horizontal and vice versa. In one embodiment the sub-integrated circuit blocks are arranged in a hypercube arrangement in a two-dimensional plane. The VLSI layouts exploit the benefits of significantly lower cross points, lower signal latency, lower power and full connectivity with significantly fast compilation.

The VLSI layouts presented are applicable to generalized multi-stage networks $V(N_1, N_2, d, s)$, generalized folded multi-stage networks $V_{fold}(N_1, N_2, d, s)$, generalized butterfly fat tree networks $V_{bft}(N_1, N_2, d, s)$, generalized multi-link multi-stage networks $V_{mlink}(N_1, N_2, d, s)$, generalized folded multi-link multi-stage networks $V_{fold\text{-}mlink}(N_1, N_2, d, s)$, generalized multi-link butterfly fat tree networks $V_{mlink\text{-}bft}(N_1, N_2, d, s)$, and generalized hypercube networks $V_{hcube}(N_1, N_2, d, s)$ for s=1, 2, 3 or any number in general. The embodiments of VLSI layouts are useful in wide target applications such as FPGAs, CPLDs, pSoCs, ASIC placement and route tools, networking applications, parallel & distributed computing, and reconfigurable computing.

BRIEF DESCRIPTION OF DRAWINGS

FIG. 1K1 is a diagram 100M1 detailed connections of BLOCK 1_2 in the network layout 100C in one embodiment, illustrating the connection links going in and coming out when the layout 100C is implementing V(N, d, s) or $V_{fold}(N, d, s)$ for s=1.

FIG. 1L1 is a diagram 100L1 detailed connections of BLOCK 1_2 in the network layout 100C in one embodiment, illustrating the connection links going in and coming out when the layout 100C is implementing V(N, d, s) or $V_{fold}(N, d, s)$ for s=1.

FIG. 2A1 is a diagram 200A1 of an exemplary symmetrical multi-link multi-stage network $V_{fold\text{-}mlink}(N, d, s)$ having inverse Benes connection topology of one stage with N=2, d=2 and s=2, strictly nonblocking network for unicast connections and rearrangeably nonblocking network for arbitrary fan-out multicast connections, in accordance with the invention. FIG. 2A2 is a diagram 200A2 of the equivalent symmetrical folded multi-link multi-stage network $V_{fold\text{-}mlink}$(N, d, s) of the network 200A1 shown in FIG. 2A1, having inverse Benes connection topology of one stage with N=2, d=2 and s=2, strictly nonblocking network for unicast connections and rearrangeably nonblocking network for arbitrary fan-out multicast connections, in accordance with the invention. FIG. 2A3 is a diagram 200A3 layout of the network $V_{fold\text{-}mlink}$(N, d, s) shown in FIG. 2A2, in one embodiment, illustrating all the connection links.

FIG. 2B1 is a diagram 200B1 of an exemplary symmetrical multi-link multi-stage network $V_{fold\text{-}mlink}$(N, d, s) having inverse Benes connection topology of one stage with N=4, d=2 and s=2, strictly nonblocking network for unicast connections and rearrangeably nonblocking network for arbitrary fan-out multicast connections, in accordance with the invention. FIG. 2B2 is a diagram 200B2 of the equivalent symmetrical folded multi-link multi-stage network $V_{fold\text{-}mlink}$(N, d, s) of the network 200B1 shown in FIG. 2B1, having inverse Benes connection topology of one stage with N=4, d=2 and s=2, strictly nonblocking network for unicast connections and rearrangeably nonblocking network for arbitrary fan-out multicast connections, in accordance with the invention. FIG. 2B3 is a diagram 200B3 layout of the network $V_{fold\text{-}mlink}$(N, d, s) shown in FIG. 2B2, in one embodiment, illustrating the connection links belonging with in each block only. FIG. 2B4 is a diagram 200B4 layout of the network $V_{fold\text{-}mlink}$(N, d, s) shown in FIG. 2B2, in one embodiment, illustrating the connection links ML(1,i) for i=[1, 8] and ML(2,i) for i=[1,8].

FIG. 2C11 is a diagram 200C11 of an exemplary symmetrical multi-link multi-stage network $V_{fold\text{-}mlink}$(N, d, s) having inverse Benes connection topology of one stage with N=8, d=2 and s=2, strictly nonblocking network for unicast connections and rearrangeably nonblocking network for arbitrary fan-out multicast connections, in accordance with the invention. FIG. 2C12 is a diagram 200C12 of the equivalent symmetrical folded multi-link multi-stage network $V_{fold\text{-}mlink}$(N, d, s) of the network 200C11 shown in FIG. 2C11, having inverse Benes connection topology of one stage with N=8, d=2 and s=2, strictly nonblocking network for unicast connections and rearrangeably nonblocking network for arbitrary fan-out multicast connections, in accordance with the invention.

FIG. 2C21 is a diagram 200C21 layout of the network $V_{fold\text{-}mlink}$(N, d, s) shown in FIG. 2C12, in one embodiment, illustrating the connection links belonging with in each block only. FIG. 2C22 is a diagram 200C22 layout of the network $V_{fold\text{-}mlink}$(N, d, s) shown in FIG. 2C12, in one embodiment, illustrating the connection links ML(1,i) for i=[1, 16] and ML(4,i) for i=[1,16]. FIG. 2C23 is a diagram 200C23 layout of the network $V_{fold\text{-}mlink}$(N, d, s) shown in FIG. 2C12, in one embodiment, illustrating the connection links ML(2,i) for i=[1, 16] and ML(3,i) for i=[1,16].

FIG. 2D1 is a diagram 200D1 of an exemplary symmetrical multi-link multi-stage network $V_{fold\text{-}mlink}$(N, d, s) having inverse Benes connection topology of one stage with N=16, d=2 and s=2, strictly nonblocking network for unicast connections and rearrangeably nonblocking network for arbitrary fan-out multicast connections, in accordance with the invention.

FIG. 2D2 is a diagram 200D2 of the equivalent symmetrical folded multi-link multi-stage network $V_{fold\text{-}mlink}$(N, d, s) of the network 200D1 shown in FIG. 2D1, having inverse Benes connection topology of one stage with N=16, d=2 and s=2, strictly nonblocking network for unicast connections and rearrangeably nonblocking network for arbitrary fan-out multicast connections, in accordance with the invention.

FIG. 2D3 is a diagram 200D3 layout of the network $V_{fold\text{-}mlink}$(N, d, s) shown in FIG. 2D2, in one embodiment, illustrating the connection links belonging with in each block only.

FIG. 2D4 is a diagram 200D4 layout of the network $V_{fold\text{-}mlink}$(N, d, s) shown in FIG. 2D2, in one embodiment, illustrating the connection links ML(1,i) for i=[1, 32] and ML(6,i) for i=[1,32].

FIG. 2D5 is a diagram 200D5 layout of the network $V_{fold\text{-}mlink}$(N, d, s) shown in FIG. 2D2, in one embodiment, illustrating the connection links ML(2,i) for i=[1, 32] and ML(5,i) for i=[1,32].

FIG. 2D6 is a diagram 200D6 layout of the network $V_{fold\text{-}mlink}$(N, d, s) shown in FIG. 2D2, in one embodiment, illustrating the connection links ML(3,i) for i=[1, 32] and ML(4,i) for i=[1,32].

FIG. 4C1 is a diagram 400C1 layout of the network $V_{fold\text{-}mlink}(N, d, s)$ shown in FIG. 1B, in one embodiment, illustrating the connection links belonging with in each block only.

FIG. 5A1 is a diagram 500A1 of an exemplary prior art implementation of a two by two switch; FIG. 5A2 is a diagram 500A2 for programmable integrated circuit prior art implementation of the diagram 500A1 of FIG. 5A1; FIG. 5A3 is a diagram 500A3 for one-time programmable integrated circuit prior art implementation of the diagram 500A1 of FIG. 5A1; FIG. 5A4 is a diagram 500A4 for integrated circuit placement and route implementation of the diagram 500A1 of FIG. 5A1.

DETAILED DESCRIPTION OF THE INVENTION

Figure 1A:
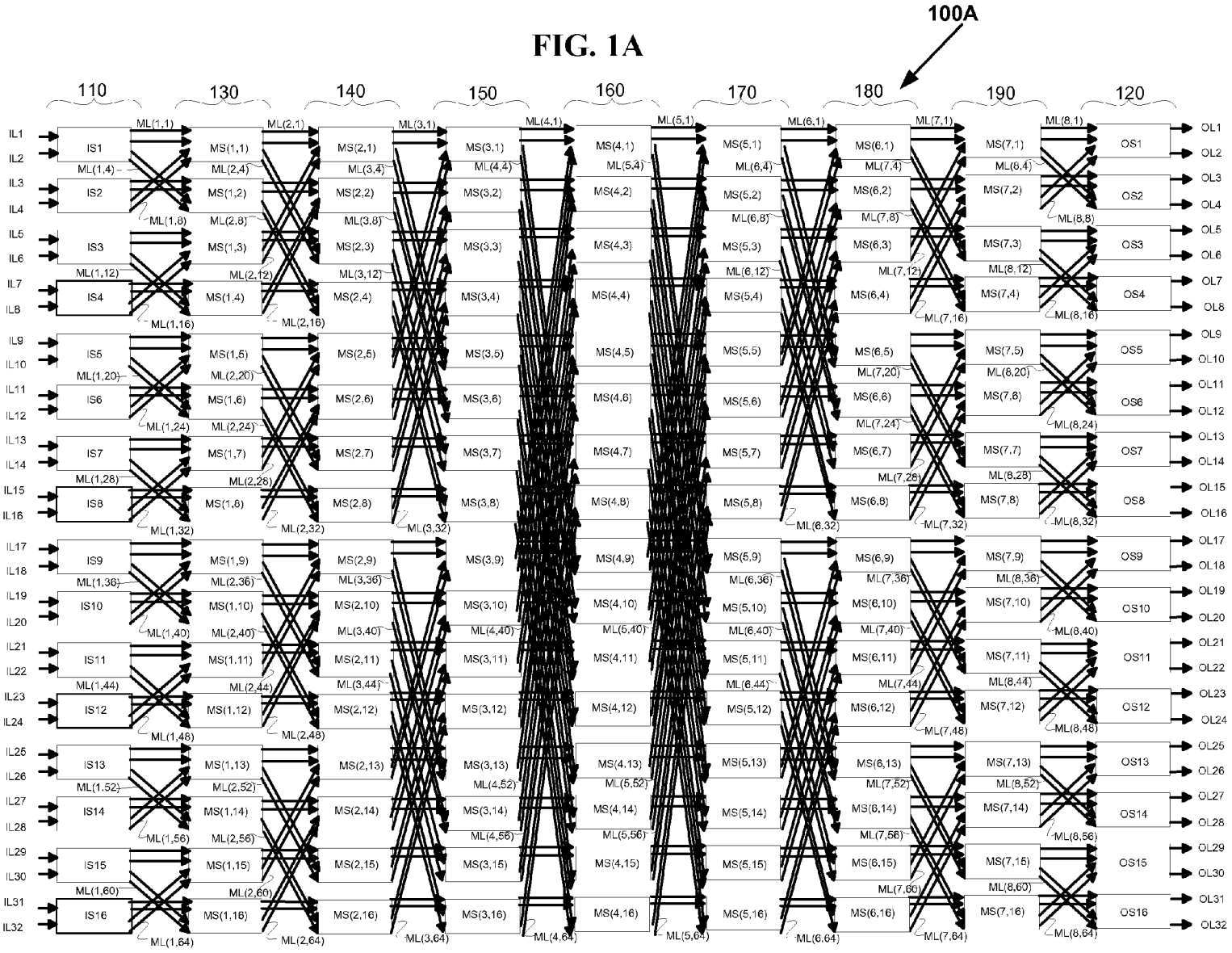
FIG. 1A is a diagram 100A of an exemplary symmetrical multi-link multi-stage network $V_{fold\text{-}mlink}(N, d, s)$ having inverse Benes connection topology of nine stages with N=32, d=2 and s=2, strictly nonblocking network for unicast connections and rearrangeably nonblocking network for arbitrary fan-out multicast connections, in accordance with the invention.

The present invention is concerned with the VLSI layouts of arbitrarily large switching networks for broadcast, unicast and multicast connections. Particularly switching networks considered in the current invention include: generalized multi-stage networks $V(N_1, N_2, d, s)$, generalized folded multi-stage networks $V_{fold}(N_1, N_2, d, s)$, generalized butterfly fat tree networks $V_{bft}(N_1, N_2, d, s)$, generalized multi-link multi-stage networks $V_{mlink}(N_1, N_2, d, s)$, generalized folded multi-link multi-stage networks $V_{fold\text{-}mlink}(N_1, N_2, d, s)$, generalized multi-link butterfly fat tree networks $V_{mlink\text{-}bft}(N_1, N_2, d, s)$, and generalized hypercube networks $V_{hcube}(N_1, N_2, d, s)$ for s=1, 2, 3 or any number in general.

Efficient VLSI layout of networks on a semiconductor chip are very important and greatly influence many important design parameters such as the area taken up by the network on the chip, total number of wires, length of the wires, latency of the signals, capacitance and hence the maximum clock speed of operation. Some networks may not even be implemented practically on a chip due to the lack of efficient layouts. The different varieties of multi-stage networks described above have not been implemented previously on the semiconductor chips efficiently. For example in Field Programmable Gate Array (FPGA) designs, multi-stage networks described in the current invention have not been successfully implemented primarily due to the lack of efficient VLSI layouts. Current commercial FPGA products such as Xilinx Vertex, Altera's Stratix implement island-style architecture using mesh and segmented mesh routing interconnects using either full crossbars or sparse crossbars. These routing interconnects consume large silicon area for crosspoints, long wires, large signal propagation delay and hence consume lot of power.

The current invention discloses the VLSI layouts of numerous types of multi-stage networks which are very efficient. Moreover they can be embedded on to mesh and segmented mesh routing interconnects of current commercial FPGA products. The VLSI layouts disclosed in the current invention are applicable to including the numerous generalized multi-stage networks disclosed in the following patent applications, filed concurrently:

1) Strictly and rearrangeably nonblocking for arbitrary fan-out multicast and unicast for generalized multi-stage networks $V(N_1, N_2, d, s)$ with numerous connection topologies and the scheduling methods are described in detail in the PCT Application Serial No. PCT/US08/56064 that is incorporated by reference above.

2) Strictly and rearrangeably nonblocking for arbitrary fan-out multicast and unicast for generalized butterfly fat tree networks $V_{bft}(N_1, N_2, d, s)$ with numerous connection topologies and the scheduling methods are described in detail in PCT Application Serial No. PCT/US08/64603 that is incorporated by reference above.

3) Rearrangeably nonblocking for arbitrary fan-out multicast and unicast, and strictly nonblocking for unicast for generalized multi-link multi-stage networks $V_{mlink}(N_1, N_2, d, s)$ and generalized folded multi-link multi-stage networks $V_{fold\text{-}mlink}(N_1, N_2, d, s)$ with numerous connection topologies and the scheduling methods are described in detail in PCT Application Serial No. PCT/US08/64604 that is incorporated by reference above.

4) Strictly and rearrangeably nonblocking for arbitrary fan-out multicast and unicast for generalized multi-link butterfly fat tree networks $V_{mlink\text{-}bft}(N_1, N_2, d, s)$ with numerous connection topologies and the scheduling methods are described in detail in PCT Application Serial No. PCT/US08/64603 that is incorporated by reference above.

5) Strictly and rearrangeably nonblocking for arbitrary fan-out multicast and unicast for generalized folded multi-stage networks $V_{fold}(N_1, N_2, d, s)$ with numerous connection topologies and the scheduling methods are described in detail in PCT Application Serial No. PCT/US08/64604 that is incorporated by reference above.

6) Strictly nonblocking for arbitrary fan-out multicast for generalized multi-link multi-stage networks $V_{mlink}(N_1, N_2, d, s)$ and generalized folded multi-link multi-stage networks $V_{fold\text{-}mlink}(N_1, N_2, d, s)$ with numerous connection topologies and the scheduling methods are described in detail in PCT Application Serial No. PCT/US08/64604 that is incorporated by reference above.

7) VLSI layouts of numerous types of multi-stage networks with locality exploitation are described in U.S. Provisional Patent Application Ser. No. 61/252,603 that is incorporated by reference above.

8) VLSI layouts of numerous types of multistage pyramid networks are described in U.S. Provisional Patent Application Ser. No. 61/252,609 that is incorporated by reference above.

In addition the layouts of the current invention are also applicable to generalized multi-stage pyramid networks $V_p(N_1, N_2, d, s)$, generalized folded multi-stage pyramid networks $V_{fold\text{-}p}(N_1, N_2, d, s)$, generalized butterfly fat pyramid networks $V_{bfp}(N_1, N_2\ d, s)$, generalized multi-link multi-stage pyramid networks $V_{mlink\text{-}p}(N_1, N_2, d, s)$, generalized folded multi-link multi-stage pyramid networks $V_{fold\text{-}mlink\text{-}p}(N_1, N_2, d, s)$, generalized multi-link butterfly fat pyramid networks $V_{mlink\text{-}bfp}(N_1, N_2, d, s)$, and generalized hypercube networks $V_{hcube}(N_1, N_2, d, s)$ for s=1, 2, 3 or any number in general.

Symmetric RNB Generalized Multi-Link Multi-Stage Network $V_{mlink}(N_1, N_2, d, s)$:

Referring to diagram 100A in FIG. 1A, in one embodiment, an exemplary generalized multi-link multi-stage network $V_{mlink}(N_1, N_2, d, s)$ where $N_1=N_2=32$; d=2; and s=2 with nine stages of one hundred and forty four switches for satisfying communication requests, such as setting up a telephone call or a data call, or a connection between configurable logic blocks, between an input stage 110 and output stage 120 via middle stages 130, 140, 150, 160, 170, 180 and 190 is shown where input stage 110 consists of sixteen, two by four switches IS1-IS16 and output stage 120 consists of sixteen, four by two switches OS1-OS16. And all the middle stages namely the middle stage 130 consists of sixteen, four by four switches MS(1,1)-MS(1,16), middle stage 140 consists of sixteen, four by four switches MS(2, 1)-MS(2,16), middle stage 150 consists of sixteen, four by four switches MS(3,1)-MS(3,16), middle stage 160 consists of sixteen, four by four switches MS(4,1)-MS(4,16), middle stage 170 consists of sixteen, four by four switches MS(5, 1)-MS(5,16), middle stage 180 consists of sixteen, four by four switches MS(6,1)-MS(6,16), and middle stage 190 consists of sixteen, four by four switches MS(7,1)-MS(7, 16).

As disclosed in PCT Application Serial No. PCT/US08/64604 that is incorporated by reference above, such a network can be operated in rearrangeably non-blocking manner for arbitrary fan-out multicast connections and also can be operated in strictly non-blocking manner for unicast connections.

In one embodiment of this network each of the input switches IS1-IS4 and output switches OS1-OS4 are crossbar switches. The number of switches of input stage 110 and of output stage 120 can be denoted in general with the variable $$\frac{N}{d}.$$

where N is the total number of inlet links or outlet links. The number of middle switches in each middle stage is denoted by $$\frac{N}{d}.$$

The size of each input switch IS1-IS4 can be denoted in general with the notation d*2d and each output switch OS1-OS4 can be denoted in general with the notation 2d*d. Likewise, the size of each switch in any of the middle stages can be denoted as 2d*2d. A switch as used herein can be either a crossbar switch, or a network of switches each of which in turn may be a crossbar switch or a network of switches. A symmetric multi-stage network can be represented with the notation $V_{mlink}(N, d, s)$, where N represents the total number of inlet links of all input switches (for example the links IL1-IL32), d represents the inlet links of each input switch or outlet links of each output switch, and s is the ratio of number of outgoing links from each input switch to the inlet links of each input switch.

Each of the $$\frac{N}{d}$$

input switches IS1-IS16 are connected to exactly d switches in middle stage 130 through two links each for a total of 2×d links (for example input switch IS1 is connected to middle switch MS(1,1) through the links ML(1,1), ML(1,2), and also connected to middle switch MS(1,2) through the links ML(1,3) and ML(1,4)). The middle links which connect switches in the same row in two successive middle stages are called hereinafter straight middle links; and the middle links which connect switches in different rows in two successive middle stages are called hereinafter cross middle links. For example, the middle links ML(1,1) and ML(1,2) connect input switch IS1 and middle switch MS(1,1), so middle links ML(1,1) and ML(1,2) are straight middle links; where as the middle links ML(1,3) and ML(1,4) connect input switch IS1 and middle switch MS(1,2), since input switch IS1 and middle switch MS(1,2) belong to two different rows in diagram 100A of FIG. 1A, middle links ML(1,3) and ML(1, 4) are cross middle links Each of the $$\frac{N}{d}$$

middle switches MS(1,1)-MS(1,16) in the middle stage 130 are connected from exactly d input switches through two links each for a total of 2×d links (for example the links ML(1,1) and ML(1,2) are connected to the middle switch MS(1,1) from input switch IS1, and the links ML(1,7) and ML(1,8) are connected to the middle switch MS(1,1) from input switch IS2) and also are connected to exactly d switches in middle stage 140 through two links each for a total of 2×d links (for example the links ML(2,1) and ML(2,2) are connected from middle switch MS(1,1) to middle switch MS(2,1), and the links ML(2,3) and ML(2,4) are connected from middle switch MS(1,1) to middle switch MS(2,3)).

Each of the $$\frac{N}{d}$$

middle switches MS(2,1)-MS(2,16) in the middle stage 140 are connected from exactly d input switches through two links each for a total of 2×d links (for example the links ML(2,1) and ML(2,2) are connected to the middle switch MS(2,1) from input switch MS(1,1), and the links ML(1,11) and ML(1,12) are connected to the middle switch MS(2,1) from input switch MS(1,3)) and also are connected to exactly d switches in middle stage 150 through two links each for a total of 2×d links (for example the links ML(3,1) and ML(3,2) are connected from middle switch MS(2,1) to middle switch MS(3,1), and the links ML(3,3) and ML(3,4) are connected from middle switch MS(2,1) to middle switch MS(3,5)).

Each of the $$\frac{N}{d}$$

middle switches MS(3,1)-MS(3,16) in the middle stage 150 are connected from exactly d input switches through two links each for a total of 2×d links (for example the links ML(3,1) and ML(3,2) are connected to the middle switch MS(3,1) from input switch MS(2,1), and the links ML(2,19) and ML(2,20) are connected to the middle switch MS(3,1) from input switch MS(2,5)) and also are connected to exactly d switches in middle stage 160 through two links each for a total of 2×d links (for example the links ML(4,1) and ML(4,2) are connected from middle switch MS(3,1) to middle switch MS(4,1), and the links ML(4,3) and ML(4,4) are connected from middle switch MS(3,1) to middle switch MS(4,9)).

Each of the $$\frac{N}{d}$$

middle switches MS(4,1)-MS(4,16) in the middle stage 160 are connected from exactly d input switches through two links each for a total of 2×d links (for example the links ML(4,1) and ML(4,2) are connected to the middle switch MS(4,1) from input switch MS(3,1), and the links ML(4,35) and ML(4,36) are connected to the middle switch MS(4,1) from input switch MS(3,9)) and also are connected to exactly d switches in middle stage 170 through two links each for a total of 2×d links (for example the links ML(5,1) and ML(5,2) are connected from middle switch MS(4,1) to middle switch MS(5,1), and the links ML(5,3) and ML(5,4) are connected from middle switch MS(4,1) to middle switch MS(5,9)).

Each of the $$\frac{N}{d}$$

middle switches MS(5,1)-MS(5,16) in the middle stage 170 are connected from exactly d input switches through two links each for a total of 2×d links (for example the links ML(5,1) and ML(5,2) are connected to the middle switch MS(5,1) from input switch MS(4,1), and the links ML(5,35) and ML(5,36) are connected to the middle switch MS(5,1) from input switch MS(4,9)) and also are connected to exactly d switches in middle stage 180 through two links each for a total of 2×d links (for example the links ML(6,1) and ML(6,2) are connected from middle switch MS(5,1) to middle switch MS(6,1), and the links ML(6,3) and ML(6,4) are connected from middle switch MS(5,1) to middle switch MS(6,5)).

Each of the $$\frac{N}{d}$$

middle switches MS(6,1)-MS(6,16) in the middle stage 180 are connected from exactly d input switches through two links each for a total of 2×d links (for example the links ML(6,1) and ML(6,2) are connected to the middle switch MS(6,1) from input switch MS(5,1), and the links ML(6,19) and ML(6,20) are connected to the middle switch MS(6,1) from input switch MS(5,5)) and also are connected to exactly d switches in middle stage 190 through two links each for a total of 2×d links (for example the links ML(7,1) and ML(7,2) are connected from middle switch MS(6,1) to middle switch MS(7,1), and the links ML(7,3) and ML(7,4) are connected from middle switch MS(6,1) to middle switch MS(7,3)).

Each of the $$\frac{N}{d}$$

middle switches MS(7,1)-MS(7,16) in the middle stage 190 are connected from exactly d input switches through two links each for a total of 2×d links (for example the links ML(7,1) and ML(7,2) are connected to the middle switch MS(7,1) from input switch MS(6,1), and the links ML(7,11) and ML(7,12) are connected to the middle switch MS(7,1) from input switch MS(6,3)) and also are connected to exactly d switches in middle stage 120 through two links each for a total of 2×d links (for example the links ML(8,1) and ML(8,2) are connected from middle switch MS(7,1) to middle switch MS(8,1), and the links ML(8,3) and ML(8,4) are connected from middle switch MS(7,1) to middle switch OS2).

Each of the $$\frac{N}{d}$$

middle switches OS1-OS16 in the middle stage 120 are connected from exactly d input switches through two links each for a total of 2×d links (for example the links ML(8,1) and ML(8,2) are connected to the output switch OS1 from input switch MS(7,1), and the links ML(8,7) and ML(7,8) are connected to the output switch OS1 from input switch MS(7,2)).

Finally the connection topology of the network 100A shown in FIG. 1A is known to be back to back inverse Benes connection topology.

Figure 1B:
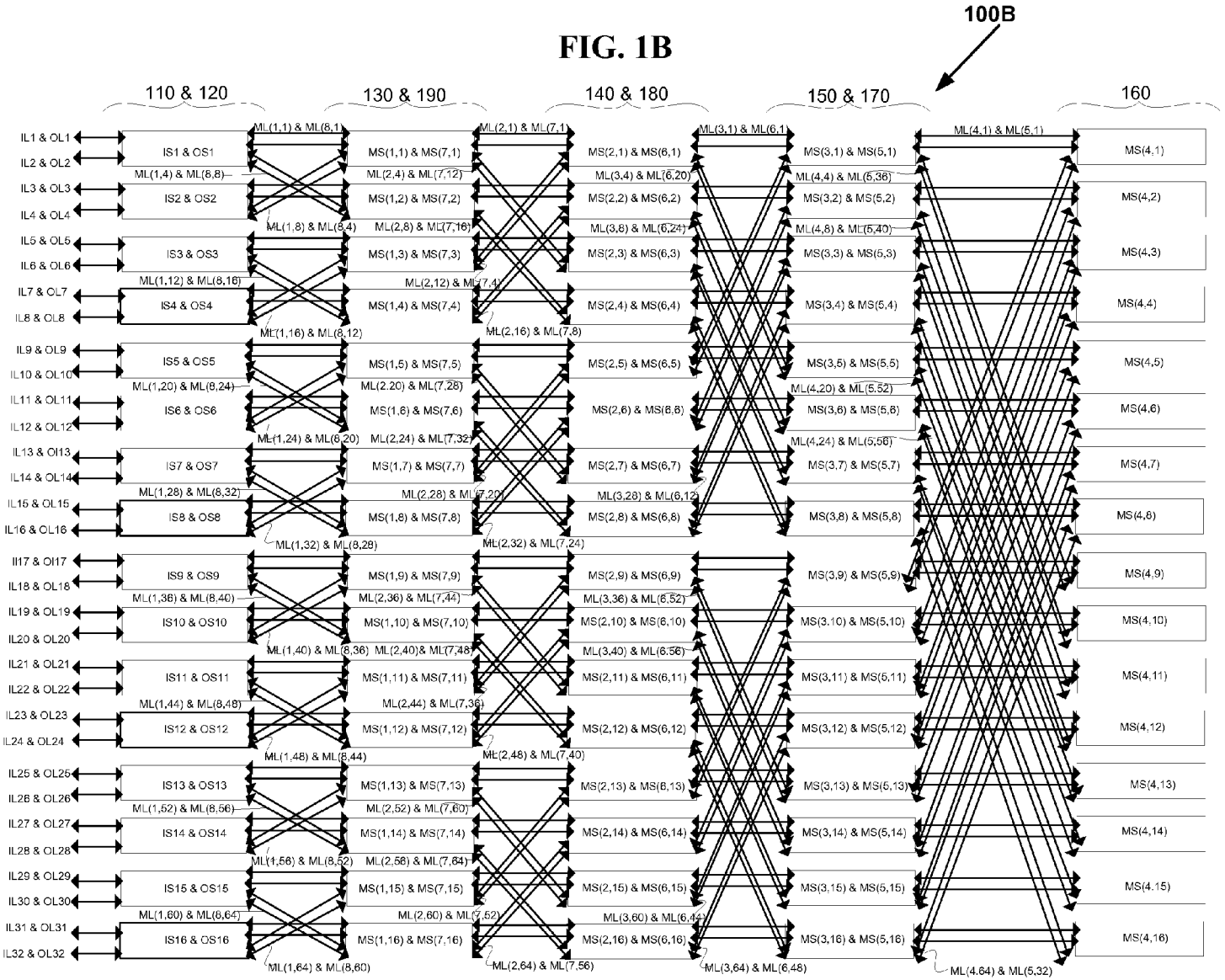
FIG. 1B is a diagram 100B of the equivalent symmetrical folded multi-link multi-stage network $V_{fold\text{-}mlink}(N, d, s)$ of the network 100A shown in FIG. 1A, having inverse Benes connection topology of five stages with N=32, d=2 and s=2, strictly nonblocking network for unicast connections and rearrangeably nonblocking network for arbitrary fan-out multicast connections, in accordance with the invention.

Referring to diagram 100B in FIG. 1B, is a folded version of the multi-link multi-stage network 100A shown in FIG. 1A. The network 100B in FIG. 1B shows input stage 110 and output stage 120 are placed together. That is input switch IS1 and output switch OS1 are placed together, input switch IS2 and output switch OS2 are placed together, and similarly input switch IS16 and output switch OS16 are placed together. All the right going middle links (hereinafter "forward connecting links") {i.e., inlet links IL1-IL32 and middle links ML(1,1)-ML(1,64)} correspond to input switches IS1-IS16, and all the left going middle links (hereinafter "backward connecting links") {i.e., middle links ML(8,1)-ML(8,64) and outlet links OL1-OL32} correspond to output switches OS1-OS16.

Middle stage 130 and middle stage 190 are placed together. That is middle switches MS(1,1) and MS(7,1) are placed together, middle switches MS(1,2) and MS(7,2) are placed together, and similarly middle switches MS(1,16) and MS(7,16) are placed together. All the right going middle links {i.e., middle links ML(1,1)-ML(1,64) and middle links ML(2,1)-ML(2,64)} correspond to middle switches MS(1,1)-MS(1,16), and all the left going middle links {i.e., middle links ML(7,1)-ML(7,64) and middle links ML(8,1) and ML(8,64)} correspond to middle switches MS(7,1)-MS(7,16).

Middle stage 140 and middle stage 180 are placed together. That is middle switches MS(2,1) and MS(6,1) are placed together, middle switches MS(2,2) and MS(6,2) are placed together, and similarly middle switches MS(2,16) and MS(6,16) are placed together. All the right going middle links {i.e., middle links ML(2,1)-ML(2,64) and middle links ML(3,1)-ML(3,64)} correspond to middle switches MS(2,1)-MS(2,16), and all the left going middle links {i.e., middle links ML(6,1)-ML(6,64) and middle links ML(7,1) and ML(7,64)} correspond to middle switches MS(6,1)-MS(6,16).

Middle stage 150 and middle stage 170 are placed together. That is middle switches MS(3,1) and MS(5,1) are placed together, middle switches MS(3,2) and MS(5,2) are placed together, and similarly middle switches MS(3,16) and MS(5,16) are placed together. All the right going middle links {i.e., middle links ML(3,1)-ML(3,64) and middle links ML(4,1)-ML(4,64)} correspond to middle switches MS(3,1)-MS(3,16), and all the left going middle links {i.e., middle links ML(5,1)-ML(5,64) and middle links ML(6,1) and ML(6,64)} correspond to middle switches MS(5,1)-MS(5,16).

Middle stage 160 is placed alone. All the right going middle links are the middle links ML(4,1)-ML(4,64) and all the left going middle links are middle links ML(5,1)-ML(5,64).

In one embodiment, in the network 100B of FIG. 1B, the switches that are placed together are implemented as separate switches then the network 100B is the generalized folded multi-link multi-stage network $V_{fold\text{-}mlink}(N_1, N_2, d, s)$ where $N_1=N_2=32$; d=2; and s=2 with nine stages as disclosed in PCT Application Serial No. PCT/US08/64604 that is incorporated by reference above. That is the switches that are placed together in input stage 110 and output stage 120 are implemented as a two by four switch and a four by two switch. For example the switch input switch IS1 and output switch OS1 are placed together; so input switch IS1 is implemented as two by four switch with the inlet links IL1 and IL2 being the inputs of the input switch IS1 and middle links ML(1,1)-ML(1,4) being the outputs of the input switch IS1; and output switch OS1 is implemented as four by two switch with the middle links ML(8,1), ML(8,2), ML(8,7) and ML(8,8) being the inputs of the output switch OS1 and outlet links OL1-OL2 being the outputs of the output switch OS1. Similarly in this embodiment of network 100B all the switches that are placed together in each middle stage are implemented as separate switches.

Figure 1C:
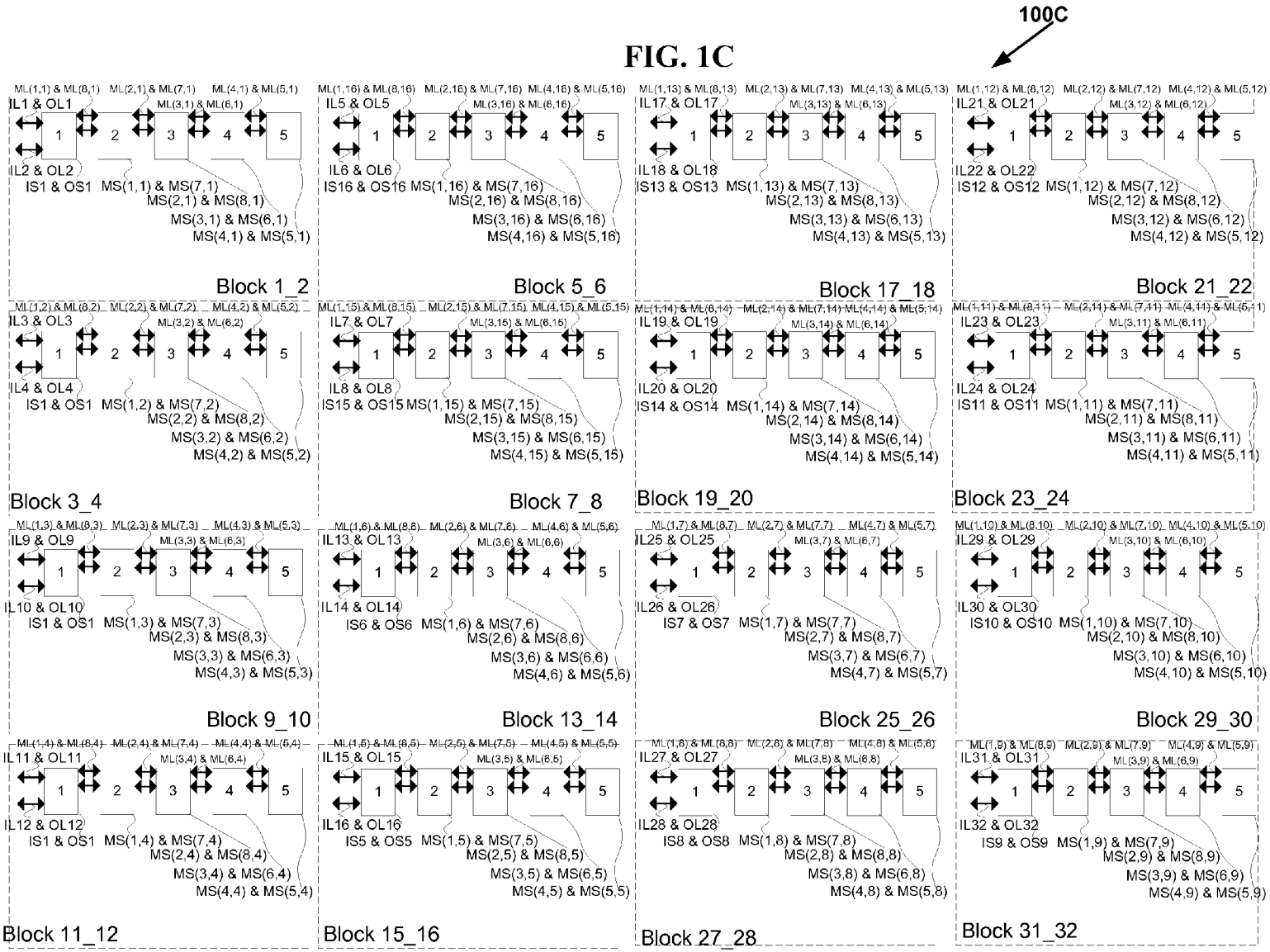
FIG. 1C is a diagram 100C layout of the network $V_{fold\text{-}mlink}(N, d, s)$ shown in FIG. 1B, in one embodiment, illustrating the connection links belonging with in each block only.

Hypercube Topology Layout Schemes:

Referring to layout 100C of FIG. 1C, in one embodiment, there are sixteen blocks namely Block 1_2, Block 3_4, Block 5_6, Block 7_8, Block 9_10, Block 11_12, Block 13_14, Block 15_16, Block 17_18, Block 19_20, Block 21_22, Block 23_24, Block 25_26, Block 27_28, Block 29_30, and Block 31_32. Each block implements all the switches in one row of the network 100B of FIG. 1B, one of the key aspects of the current invention. For example Block 1_2 implements the input switch IS1, output Switch OS1, middle switch MS(1,1), middle switch MS(7,1), middle switch MS(2,1), middle switch MS(6,1), middle switch MS(3,1), middle switch MS(5,1), and middle switch MS(4,1). For the simplification of illustration, Input switch IS1 and output switch OS1 together are denoted as switch 1; Middle switch MS(1,1) and middle switch MS(7,1) together are denoted by switch 2; Middle switch MS(2,1) and middle switch MS(6,1) together are denoted by switch 3; Middle switch MS(3,1) and middle switch MS(5,1) together are denoted by switch 4; Middle switch MS(4,1) is denoted by switch 5.

All the straight middle links are illustrated in layout 100C of FIG. 1C. For example in Block 1_2, inlet links IL1-IL2, outlet links OL1-OL2, middle link ML(1,1), middle link ML(1,2), middle link ML(8,1), middle link ML(8,2), middle link ML(2,1), middle link ML(2,2), middle link ML(7,1), middle link ML(7,2), middle link ML(3,1), middle link ML(3,2), middle link ML(6,1), middle link ML(6,2), middle link ML(4,1), middle link ML(4,2), middle link ML(5,1) and middle link ML(5,2) are illustrated in layout 100C of FIG. 1C.

Even though it is not illustrated in layout 100C of FIG. 1C, in each block, in addition to the switches there may be Configurable Logic Blocks (CLB) or any arbitrary digital circuit (hereinafter "sub-integrated circuit block") depending on the applications in different embodiments. There are four quadrants in the layout 100C of FIG. 1C namely top-left, bottom-left, top-right and bottom-right quadrants. Top-left quadrant implements Block 1_2, Block 3_4, Block 5_6, and Block 7_8. Bottom-left quadrant implements Block 9_10, Block 11_12, Block 13_14, and Block 15_16. Top-right quadrant implements Block 17_18, Block 19_20, Block 21_22, and Block 23_24. Bottom-right quadrant implements Block 25_26, Block 27_28, Block 29_30, and Block 31_32. There are two halves in layout 100C of FIG. 1C namely left-half and right-half. Left-half consists of top-left and bottom-left quadrants. Right-half consists of top-right and bottom-right quadrants.

Recursively in each quadrant there are four sub-quadrants. For example in top-left quadrant there are four sub-quadrants namely top-left sub-quadrant, bottom-left sub-quadrant, top-right sub-quadrant and bottom-right sub-quadrant. Top-left sub-quadrant of top-left quadrant implements Block 1_2. Bottom-left sub-quadrant of top-left quadrant implements Block 3_4. Top-right sub-quadrant of top-left quadrant implements Block 5_6. Finally bottom-right sub-quadrant of top-left quadrant implements Block 7_8. Similarly there are two sub-halves in each quadrant. For example in top-left quadrant there are two sub-halves namely left-sub-half and right-sub-half. Left-sub-half of top-left quadrant implements Block 1_2 and Block 3_4. Right-sub-half of top-left quadrant implements Block 5_6 and Block 7_8. Finally applicant notes that in each quadrant or half the blocks are arranged as a general binary hypercube. Recursively in larger multi-stage network $V_{fold\text{-}mlink}(N_1, N_2, d, s)$ where $N_1=N_2>32$, the layout in this embodiment in accordance with the current invention, will be such that the super-quadrants will also be arranged in d-ary hypercube manner. (In the embodiment of the layout 100C of FIG. 1C, it is binary hypercube manner since d=2, in the network $V_{fold\text{-}mlink}(N_1, N_2, d, s)$ 100B of FIG. 1B).

Figure 1D:
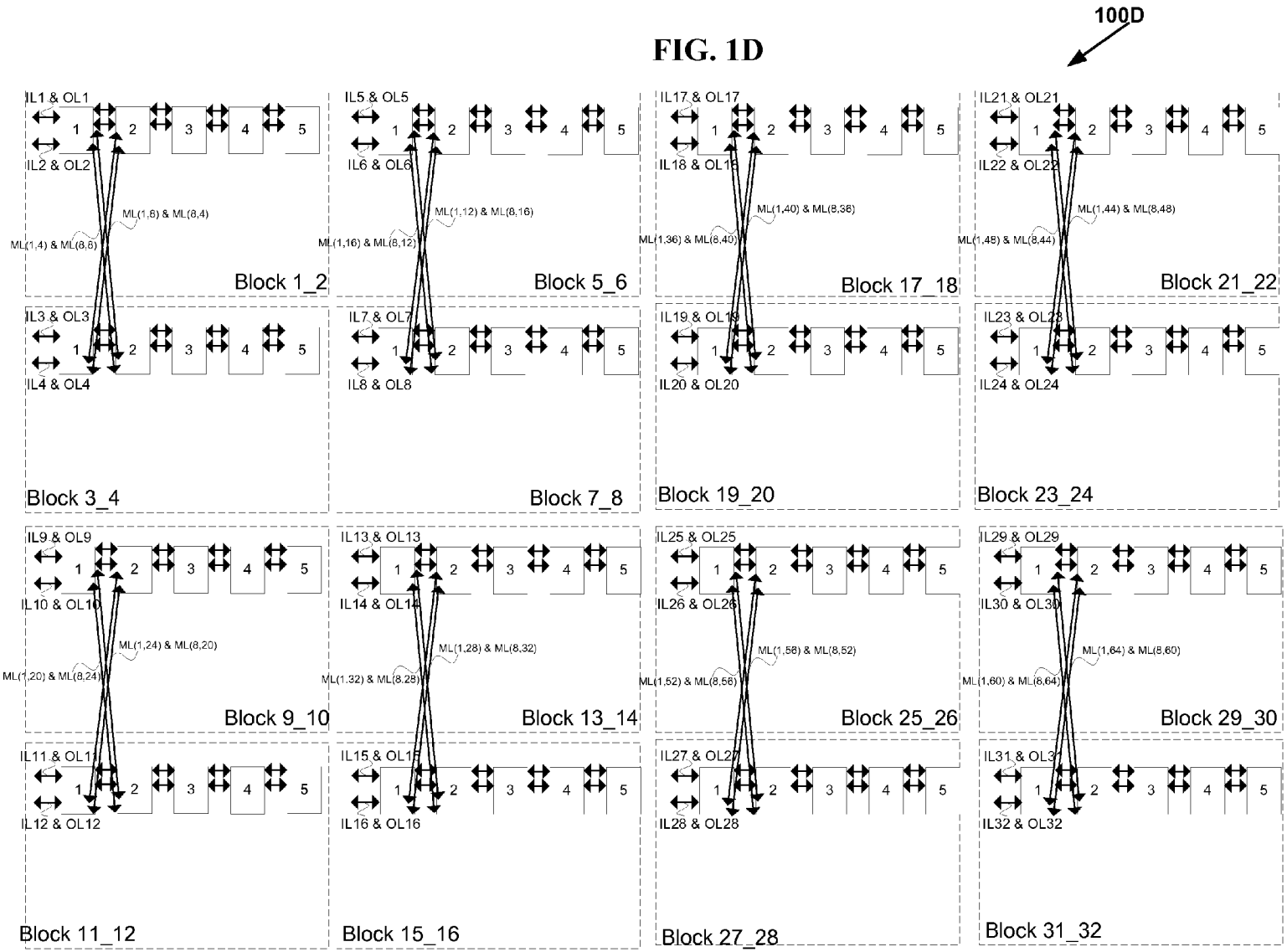
FIG. 1D is a diagram 100D layout of the network $V_{fold\text{-}mlink}(N, d, s)$ shown in FIG. 1B, in one embodiment, illustrating the connection links ML(1,i) for i=[1, 64] and ML(8,i) for i=[1,64].

Layout 100D of FIG. 1D illustrates the inter-block links between switches 1 and 2 of each block. For example middle links ML(1,3), ML(1,4), ML(8,7), and ML(8,8) are connected between switch 1 of Block 1_2 and switch 2 of Block 3_4. Similarly middle links ML(1,7), ML(1,8), ML(8,3), and ML(8,4) are connected between switch 2 of Block 1_2 and switch 1 of Block 3_4. Applicant notes that the inter-block links illustrated in layout 100D of FIG. 1D can be implemented as vertical tracks in one embodiment. Also in one embodiment inter-block links are implemented as two different tracks (for example middle links ML(1,4) and ML(8,8) are implemented as two different tracks); or in an alternative embodiment inter-block links are implemented as a time division multiplexed single track (for example middle links ML(1,4) and ML(8,8) are implemented as a time division multiplexed single track).

Figure 1E:
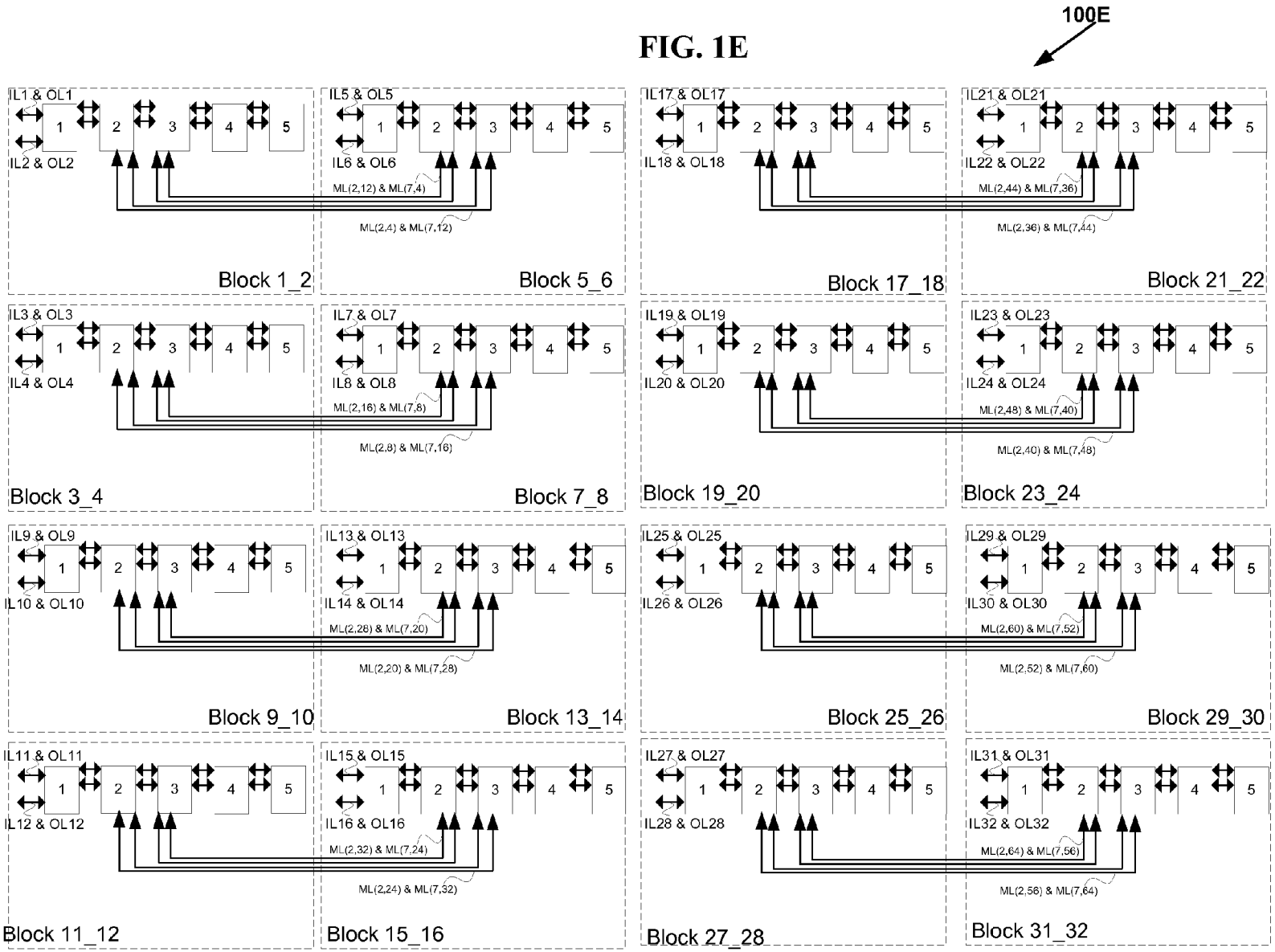
FIG. 1E is a diagram 100E layout of the network $V_{fold\text{-}mlink}(N, d, s)$ shown in FIG. 1B, in one embodiment, illustrating the connection links ML(2,i) for i=[1, 64] and ML(7,i) for i=[1,64].

Layout 100E of FIG. 1E illustrates the inter-block links between switches 2 and 3 of each block. For example middle links ML(2,3), ML(2,4), ML(7,11), and ML(7,12) are connected between switch 2 of Block 1_2 and switch 3 of Block 3_4. Similarly middle links ML(2,11), ML(2,12), ML(7,3), and ML(7,4) are connected between switch 3 of Block 1_2 and switch 2 of Block 3_4. Applicant notes that the inter-block links illustrated in layout 100E of FIG. 1E can be implemented as horizontal tracks in one embodiment. Also in one embodiment inter-block links are implemented as two different tracks (for example middle links ML(2,12) and ML(7,4) are implemented as two different tracks); or in an alternative embodiment inter-block links are implemented as a time division multiplexed single track (for example middle links ML(2,12) and ML(7,4) are implemented as a time division multiplexed single track).

Figure 1F:
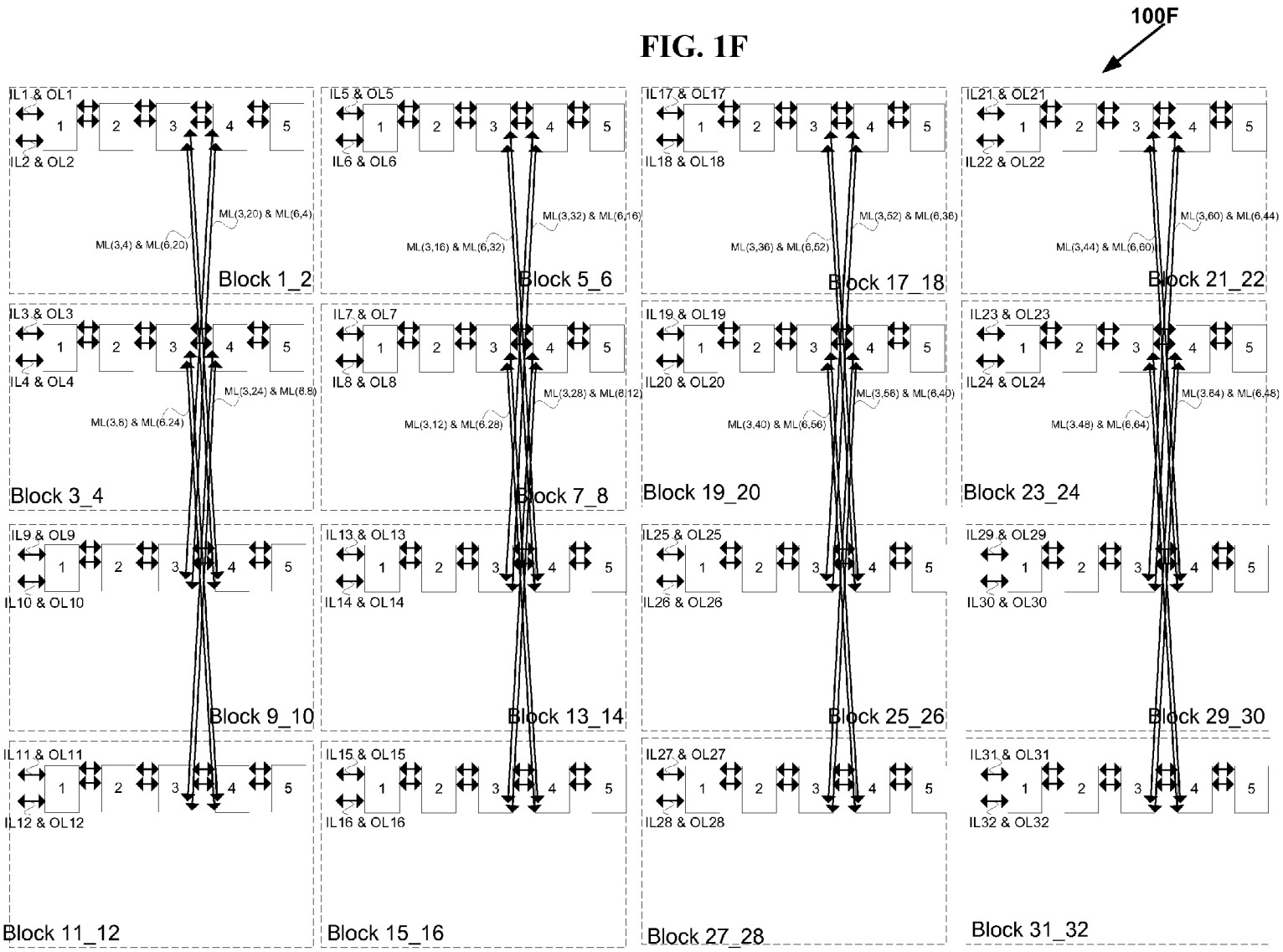
FIG. 1F is a diagram 100F layout of the network $V_{fold\text{-}mlink}(N, d, s)$ shown in FIG. 1B, in one embodiment, illustrating the connection links ML(3,i) for i=[1, 64] and ML(6,i) for i=[1,64].

Layout 100F of FIG. 1F illustrates the inter-block links between switches 3 and 4 of each block. For example middle links ML(3,3), ML(3,4), ML(6,19), and ML(6,20) are connected between switch 3 of Block 1_2 and switch 4 of Block 3_4. Similarly middle links ML(3,19), ML(3,20), ML(6,3), and ML(6,4) are connected between switch 4 of Block 1_2 and switch 3 of Block 3_4. Applicant notes that the inter-block links illustrated in layout 100F of FIG. 1F can be implemented as vertical tracks in one embodiment. Also in one embodiment inter-block links are implemented as two different tracks (for example middle links ML(3,4) and ML(6,20) are implemented as two different tracks); or in an alternative embodiment inter-block links are implemented as a time division multiplexed single track (for example middle links ML(3,4) and ML(6,20) are implemented as a time division multiplexed single track).

Figure 1G:
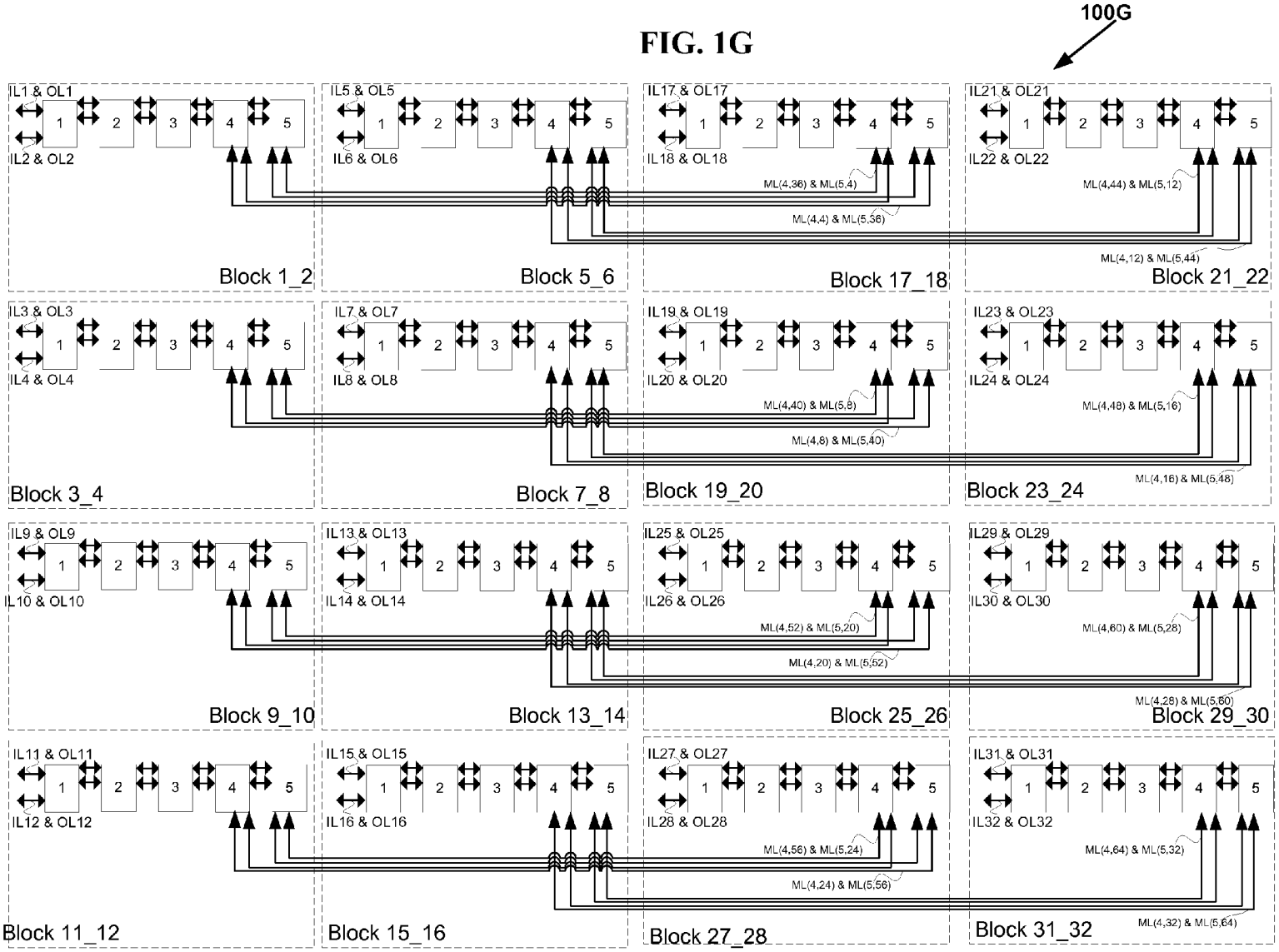
FIG. 1G is a diagram 100G layout of the network $V_{fold\text{-}mlink}(N, d, s)$ shown in FIG. 1B, in one embodiment, illustrating the connection links ML(4,i) for i=[1, 64] and ML(5,i) for i=[1,64].

Layout 100G of FIG. 1G illustrates the inter-block links between switches 4 and 5 of each block. For example middle links ML(4,3), ML(4,4), ML(5,35), and ML(5,36) are connected between switch 4 of Block 1_2 and switch 5 of Block 3_4. Similarly middle links ML(4,35), ML(4,36), ML(5,3), and ML(5,4) are connected between switch 5 of Block 1_2 and switch 4 of Block 3_4. Applicant notes that the inter-block links illustrated in layout 100G of FIG. 1G can be implemented as horizontal tracks in one embodiment. Also in one embodiment inter-block links are implemented as two different tracks (for example middle links ML(4,4) and ML(5,36) are implemented as two different tracks); or in an alternative embodiment inter-block links are implemented as a time division multiplexed single track (for example middle links ML(4,4) and ML(5,36) are implemented as a time division multiplexed single track).

The complete layout for the network 100B of FIG. 1B is given by combining the links in layout diagrams of 100C, 100D, 100E, 100F, and 100G. Applicant notes that in the layout 100C of FIG. 1C, the inter-block links between switch 1 and switch 2 of corresponding blocks are vertical tracks as shown in layout 100D of FIG. 1D; the inter-block links between switch 2 and switch 3 of corresponding blocks are horizontal tracks as shown in layout 100E of FIG. 1E; the inter-block links between switch 3 and switch 4 of corresponding blocks are vertical tracks as shown in layout 100F of FIG. 1F; and finally the inter-block links between switch 4 and switch 5 of corresponding blocks are horizontal tracks as shown in layout 100G of FIG. 1G. The pattern is alternate vertical tracks and horizontal tracks. It continues recursively for larger networks of N>32 as will be illustrated later.

Some of the key aspects of the current invention are discussed. 1) All the switches in one row of the multi-stage network 100B are implemented in a single block. 2) The blocks are placed in such a way that all the inter-block links are either horizontal tracks or vertical tracks; 3) Since all the inter-block links are either horizontal or vertical tracks, all the inter-block links can be mapped on to island-style architectures in current commercial FPGA's; 4) The length of the longest wire is about half of the width (or length) of the complete layout (For example middle link ML(4,4) is about half the width of the complete layout).

Figure 1H:
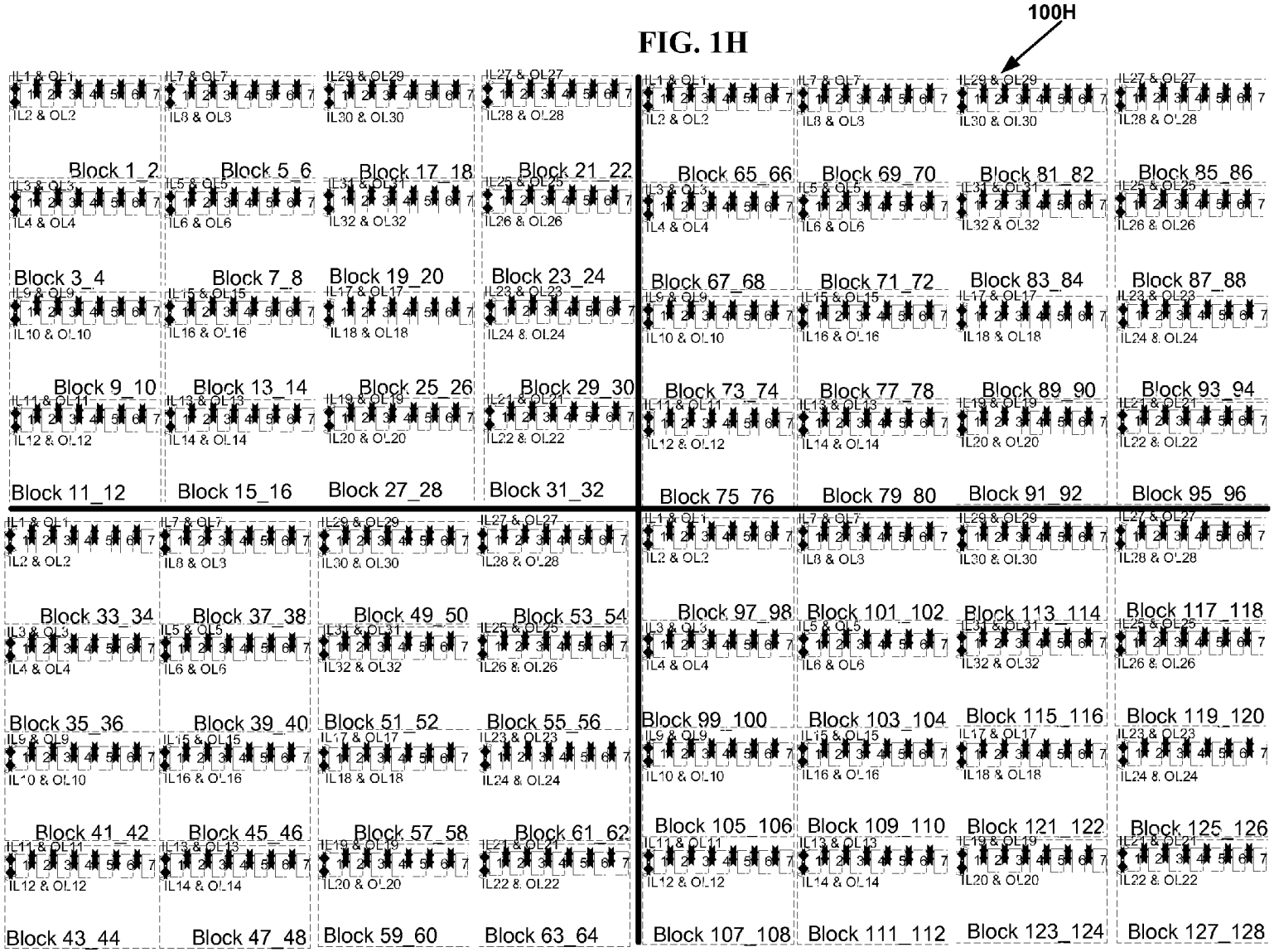
FIG. 1H is a diagram 100H layout of a network $V_{fold\text{-}mlink}(N, d, s)$ where N=128, d=2, and s=2, in one embodiment, illustrating the connection links belonging with in each block only.

In accordance with the current invention, the layout 100C in FIG. 1C can be recursively extended for any arbitrarily large generalized folded multi-link multi-stage network $V_{fold\text{-}mlink}(N_1, N_2, d, s)$ the sub-quadrants, quadrants, and super-quadrants are arranged in d-ary hypercube manner and also the inter-blocks are accordingly connected in d-ary hypercube topology. Even though all the embodiments in the current invention are illustrated for $N_1=N_2$, the embodiments can be extended for $N_1 \neq N_2$. Referring to layout 100H of FIG. 1H, illustrates the extension of layout 100C for the network $V_{fold\text{-}mlink}(N_1, N_2, d, s)$ where $N_1=N_2=128$; d=2; and s=2. There are four super-quadrants in layout 100H namely top-left super-quadrant, bottom-left super-quadrant, top-right super-quadrant, bottom-right super-quadrant. Total number of blocks in the layout 100H is sixty four. Top-left super-quadrant implements the blocks from block 1_2 to block 31_32. Each block in all the super-quadrants has two more switches namely switch 6 and switch 7 in addition to the switches [1-5] illustrated in layout 100C of FIG. 1C. The inter-block link connection topology is the exactly the same between the switches 1 and 2; switches 2 and 3; switches 3 and 4; switches 4 and 5 as it is shown in the layouts of FIG. 1D, FIG. 1E, FIG. 1F, and FIG. 1G respectively.

Bottom-left super-quadrant implements the blocks from block 33_34 to block 63_64. Top-right super-quadrant implements the blocks from block 65_66 to block 95_96. And bottom-right super-quadrant implements the blocks from block 97_98 to block 127_128. In all these three super-quadrants also, the inter-block link connection topology is the exactly the same between the switches 1 and 2; switches 2 and 3; switches 3 and 4; switches 4 and 5 as that of the top-left super-quadrant.

Recursively in accordance with the current invention, the inter-block links connecting the switch 5 and switch 6 will be vertical tracks between the corresponding switches of top-left super-quadrant and bottom-left super-quadrant. And similarly the inter-block links connecting the switch 5 and switch 6 will be vertical tracks between the corresponding switches of top-right super-quadrant and bottom-right super-quadrant. The inter-block links connecting the switch 6 and switch 7 will be horizontal tracks between the corresponding switches of top-left super-quadrant and top-right super-quadrant. And similarly the inter-block links connecting the switch 6 and switch 7 will be horizontal tracks between the corresponding switches of bottom-left super-quadrant and bottom-right super-quadrant.

Figure 1I:
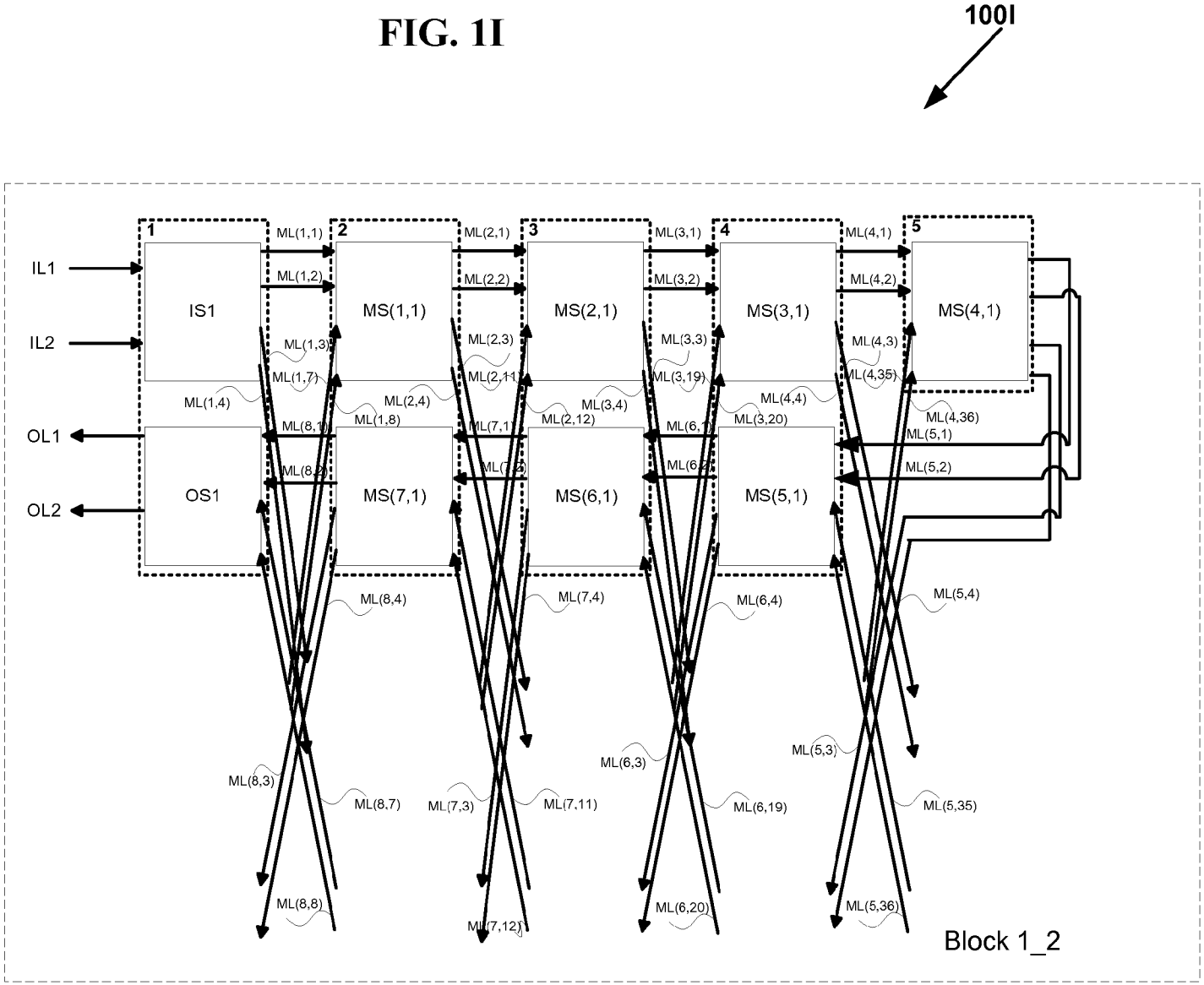
FIG. 1I is a diagram 100I detailed connections of BLOCK 1_2 in the network layout 100C in one embodiment, illustrating the connection links going in and coming out when the layout 100C is implementing V(N, d, s) or $V_{fold}(N, d, s)$.

Referring to diagram 100I of FIG. 1I illustrates a high-level implementation of Block 1_2 (Each of the other blocks have similar implementation) of the layout 100C of FIG. 1C which represents a generalized folded multi-link multi-stage network $V_{fold\text{-}mlink}(N_1, N_2, d, s)$ where $N_1=N_2=32$; d=2; and s=2. Block 1_2 in 100I illustrates both the intra-block and inter-block links connected to Block 1_2. The layout diagram 100I corresponds to the embodiment where the switches that are placed together are implemented as separate switches in the network 100B of FIG. 1B. As noted before then the network 100B is the generalized folded multi-link multi-stage network $V_{fold\text{-}mlink}(N_1, N_2, d, s)$ where $N_1=N_2=32$; d=2; and s=2 with nine stages as disclosed in PCT Application Serial No. PCT/US08/64604 that is incorporated by reference above.

That is the switches that are placed together in Block 1_2 as shown in FIG. 1I are namely input switch IS1 and output switch OS1 belonging to switch 1, illustrated by dotted lines, (as noted before switch 1 is for illustration purposes only, in practice the switches implemented are input switch IS1 and output switch OS1); middle switch MS(1,1) and middle switch MS(7,1) belonging to switch 2; middle switch MS(2,1) and middle switch MS(6,1) belonging to switch 3; middle switch MS(3,1) and middle switch MS(5,1) belonging to switch 4; And middle switch MS(4,1) belonging to switch 5.

Input switch IS1 is implemented as two by four switch with the inlet links IL1 and IL2 being the inputs of the input switch IS1 and middle links ML(1,1)-ML(1,4) being the outputs of the input switch IS1; and output switch OS1 is implemented as four by two switch with the middle links ML(8,1)-ML(8,4) being the inputs of the output switch OS1 and outlet links OL1-OL2 being the outputs of the output switch OS1.

Middle switch MS(1,1) is implemented as four by four switch with the middle links ML(1,1), ML(1,2), ML(1,7) and ML(1,8) being the inputs and middle links ML(2,1)-ML(2,4) being the outputs; and middle switch MS(7,1) is implemented as four by four switch with the middle links ML(7,1), ML(7,2), ML(7,11) and ML(7,12) being the inputs and middle links ML(8,1)-ML(8,4) being the outputs. Similarly all the other middle switches are also implemented as four by four switches as illustrated in 100I of FIG. 1I.

Now the VLSI layouts of generalized multi-link multi-stage network $V_{mlink}(N_1, N_2, d, s)$ where $N_1=N_2<32$; d=2; s=2 and its corresponding version of folded generalized multi-link multi-stage network $V_{fold\text{-}mlink}(N_1, N_2, d, s)$ where $N_1=N_2<32$; d=2; s=2 are discussed. Referring to diagram 200A1 of FIG. 2A1 is generalized multi-link multi-stage network $V_{mlink}(N_1, N_2, d, s)$ where $N_1=N_2=2$; d=2. Diagram 200A2 of FIG. 2A2 illustrates the corresponding folded generalized multi-link multi-stage network $V_{fold\text{-}mlink}(N_1, N_2, d, s)$ where $N_1=N_2=2$; d=2, version of the diagram 200A1 of FIG. 2A1. Layout 200A3 of FIG. 2A3 illustrates the VLSI layout of the network 200A2 of FIG. 2A2. There is only one block i.e., Block 1_2 comprising switch 1. Just like in the layout 100C of FIG. 1C, switch 1 consists of input switch IS1 and output switch OS1.

Referring to diagram 200B1 of FIG. 2B1 is generalized multi-link multi-stage network $V_{mlink}(N_1, N_2, d, s)$ where $N_1=N_2=4$; d=2; s=2. Diagram 200B2 of FIG. 2B2 illustrates the corresponding folded generalized multi-link multi-stage network $V_{fold\text{-}mlink}(N_1, N_2, d, s)$ where $N_1=N_2=4$; d=2; s=2, version of the diagram 200B1 of FIG. 2B1. Layout 200B3 of FIG. 2B3 illustrates the VLSI layout of the network 200B2 of FIG. 2B2. There are two blocks i.e., Block 1_2 and Block 3_4 each comprising switch 1 and switch 2. Switch 1 in each block consists of the corresponding input switch and output switch. For example switch 1 in Block 1_2 consists of input switch IS1 and output switch OS1. Similarly switch 2 in Block 1_2 consists of middle switch (1,1). Layout 200B4 of FIG. 2B4 illustrates the inter-block links of the VLSI layout diagram 200B3 of FIG. 2B3. For example middle links ML(1,4) and ML(2,8). It must be noted that all the inter-block links are vertical tracks in this layout. (Alternatively all the inter-blocks can also be implemented as horizontal tracks).

Referring to diagram 200C11 of FIG. 2C11 is generalized multi-link multi-stage network $V_{mlink}(N_1, N_2, d, s)$ where $N_1=N_2=8$; d=2; s=2. Diagram 200C12 of FIG. 2C12 illustrates the corresponding folded generalized multi-link multi-stage network $V_{fold\text{-}mlink}(N_1, N_2, d, s)$ where $N_1=N_2=8$; d=2; s=2, version of the diagram 200C11 of FIG. 2C11. Layout 200C21 of FIG. 2C21 illustrates the VLSI layout of the network 200C12 of FIG. 2C12. There are four blocks i.e., Block 1_2, Block 3_4, Block 5_6, and Block 7_8 each comprising switch 1, switch 2 and switch 3. For example switch 1 in Block 1_2 consists of input switch IS1 and output switch OS1; Switch 2 in Block 1_2 consists of MS(1,1) and MS(3,1). Switch 3 in Block 1_2 consists of MS(2,1).

Layout 200C22 of FIG. 2C22 illustrates the inter-block links between the switch 1 and switch 2 of the VLSI layout diagram 200C21 of FIG. 2C21. For example middle links ML(1,4) and ML(4,8) are connected between Block 1_2 and Block 3_4. It must be noted that all the inter-block links between switch 1 and switch 2 of all blocks are vertical tracks in this layout. Layout 200C23 of FIG. 2C23 illustrates the inter-block links between the switch 2 and switch 3 of the VLSI layout diagram 200C21 of FIG. 2C21. For example middle links ML(2,12) and ML(3,4) are connected between Block 1_2 and Block 5_6. It must be noted that all the inter-block links between switch 2 and switch 3 of all blocks are horizontal tracks in this layout Referring to diagram 200D1 of FIG. 2D1 is generalized multi-link multi-stage network $V_{mlink}(N_1, N_2, d, s)$ where $N_1=N_2=16$; d=2; s=2. Diagram 200D2 of FIG. 2D2 illustrates the corresponding folded generalized multi-link multi-stage network $V_{fold\text{-}mlink}(N_1, N_2, d, s)$ where $N_1=N_2=16$; d=2; s=2, version of the diagram 200D1 of FIG. 2D1. Layout 200D3 of FIG. 2D3 illustrates the VLSI layout of the network 200D2 of FIG. 2D2. There are eight blocks i.e., Block 1_2, Block 3_4, Block 5_6, Block 7_8, Block 9_10, Block 11_12, Block 13_14 and Block 15_16 each comprising switch 1, switch 2, switch 3 and switch 4. For example switch 1 in Block 1_2 consists of input switch IS1 and output switch OS1; Switch 2 in Block 1_2 consists of MS(1,1) and MS(5,1). Switch 3 in Block 1_2 consists of MS(2,1) and MS(4,1), and switch 4 in Block 1_2 consists of MS(3,1).

Layout 200D4 of FIG. 2D4 illustrates the inter-block links between the switch 1 and switch 2 of the VLSI layout diagram 200D3 of FIG. 2D3. For example middle links ML(1,4) and ML(6,8) are connected between Block 1_2 and Block 3_4. It must be noted that all the inter-block links between switch 1 and switch 2 of all blocks are vertical tracks in this layout. Layout 200D5 of FIG. 2D5 illustrates the inter-block links between the switch 2 and switch 3 of the VLSI layout diagram 200D3 of FIG. 2D3. For example middle links ML(2,12) and ML(5,4) are connected between Block 1_2 and Block 5_6. It must be noted that all the inter-block links between switch 2 and switch 3 of all blocks are horizontal tracks in this layout. Layout 200D6 of FIG. 2D6 illustrates the inter-block links between the switch 3 and switch 4 of the VLSI layout diagram 200D3 of FIG. 2D3. For example middle links ML(3,4) and ML(4,20) are connected between Block 1_2 and Block 9_10. It must be noted that all the inter-block links between switch 3 and switch 4 of all blocks are vertical tracks in this layout.

Generalized Multi-link Butterfly Fat Tree Network Embodiment

In another embodiment in the network 100B of FIG. 1B, the switches that are placed together are implemented as combined switch then the network 100B is the generalized multi-link butterfly fat tree network $V_{mlink\text{-}bft}(N_1, N_2, d, s)$ where $N_1=N_2=32$; d=2; and s=2 with five stages as disclosed in PCT Application Serial No. PCT/US08/64603 that is incorporated by reference above. That is the switches that are placed together in input stage 110 and output stage 120 are implemented as a six by six switch. For example the input switch IS1 and output switch OS1 are placed together; so input switch IS1 and output OS1 are implemented as a six by six switch with the inlet links IL1, IL2, ML(8,1), ML(8,2), ML(8,7) and ML(8,8) being the inputs of the combined switch (denoted as IS1&OS1) and middle links ML(1,1), ML(1,2), ML(1,3), ML(1,4), OL1 and OL2 being the outputs of the combined switch IS1&OS1. Similarly in this embodiment of network 100B all the switches that are placed together are implemented as a combined switch.

Layout diagrams 100C in FIG. 1C, 100D in FIG. 1D, 100E in FIG. 1E, 100F in FIG. 1G are also applicable to generalized multi-link butterfly fat tree network $V_{mlink\text{-}bft}(N_1, N_2, d, s)$ where $N_1=N_2=32$; d=2; and s=2 with five stages. The layout 100C in FIG. 1C can be recursively extended for any arbitrarily large generalized multi-link butterfly fat tree network $V_{mlink\text{-}bft}(N_1, N_2, d, s)$. Accordingly layout 100H of FIG. 1H is also applicable to generalized multi-link butterfly fat tree network $V_{mlink\text{-}bft}(N_1, N_2, d, s)$.

Figure 1J:
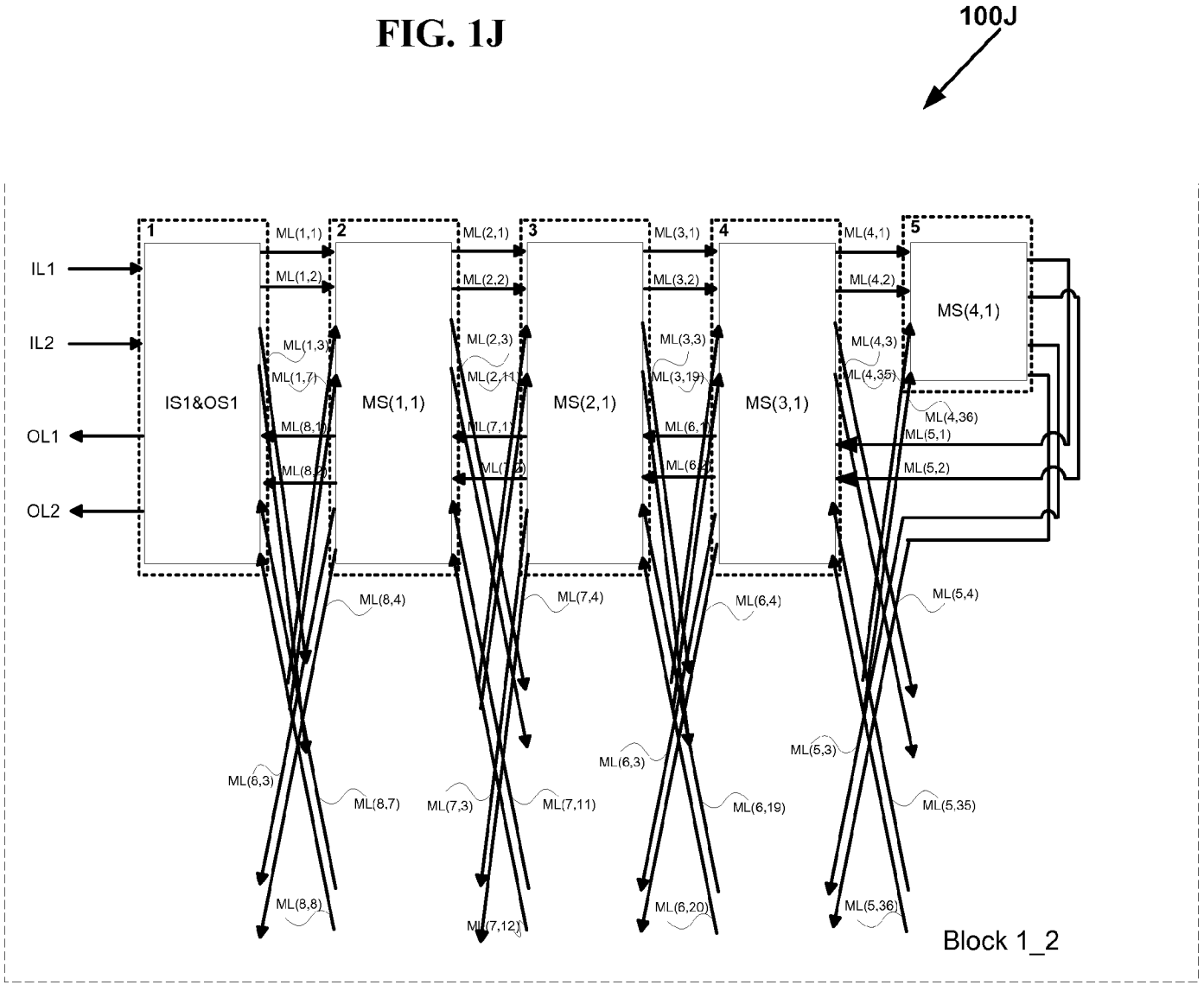
FIG. 1J is a diagram 100J detailed connections of BLOCK 1_2 in the network layout 100C in one embodiment, illustrating the connection links going in and coming out when the layout 100C is implementing V(N, d, s) or $V_{fold}(N, d, s)$.

Referring to diagram 100J of FIG. 1J illustrates a high-level implementation of Block 1_2 (Each of the other blocks have similar implementation) of the layout 100C of FIG. 1C which represents a generalized multi-link butterfly fat tree network $V_{mlink\text{-}bft}(N_1, N_2, d, s)$ where $N_1=N_2=32$; d=2; and s=2. Block 1_2 in 100J illustrates both the intra-block and inter-block links. The layout diagram 100J corresponds to the embodiment where the switches that are placed together are implemented as combined switch in the network 100B of FIG. 1B. As noted before then the network 100B is the generalized multi-link butterfly fat tree network $V_{mlink\text{-}bft}(N_1, N_2, d, s)$ where $N_1=N_2=32$; d=2; and s=2 with five stages as disclosed in PCT Application Serial No. PCT/US08/64603 that is incorporated by reference above.

That is the switches that are placed together in Block 1_2 as shown in FIG. 1J are namely the combined input and output switch IS1&OS1 belonging to switch 1, illustrated by dotted lines, (as noted before switch 1 is for illustration purposes only, in practice the switch implemented is combined input and output switch IS1&OS1); middle switch MS(1,1) belonging to switch 2; middle switch MS(2,1) belonging to switch 3; middle switch MS(3,1) belonging to switch 4; And middle switch MS(4,1) belonging to switch 5.

Combined input and output switch IS1&OS1 is implemented as six by six switch with the inlet links IL1, IL2 and ML(8,1)-ML(8,4) being the inputs and middle links ML(1,1)-ML(1,4), and outlet links OL1-OL2 being the outputs.

Middle switch MS(1,1) is implemented as eight by eight switch with the middle links ML(1,1), ML(1,2), ML(1,7), ML(1,8), ML(7,1), ML(7,2), ML(7,11) and ML(7,12) being the inputs and middle links ML(2,1)-ML(2,4) and middle links ML(8,1)-ML(8,4) being the outputs. Similarly all the other middle switches are also implemented as eight by eight switches as illustrated in 100J of FIG. 1J. Applicant observes that in middle switch MS(1,1) any one of the right going middle links can be switched to any one of the left going middle links and hereinafter middle switch MS(1,1) provides U-turn links. In general, in the network $V_{mlink\text{-}bft}(N_1, N_2, d, s)$ each input switch, each output switch and each middle switch provides U-turn links.

In another embodiment, middle switch MS(1,1) (or the middle switches in any of the middle stage excepting the root middle stage) of Block 1_2 of $V_{mlink\text{-}bft}(N_1, N_2, d, s)$ can be implemented as a four by eight switch and a four by four switch to save cross points. This is because the left going middle links of these middle switches are never setup to the right going middle links For example, in middle switch MS(1,1) of Block 1_2 as shown FIG. 1J, the left going middle links namely ML(7,1), ML(7,2), ML(7,11), and ML(7,12) are never switched to the right going middle links ML(2,1), ML(2,2), ML(2,3), and ML(2,4). And hence to implement MS(1,1) two switches namely: 1) a four by eight switch with the middle links ML(1,1), ML(1,2), ML(1,7), and ML(1,8) as inputs and the middle links ML(2,1), ML(2,2), ML(2,3), ML(2,4), ML(8,1), ML(8,2), ML(8,3), and ML(8,4) as outputs and 2) a four by four switch with the middle links ML(7,1), ML(7,2), ML(7,11), and ML(7,12) as inputs and the middle links ML(8,1), ML(8,2), ML(8,3), and ML(8,4) as outputs are sufficient without loosing any connectivity of the embodiment of MS(1,1) being implemented as an eight by eight switch as described before.)

Generalized Multi-Stage Network Embodiment

In one embodiment, in the network 100B of FIG. 1B, the switches that are placed together are implemented as two separate switches in input stage 110 and output stage 120; and as four separate switches in all the middle stages, then the network 100B is the generalized folded multi-stage network $V_{fold}(N_1, N_2, d, s)$ where $N_1=N_2=32$; d=2; and s=2 with nine stages as disclosed in PCT Application Serial No. PCT/US08/64604 that is incorporated by reference above. That is the switches that are placed together in input stage 110 and output stage 120 are implemented as a two by four switch and a four by two switch respectively. For example the switch input switch IS1 and output switch OS1 are placed together; so input switch IS1 is implemented as two by four switch with the inlet links IL1 and IL2 being the inputs and middle links ML(1,1)-ML(1,4) being the outputs; and output switch OS1 is implemented as four by two switch with the middle links ML(8,1), ML(8,4), ML(8,7) and ML(8,8) being the inputs and outlet links OL1-OL2 being the outputs.

The switches, corresponding to the middle stages that are placed together are implemented as four two by two switches. For example middle switches MS(1,1), MS(1,17), MS(7,1), and MS(7,17) are placed together; so middle switch MS(1,1) is implemented as two by two switch with middle links ML(1,1) and ML(1,7) being the inputs and middle links ML(2,1) and ML(2,3) being the outputs; middle switch MS(1,17) is implemented as two by two switch with the middle links ML(1,2) and ML(1,8) being the inputs and middle links ML(2,2) and ML(2,4) being the outputs; middle switch MS(7,1) is implemented as two by two switch with middle links ML(7,1) and ML(7,11) being the inputs and middle links ML(8,1) and ML(8,3) being the outputs; And middle switch MS(7,17) is implemented as two by two switch with the middle links ML(7,2) and ML(7,12) being the inputs and middle links ML(8,2) and ML(8,4) being the outputs; Similarly in this embodiment of network 100B all the switches that are placed together are implemented as separate switches.

Layout diagrams 100C in FIG. 1C, 100D in FIG. 1D, 100E in FIG. 1E, 100F in FIG. 1G are also applicable to generalized folded multi-stage network $V_{fold}(N_1, N_2, d, s)$ where $N_1=N_2=32$; d=2; and s=2 with nine stages. The layout 100C in FIG. 1C can be recursively extended for any arbitrarily large generalized folded multi-stage network $V_{fold}(N_1, N_2, d, s)$. Accordingly layout 100H of FIG. 1H is also applicable to generalized folded multi-stage network $V_{fold}(N_1, N_2, d, s)$.

Figure 1K:
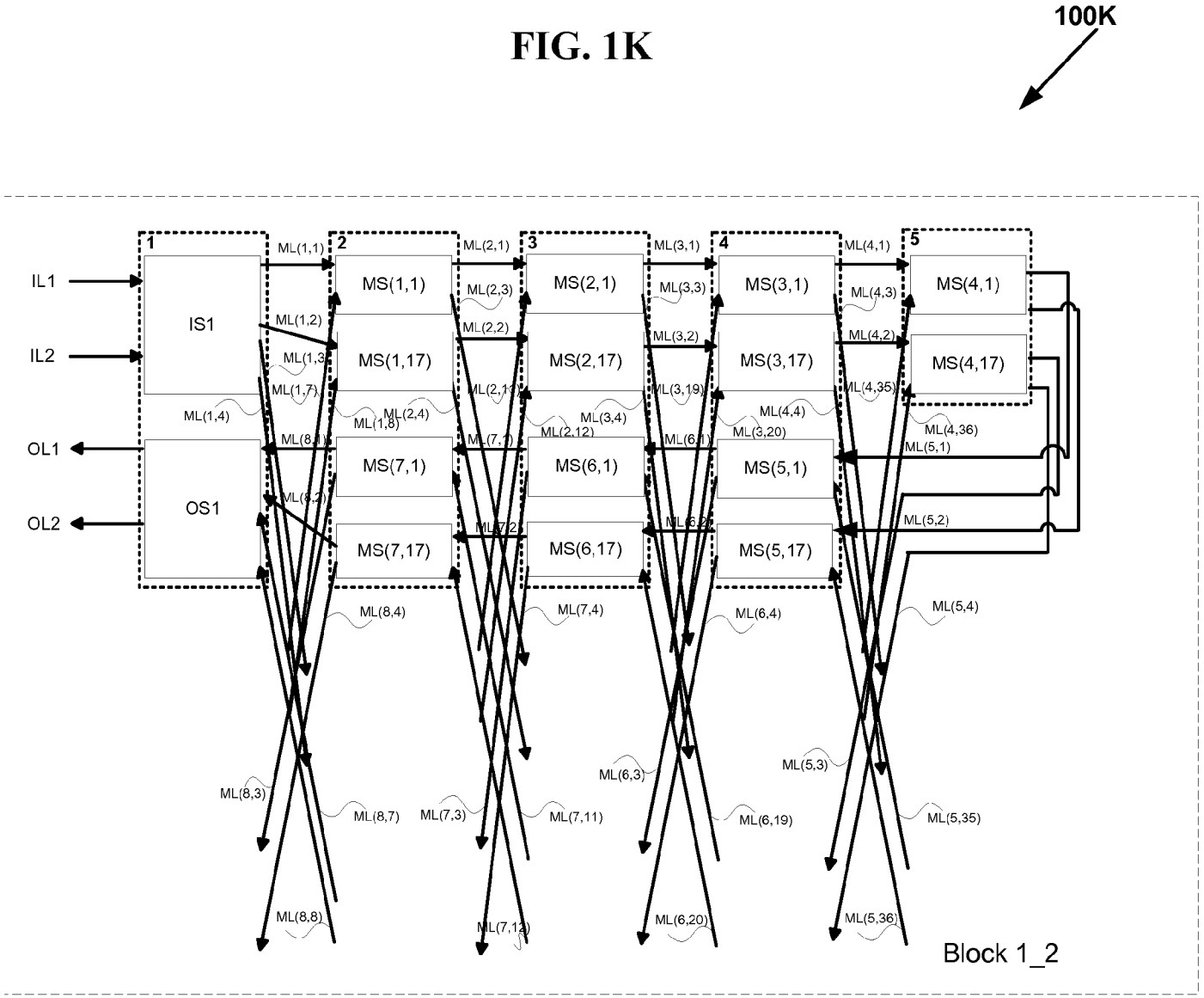
FIG. 1K is a diagram 100K detailed connections of BLOCK 1_2 in the network layout 100C in one embodiment, illustrating the connection links going in and coming out when the layout 100C is implementing V(N, d, s) or $V_{fold}(N, d, s)$.

Referring to diagram 100K of FIG. 1K illustrates a high-level implementation of Block 1_2 (Each of the other blocks have similar implementation) of the layout 100C of FIG. 1C which represents a generalized folded multi-stage network $V_{fold}(N_1, N_2, d, s)$ where $N_1=N_2=32$; d=2; and s=2. Block 1_2 in 100K illustrates both the intra-block and inter-block links. The layout diagram 100K corresponds to the embodiment where the switches that are placed together are implemented as separate switches in the network 100B of FIG. 1B. As noted before then the network 100B is the generalized folded multi-stage network $V_{fold}(N_1, N_2, d, s)$ where $N_1=N_2=32$; d=2; and s=2 with nine stages as disclosed in PCT Application Serial No. PCT/US08/64604 that is incorporated by reference above.

That is the switches that are placed together in Block 1_2 as shown in FIG. 1K are namely the input switch IS1 and output switch OS1 belonging to switch 1, illustrated by dotted lines, (as noted before switch 1 is for illustration purposes only, in practice the switches implemented are input switch IS1 and output switch OS1); middle switches MS(1,1), MS(1,17), MS(7,1) and MS(7,17) belonging to switch 2; middle switches MS(2,1), MS(2,17), MS(6,1) and MS(6,17) belonging to switch 3; middle switches MS(3,1), MS(3,17), MS(5,1) and MS(5,17) belonging to switch 4; And middle switches MS(4,1), and MS(4,17) belonging to switch 5.

Input switch IS1 and output switch OS1 are placed together; so input switch IS1 is implemented as two by four switch with the inlet links IL1 and IL2 being the inputs and middle links ML(1,1)-ML(1,4) being the outputs; and output switch OS1 is implemented as four by two switch with the middle links ML(8,1), ML(8,4), ML(8,7) and ML(8,8) being the inputs and outlet links OL1-OL2 being the outputs.

Middle switches MS(1,1), MS(1,17), MS(7,1), and MS(7,17) are placed together; so middle switch MS(1,1) is implemented as two by two switch with middle links ML(1,1) and ML(1,7) being the inputs and middle links ML(2,1) and ML(2,3) being the outputs; middle switch MS(1,17) is implemented as two by two switch with the middle links ML(1,2) and ML(1,8) being the inputs and middle links ML(2,2) and ML(2,4) being the outputs; middle switch MS(7,1) is implemented as two by two switch with middle links ML(7,1) and ML(7,11) being the inputs and middle links ML(8,1) and ML(8,3) being the outputs; And middle switch MS(7,17) is implemented as two by two switch with the middle links ML(7,2) and ML(7,12) being the inputs and middle links ML(8,2) and ML(8,4) being the outputs Similarly all the other middle switches are also implemented as two by two switches as illustrated in 100K of FIG. 1K.

Generalized Multi-Stage Network Embodiment with S=1

In one embodiment, in the network 100B of FIG. 1B (where it is implemented with s=1), the switches that are placed together are implemented as two separate switches in input stage 110 and output stage 120; and as two separate switches in all the middle stages, then the network 100B is the generalized folded multi-stage network $V_{fold}(N_1, N_2, d, s)$ where $N_1=N_2=32$; d=2; and s=1 with nine stages as disclosed in PCT Application Serial No. PCT/US08/64604 that is incorporated by reference above. That is the switches that are placed together in input stage 110 and output stage 120 are implemented as a two by two switch and a two by two switch. For example the switch input switch IS1 and output switch OS1 are placed together; so input switch IS1 is implemented as two by two switch with the inlet links IL1 and IL2 being the inputs and middle links ML(1,1)-ML(1,2) being the outputs; and output switch OS1 is implemented as two by two switch with the middle links ML(8,1) and ML(8,3) being the inputs and outlet links OL1-OL2 being the outputs.

The switches, corresponding to the middle stages that are placed together are implemented as two, two by two switches. For example middle switches MS(1,1) and MS(7,1) are placed together; so middle switch MS(1,1) is implemented as two by two switch with middle links ML(1,1) and ML(1,3) being the inputs and middle links ML(2,1) and ML(2,2) being the outputs; middle switch MS(7,1) is implemented as two by two switch with middle links ML(7,1) and ML(7,5) being the inputs and middle links ML(8,1) and ML(8,2) being the outputs; Similarly in this embodiment of network 100B all the switches that are placed together are implemented as two separate switches.

Layout diagrams 100C in FIG. 1C, 100D in FIG. 1D, 100E in FIG. 1E, 100F in FIG. 1G are also applicable to generalized folded multi-stage network $V_{fold}(N_1, N_2, d, s)$ where $N_1=N_2=32$; d=2; and s=1 with nine stages. The layout 100C in FIG. 1C can be recursively extended for any arbitrarily large generalized folded multi-stage network $V_{fold}(N_1, N_2, d, s)$. Accordingly layout 100H of FIG. 1H is also applicable to generalized folded multi-stage network $V_{fold}(N_1, N_2, d, s)$.

Referring to diagram 100K1 of FIG. 1K1 illustrates a high-level implementation of Block 1_2 (Each of the other blocks have similar implementation) for the layout 100C of FIG. 1C when s=1 which represents a generalized folded multi-stage network $V_{fold}(N_1, N_2, d, s)$ where $N_1=N_2=32$; d=2; and s=1 (All the double links are replaced by single links when s=1). Block 1_2 in 100K1 illustrates both the intra-block and inter-block links. The layout diagram 100K1 corresponds to the embodiment where the switches that are placed together are implemented as separate switches in the network 100B of FIG. 1B when s=1. As noted before then the network 100B is the generalized folded multi-stage network $V_{fold}(N_1, N_2, d, s)$ where $N_1=N_2=32$; d=2; and s=1 with nine stages as disclosed in PCT Application Serial No. PCT/US08/64604 that is incorporated by reference above.

That is the switches that are placed together in Block 1_2 as shown in FIG. 1K1 are namely the input switch IS1 and output switch OS1 belonging to switch 1, illustrated by dotted lines, (as noted before switch 1 is for illustration purposes only, in practice the switches implemented are input switch IS1 and output switch OS1); middle switches MS(1,1) and MS(7,1) belonging to switch 2; middle switches MS(2,1) and MS(6,1) belonging to switch 3; middle switches MS(3,1) and MS(5,1) belonging to switch 4; And middle switch MS(4,1) belonging to switch 5.

Input switch IS1 and output switch OS1 are placed together; so input switch IS1 is implemented as two by two switch with the inlet links IL1 and IL2 being the inputs and middle links ML(1,1)-ML(1,2) being the outputs; and output switch OS1 is implemented as two by two switch with the middle links ML(8,1) and ML(8,3) being the inputs and outlet links OL1-OL2 being the outputs.

Middle switches MS(1,1) and MS(7,1) are placed together; so middle switch MS(1,1) is implemented as two by two switch with middle links ML(1,1) and ML(1,3) being the inputs and middle links ML(2,1) and ML(2,2) being the outputs; And middle switch MS(7,1) is implemented as two by two switch with middle links ML(7,1) and ML(7,5) being the inputs and middle links ML(8,1) and ML(8,2) being the outputs. Similarly all the other middle switches are also implemented as two by two switches as illustrated in 100K1 of FIG. 1K1.

Generalized Butterfly Fat Tree Network Embodiment

In another embodiment in the network 100B of FIG. 1B, the switches that are placed together are implemented as two combined switches then the network 100B is the generalized butterfly fat tree network $V_{bft}(N_1, N_2, d, s)$ where $N_1=N_2=32$; d=2; and s=2 with five stages as disclosed in PCT Application Serial No. PCT/US08/64603 that is incorporated by reference above. That is the switches that are placed together in input stage 110 and output stage 120 are implemented as a six by six switch. For example the input switch IS1 and output switch OS1 are placed together; so input output switch IS1&OS1 are implemented as a six by six switch with the inlet links IL1, IL2, ML(8,1), ML(8,2), ML(8,7) and ML(8,8) being the inputs of the combined switch (denoted as IS1&OS1) and middle links ML(1,1), ML(1,2), ML(1,3), ML(1,4), OL1 and OL2 being the outputs of the combined switch IS1&OS1.

The switches, corresponding to the middle stages that are placed together are implemented as two four by four switches. For example middle switches MS(1,1) and MS(1,17) are placed together; so middle switch MS(1,1) is implemented as four by four switch with middle links ML(1,1), ML(1,7), ML(7,1) and ML(7,11) being the inputs and middle links ML(2,1), ML(2,3), ML(8,1) and ML(8,3) being the outputs; middle switch MS(1,17) is implemented as four by four switch with the middle links ML(1,2), ML(1,8), ML(7,2) and ML(7,12) being the inputs and middle links ML(2,2), ML(2,4), ML(8,2) and ML(8,4) being the outputs. Similarly in this embodiment of network 100B all the switches that are placed together are implemented as a two combined switches.

Layout diagrams 100C in FIG. 1C, 100D in FIG. 1D, 100E in FIG. 1E, 100F in FIG. 1G are also applicable to generalized butterfly fat tree network $V_{bft}(N_1, N_2, d, s)$ where $N_1=N_2=32$; d=2; and s=2 with five stages. The layout 100C in FIG. 1C can be recursively extended for any arbitrarily large generalized butterfly fat tree network $V_{bft}(N_1, N_2, d, s)$. Accordingly layout 100H of FIG. 1H is also applicable to generalized butterfly fat tree network $V_{bft}(N_1, N_2, d, s)$.

Figure 1L:
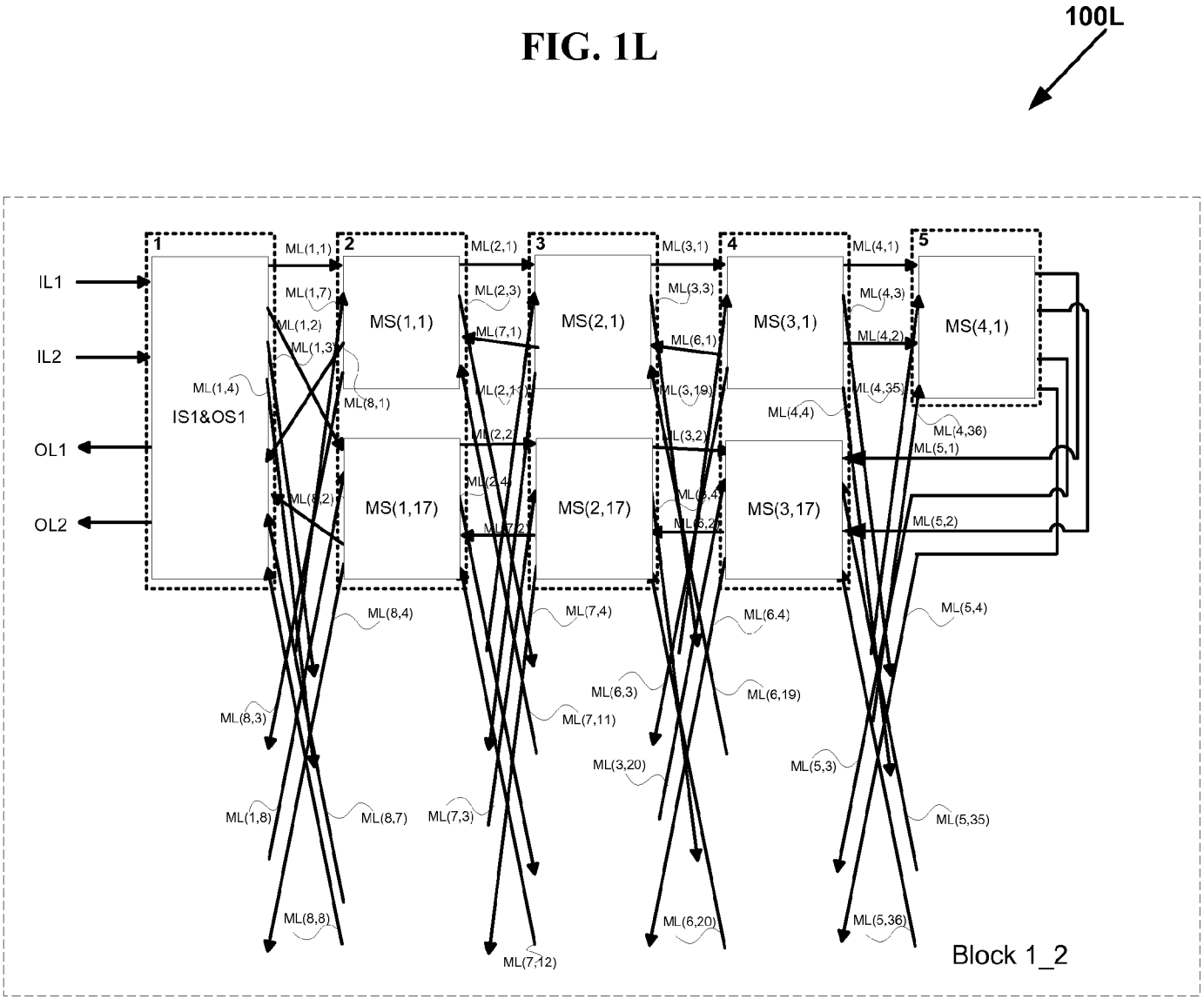
FIG. 1L is a diagram 100L detailed connections of BLOCK 1_2 in the network layout 100C in one embodiment, illustrating the connection links going in and coming out when the layout 100C is implementing V(N, d, s) or $V_{fold}(N, d, s)$.

Referring to diagram 100L of FIG. 1L illustrates a high-level implementation of Block 1_2 (Each of the other blocks have similar implementation) of the layout 100C of FIG. 1C which represents a generalized butterfly fat tree network $V_{bft}(N_1, N_2, d, s)$ where $N_1=N_2=32$; d=2; and s=2. Block 1_2 in 100L illustrates both the intra-block and inter-block links. The layout diagram 100L corresponds to the embodiment where the switches that are placed together are implemented as two combined switches in the network 100B of FIG. 1B. As noted before then the network 100B is the generalized butterfly fat tree network $V_{bft}(N_1, N_2, d, s)$ where $N_1=N_2=32$; d=2; and s=2 with five stages as disclosed in PCT Application Serial No. PCT/US08/64603 that is incorporated by reference above.

That is the switches that are placed together in Block 1_2 as shown in FIG. 1L are namely the combined input and output switch IS1&OS1 belonging to switch 1, illustrated by dotted lines, (as noted before switch 1 is for illustration purposes only, in practice the switch implemented is combined input and output switch IS1&OS1); middle switch MS(1,1) and MS(1,17) belonging to switch 2; middle switch MS(2,1) and MS(2,17) belonging to switch 3; middle switch MS(3,1) and MS(3,17) belonging to switch 4; And middle switch MS(4,1) belonging to switch 5.

Combined input and output switch IS1&OS1 is implemented as six by six switch with the inlet links IL1, IL2, ML(8,1), ML(8,2), ML(8,7) and ML(8,8) being the inputs and middle links ML(1,1)-ML(1,4) and outlet links OL1-OL2 being the outputs.

Middle switch MS(1,1) is implemented as four by four switch with middle links ML(1,1), ML(1,7), ML(7,1) and ML(7,11) being the inputs and middle links ML(2,1), ML(2,3), ML(8,1) and ML(8,3) being the outputs; And middle switch MS(1,17) is implemented as four by four switch with the middle links ML(1,2), ML(1,8), ML(7,2) and ML(7,12) being the inputs and middle links ML(2,2), ML(2,4), ML(8,2) and ML(8,4) being the outputs. Similarly all the other middle switches are also implemented as two four by four switches as illustrated in 100L of FIG. 1L. Applicant observes that in middle switch MS(1,1) any one of the right going middle links can be switched to any one of the left going middle links and hereinafter middle switch MS(1,1) provides U-turn links. In general, in the network $V_{bft}(N_1, N_2, d, s)$ each input switch, each output switch and each middle switch provides U-turn links.

In another embodiment, middle switch MS(1,1) (or the middle switches in any of the middle stage excepting the root middle stage) of Block 1_2 of $V_{bft}(N_1, N_2, d, s)$ can be implemented as a two by four switch and a two by two switch to save cross points. This is because the left going middle links of these middle switches are never setup to the right going middle links. For example, in middle switch MS(1,1) of Block 1_2 as shown FIG. 1L, the left going middle links namely ML(7,1) and ML(7,11) are never switched to the right going middle links ML(2,1) and ML(2,3). And hence to implement MS(1,1) two switches namely: 1) a two by four switch with the middle links ML(1,1) and ML(1,7) as inputs and the middle links ML(2,1), ML(2,3), ML(8,1), and ML(8,3) as outputs and 2) a two by two switch with the middle links ML(7,1) and ML(7,11) as inputs and the middle links ML(8,1) and ML(8,3) as outputs are sufficient without loosing any connectivity of the embodiment of MS(1,1) being implemented as an eight by eight switch as described before.)

Generalized Butterfly Fat Tree Network Embodiment with S=1

In one embodiment, in the network 100B of FIG. 1B (where it is implemented with s=1), the switches that are placed together are implemented as a combined switch in input stage 110 and output stage 120; and as a combined switch in all the middle stages, then the network 100B is the generalized butterfly fat tree network $V_{bft}(N_1, N_2, d, s)$ where $N_1=N_2=32$; d=2; and s=1 with five stages as disclosed in PCT Application Serial No. PCT/US08/64603 that is incorporated by reference above. That is the switches that are placed together in input stage 110 and output stage 120 are implemented as a four by four switch. For example the switch input switch IS1 and output switch OS1 are placed together; so input and output switch IS1&OS1 is implemented as four by four switch with the inlet links IL1, IL2, ML(8,1) and ML(8,3) being the inputs and middle links ML(1,1)-ML(1,2) and outlet links OL1-OL2 being the outputs The switches, corresponding to the middle stages that are placed together are implemented as a four by four switch. For example middle switches MS(1,1) is implemented as four by four switch with middle links ML(1,1), ML(1,3), ML(7,1) and ML(7,5) being the inputs and middle links ML(2,1), ML(2,2), ML(8,1) and ML(8,2) being the outputs.

Layout diagrams 100C in FIG. 1C, 100D in FIG. 1D, 100E in FIG. 1E, 100F in FIG. 1G are also applicable to generalized butterfly fat tree network $V_{bft}(N_1, N_2, d, s)$ where $N_1=N_2=32$; d=2; and s=1 with five stages. The layout 100C in FIG. 1C can be recursively extended for any arbitrarily large generalized butterfly fat tree network $V_{bft}(N_1, N_2, d, s)$. Accordingly layout 100H of FIG. 1H is also applicable to generalized butterfly fat tree network $V_{bft}(N_1, N_2, d, s)$.

Referring to diagram 100L1 of FIG. 1L1 illustrates a high-level implementation of Block 1_2 (Each of the other blocks have similar implementation) for the layout 100C of FIG. 1C when s=1 which represents a generalized butterfly fat tree network $V_{bft}(N_1, N_2, d, s)$ where $N_1=N_2=32$; d=2; and s=1 (All the double links are replaced by single links when s=1). Block 1_2 in 100K1 illustrates both the intra-block and inter-block links. The layout diagram 100L1 corresponds to the embodiment where the switches that are placed together are implemented as a combined switch in the network 100B of FIG. 1B when s=1. As noted before then the network 100B is the generalized butterfly fat tree network $V_{bft}(N_1, N_2, d, s)$ where $N_1=N_2=32$; d=2; and s=1 with nine stages as disclosed in PCT Application Serial No. PCT/US08/64603 that is incorporated by reference above.

That is the switches that are placed together in Block 1_2 as shown in FIG. 1L1 are namely the input and output switch IS1&OS1 belonging to switch 1, illustrated by dotted lines, (as noted before switch 1 is for illustration purposes only, in practice the switches implemented are input switch IS1 and output switch OS1); middle switch MS(1,1) belonging to switch 2; middle switch MS(2,1) belonging to switch 3; middle switch MS(3,1) belonging to switch 4; And middle switch MS(4,1) belonging to switch 5.

Input and output switch IS1&OS1 are placed together; so input and output switch IS1&OS1 is implemented as four by four switch with the inlet links IL1, IL2, ML(8,1) and ML(8,3) being the inputs and middle links ML(1,1)-ML(1, 2) and outlet links OL1-OL2 being the outputs.

Middle switch MS(1,1) is implemented as four by four switch with middle links ML(1,1), ML(1,3), ML(7,1) and ML(7,5) being the inputs and middle links ML(2,1), ML(2, 2), ML(8,1) and ML(8,2) being the outputs. Similarly all the other middle switches are also implemented as four by four switches as illustrated in 100L1 of FIG. 1L1.

In another embodiment, middle switch MS(1,1) (or the middle switches in any of the middle stage excepting the root middle stage) of Block 1_2 of $V_{mlink\text{-}bft}(N_1, N_2, d, s)$ can be implemented as a two by four switch and a two by two switch to save cross points. This is because the left going middle links of these middle switches are never setup to the right going middle links For example, in middle switch MS(1,1) of Block 1_2 as shown FIG. 1L1, the left going middle links namely ML(7,1) and ML(7,5) are never switched to the right going middle links ML(2,1) and ML(2,2). And hence to implement MS(1,1) two switches namely: 1) a two by four switch with the middle links ML(1,1) and ML(1,3) as inputs and the middle links ML(2, 1), ML(2,2), ML(8,1), and ML(8,2) as outputs and 2) a two by two switch with the middle links ML(7,1) and ML(7,5) as inputs and the middle links ML(8,1) and ML(8,2) as outputs are sufficient without loosing any connectivity of the embodiment of MS(1,1) being implemented as an eight by eight switch as described before.)

Figure 3A:
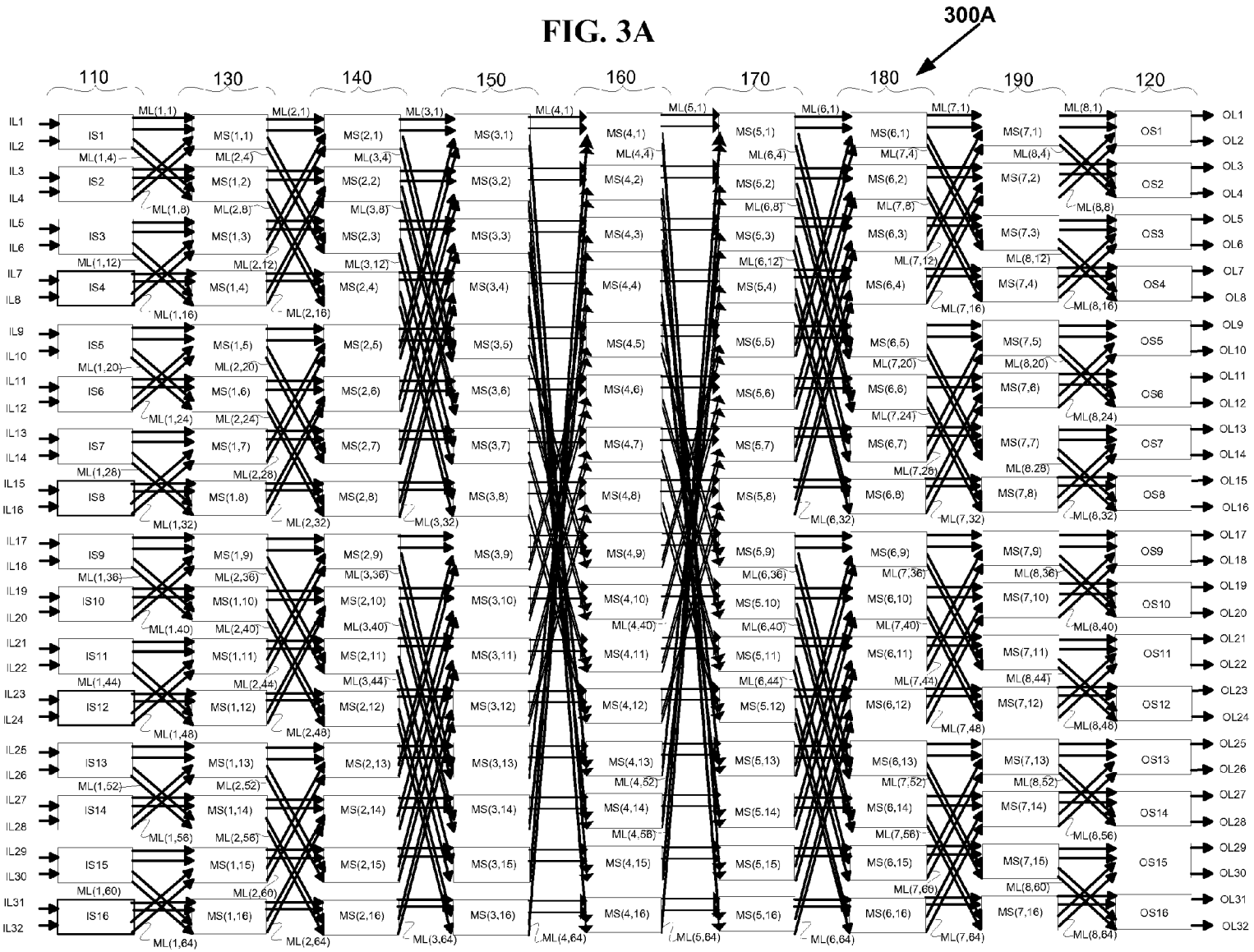
FIG. 3A is a diagram 300A of an exemplary symmetrical multi-link multi-stage network $V_{hcube}$(N, d, s) having inverse Benes connection topology of nine stages with N=32, d=2 and s=2, strictly nonblocking network for unicast connections and rearrangeably nonblocking network for arbitrary fan-out multicast connections, in accordance with the invention.

Hypercube-Like Topology Layout Schemes:

Referring to diagram 300A in FIG. 3A, in one embodiment, an exemplary generalized multi-link multi-stage network $V_{mlink}(N_1, N_2, d, s)$ where $N_1=N_2=32$; d=2; and s=2 with nine stages of one hundred and forty four switches for satisfying communication requests, such as setting up a telephone call or a data call, or a connection between configurable logic blocks, between an input stage 110 and output stage 120 via middle stages 130, 140, 150, 170, 170, 180 and 190 is shown where input stage 110 consists of sixteen, two by four switches IS1-IS16 and output stage 120 consists of sixteen, four by two switches OS1-OS16.

As disclosed in PCT Application Serial No. PCT/US08/64604 that is incorporated by reference above, such a network can be operated in rearrangeably non-blocking manner for arbitrary fan-out multicast connections and also can be operated in strictly non-blocking manner for unicast connections.

The diagram 300A in FIG. 3A is exactly the same as the diagram 100A in FIG. 1A excepting the connection links between middle stage 150 and middle stage 160 as well as between middle stage 160 and middle stage 170.

Each of the $$\frac{N}{d}$$

middle switches are connected to exactly d switches in middle stage 160 through two links each for a total of 2×d links (for example the links ML(4,1) and ML(4,2) are connected from middle switch MS(3,1) to middle switch MS(4,1), and the links ML(4,3) and ML(4,4) are connected from middle switch MS(3,1) to middle switch MS(4,15)).

Each of the $$\frac{N}{d}$$

middle switches MS(4,1)-MS(4,16) in the middle stage 160 are connected from exactly d input switches through two links each for a total of 2×d links (for example the links ML(4,1) and ML(4,2) are connected to the middle switch MS(4,1) from input switch MS(3,1), and the links ML(4,59) and ML(4,60) are connected to the middle switch MS(4,1) from input switch MS(3,15)) and also are connected to exactly d switches in middle stage 170 through two links each for a total of 2×d links (for example the links ML(5,1) and ML(5,2) are connected from middle switch MS(4,1) to middle switch MS(5,1), and the links ML(5,3) and ML(5,4) are connected from middle switch MS(4,1) to middle switch MS(5,15)).

Each of the $$\frac{N}{d}$$

middle switches MS(5,1)-MS(5,16) in the middle stage 170 are connected from exactly d input switches through two links each for a total of 2×d links (for example the links ML(5,1) and ML(5,2) are connected to the middle switch MS(5,1) from input switch MS(4,1), and the links ML(5,59) and ML(5,60) are connected to the middle switch MS(5,1) from input switch MS(4,15)).

Finally the connection topology of the network 100A shown in FIG. 1A is also basically back to back inverse Benes connection topology but with a slight variation. All the cross middle links from middle switches MS(3,1)-MS (3,8) connect to middle switches MS(4,9)-MS(4,16) and all the cross middle links from middle switches MS(3,9)-MS (3,16) connect to middle switches MS(4,1)-MS(4,8). Applicant makes a key observation that there are many combinations of connections possible using this property. The difference in the connection topology between diagram 100A of FIG. 1A and diagram 300A of FIG. 3A is that the connections formed by cross middle links between middle stage 150 and middle stage 160 are made of two different combinations otherwise both the diagrams 100A and 300A implement back to back inverse Benes connection topology. Since these networks implement back to back inverse Benes topologies since there is difference in the connections of cross middle links between middle stage 150 and middle stage 160, the same difference in the connections of cross middle links between 160 and middle stage 170 occurs.

Figure 3B:
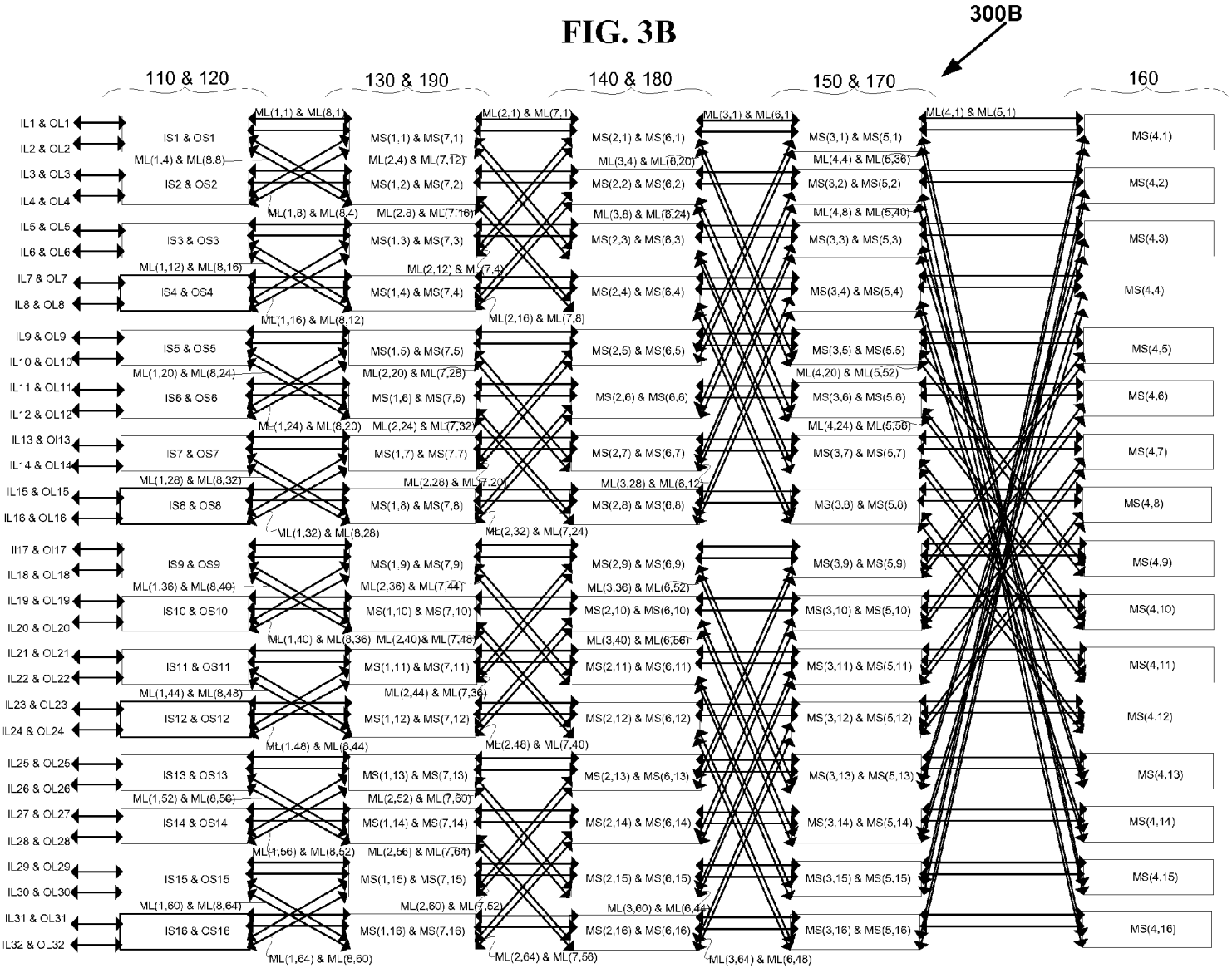
FIG. 3B is a diagram 300B of the equivalent symmetrical folded multi-link multi-stage network $V_{hcube}$(N, d, s) of the network 300A shown in FIG. 3A, having inverse Benes connection topology of five stages with N=32, d=2 and s=2, strictly nonblocking network for unicast connections and rearrangeably nonblocking network for arbitrary fan-out multicast connections, in accordance with the invention.

Referring to diagram 300B in FIG. 3B, is a folded version of the multi-link multi-stage network 300A shown in FIG. 3A. The network 300B in FIG. 3B shows input stage 110 and output stage 120 are placed together. That is input switch IS1 and output switch OS1 are placed together, input switch IS2 and output switch OS2 are placed together, and similarly input switch IS16 and output switch OS16 are placed together. All the right going middle links {i.e., inlet links IL1-IL32 and middle links ML(1,1)-ML(1,64)} correspond to input switches IS1-IS16, and all the left going middle links {i.e., middle links ML(7,1)-ML(7,64) and outlet links OL1-OL32} correspond to output switches OS1-OS16.

Just the same way there is difference in the connection topology between diagram 100A of FIG. 1A and diagram 300A of FIG. 3A in the way the connections are formed by cross middle links between middle stage 150 and middle stage 160 and also between middle stage 160 and middle stage 170, the exact similar difference is there between the diagram 100B of FIG. 1B and the diagram 300B of FIG. 3B, i.e., in the way the connections are formed by cross middle links between middle stage 150 and middle stage 160 and also between middle stage 160 and middle stage 170.

In one embodiment, in the network 300B of FIG. 3B, the switches that are placed together are implemented as separate switches then the network 300B is the generalized folded multi-link multi-stage network $V_{fold\text{-}mlink}(N_1, N_2, d, s)$ where $N_1=N_2=32$; d=2; and s=2 with nine stages as disclosed in PCT Application Serial No. PCT/US08/64604 that is incorporated by reference above. That is the switches that are placed together in input stage 110 and output stage 120 are implemented as a two by four switch and a four by two switch. For example the switch input switch IS1 and output switch OS1 are placed together; so input switch IS1 is implemented as two by four switch with the inlet links IL1 and IL2 being the inputs of the input switch IS1 and middle links ML(1,1)-ML(1,4) being the outputs of the input switch IS1; and output switch OS1 is implemented as four by two switch with the middle links ML(8,1), ML(8,2), ML(8,7) and ML(8,8) being the inputs of the output switch OS1 and outlet links OL1-OL2 being the outputs of the output switch OS1. Similarly in this embodiment of network 300B all the switches that are placed together are implemented as separate switches.

Figure 3C:
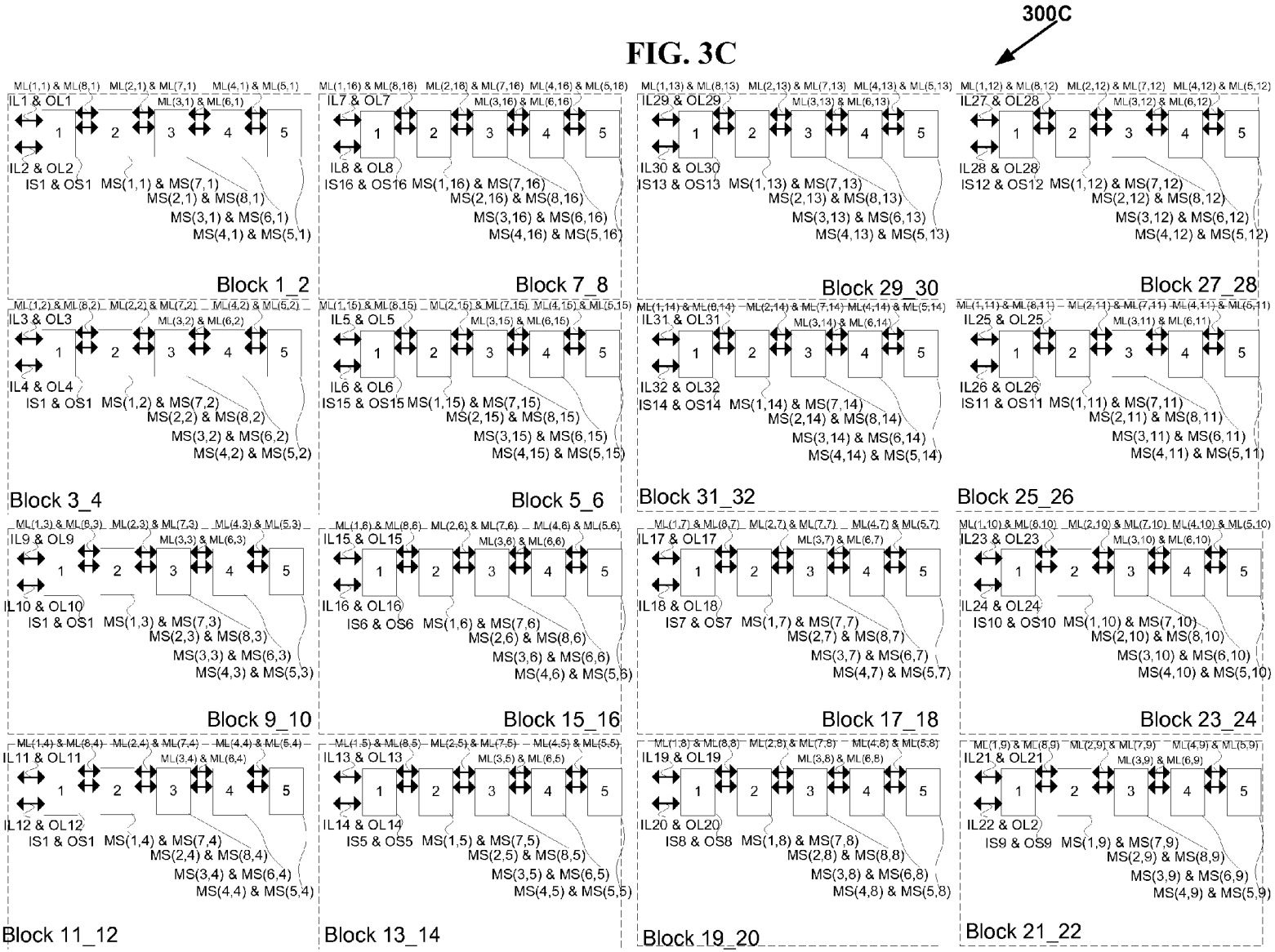
FIG. 3C is a diagram 300C layout of the network $V_{hcube}$ (N, d, s) shown in FIG. 3B, in one embodiment, illustrating the connection links belonging with in each block only.

Referring to layout 300C of FIG. 3C, in one embodiment, there are sixteen blocks namely Block 1_2, Block 3_4, Block 5_6, Block 7_8, Block 9_10, Block 11_12, Block 13_14, Block 15_16, Block 17_18, Block 19_20, Block 21_22, Block 23_24, Block 25_26, Block 27_28, Block 29_30, and Block 31_32. Each block implements all the switches in one row of the network 300B of FIG. 3B, one of the key aspects of the current invention. For example Block 1_2 implements the input switch IS1, output Switch OS1, middle switch MS(1,1), middle switch MS(7,1), middle switch MS(2,1), middle switch MS(6,1), middle switch MS(3,1), middle switch MS(5,1), and middle switch MS(4,1). For the simplification of illustration, Input switch IS1 and output switch OS1 together are denoted as switch 1; Middle switch MS(1,1) and middle switch MS(7,1) together are denoted by switch 2; Middle switch MS(2,1) and middle switch MS(6,1) together are denoted by switch 3; Middle switch MS(3,1) and middle switch MS(5,1) together are denoted by switch 4; And middle switch MS(4,1) is denoted by switch 5.

All the straight middle links are illustrated in layout 300C of FIG. 3C. For example in Block 1_2, inlet links IL1-IL2, outlet links OL1-OL2, middle link ML(1,1), middle link ML(1,2), middle link ML(8,1), middle link ML(8,2), middle link ML(2,1), middle link ML(2,2), middle link ML(7,1), middle link ML(7,2), middle link ML(3,1), middle link ML(3,2), middle link ML(6,1), middle link ML(6,2), middle link ML(4,1), middle link ML(4,2), middle link ML(5,1) and middle link ML(5,2) are illustrated in layout 300C of FIG. 3C.

Even though it is not illustrated in layout 300C of FIG. 3C, in each block, in addition to the switches there may be Configurable Logic Blocks (CLB) or any arbitrary digital circuit or sub-integrated circuit block depending on the applications in different embodiments. There are four quadrants in the layout 300C of FIG. 3C namely top-left, bottom-left, top-right and bottom-right quadrants. Top-left quadrant implements Block 1_2, Block 3_4, Block 5_6, and Block 7_8. Bottom-left quadrant implements Block 9_10, Block 11_12, Block 13_14, and Block 15_16. Top-right quadrant implements Block 25_26, Block 27_28, Block 29_30, and Block 31_32. Bottom-right quadrant implements Block 17_18, Block 19_20, Block 21_22, and Block 23_24. There are two halves in layout 300C of FIG. 3C namely left-half and right-half. Left-half consists of top-left and bottom-left quadrants. Right-half consists of top-right and bottom-right quadrants.

Recursively in each quadrant there are four sub-quadrants. For example in top-left quadrant there are four sub-quadrants namely top-left sub-quadrant, bottom-left sub-quadrant, top-right sub-quadrant and bottom-right sub-quadrant. Top-left sub-quadrant of top-left quadrant implements Block 1_2. Bottom-left sub-quadrant of top-left quadrant implements Block 3_4. Top-right sub-quadrant of top-left quadrant implements Block 7_8. Finally bottom-right sub-quadrant of top-left quadrant implements Block 5_6. Similarly there are two sub-halves in each quadrant. For example in top-left quadrant there are two sub-halves namely left-sub-half and right-sub-half. Left-sub-half of top-left quadrant implements Block 1_2 and Block 3_4. Right-sub-half of top-left quadrant implements Block 7_8 and Block 5_6. Recursively in larger multi-stage network $V_{fold\text{-}mlink}(N_1, N_2, d, s)$ where $N_1=N_2>32$, the layout in this embodiment in accordance with the current invention, will be such that the super-quadrants will also be arranged in a similar manner.

Figure 3D:
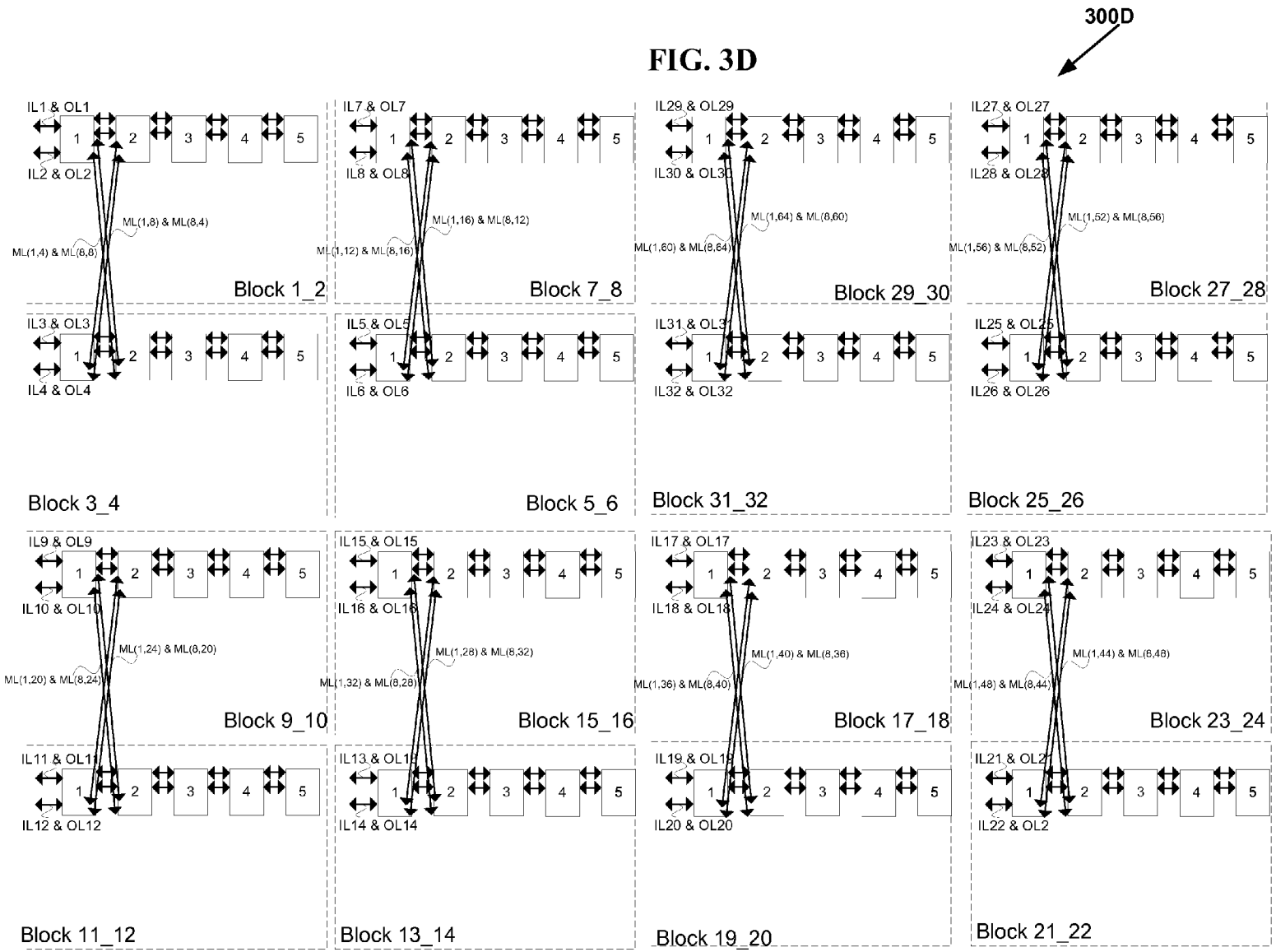
FIG. 3D is a diagram 100D layout of the network $V_{hcube}$ (N, d, s) shown in FIG. 3B, in one embodiment, illustrating the connection links ML(1,i) for i=[1, 64] and ML(8,i) for i=[1, 64].

Layout 300D of FIG. 3D illustrates the inter-block links (in the layout 300C of FIG. 3C all the cross middle links are inter-block links) between switches 1 and 2 of each block. For example middle links ML(1,3), ML(1,4), ML(8,7), and ML(8,8) are connected between switch 1 of Block 1_2 and switch 2 of Block 3_4. Similarly middle links ML(1,7), ML(1,8), ML(8,3), and ML(8,4) are connected between switch 2 of Block 1_2 and switch 1 of Block 3_4. Applicant notes that the inter-block links illustrated in layout 100D of FIG. 1D can be implemented as vertical tracks in one embodiment. Also in one embodiment inter-block links are implemented as two different tracks (for example middle links ML(1,4) and ML(8,8) are implemented as two different tracks); or in an alternative embodiment inter-block links are implemented as a time division multiplexed single track (for example middle links ML(1,4) and ML(8,8) are implemented as a time division multiplexed single track).

Figure 3E:
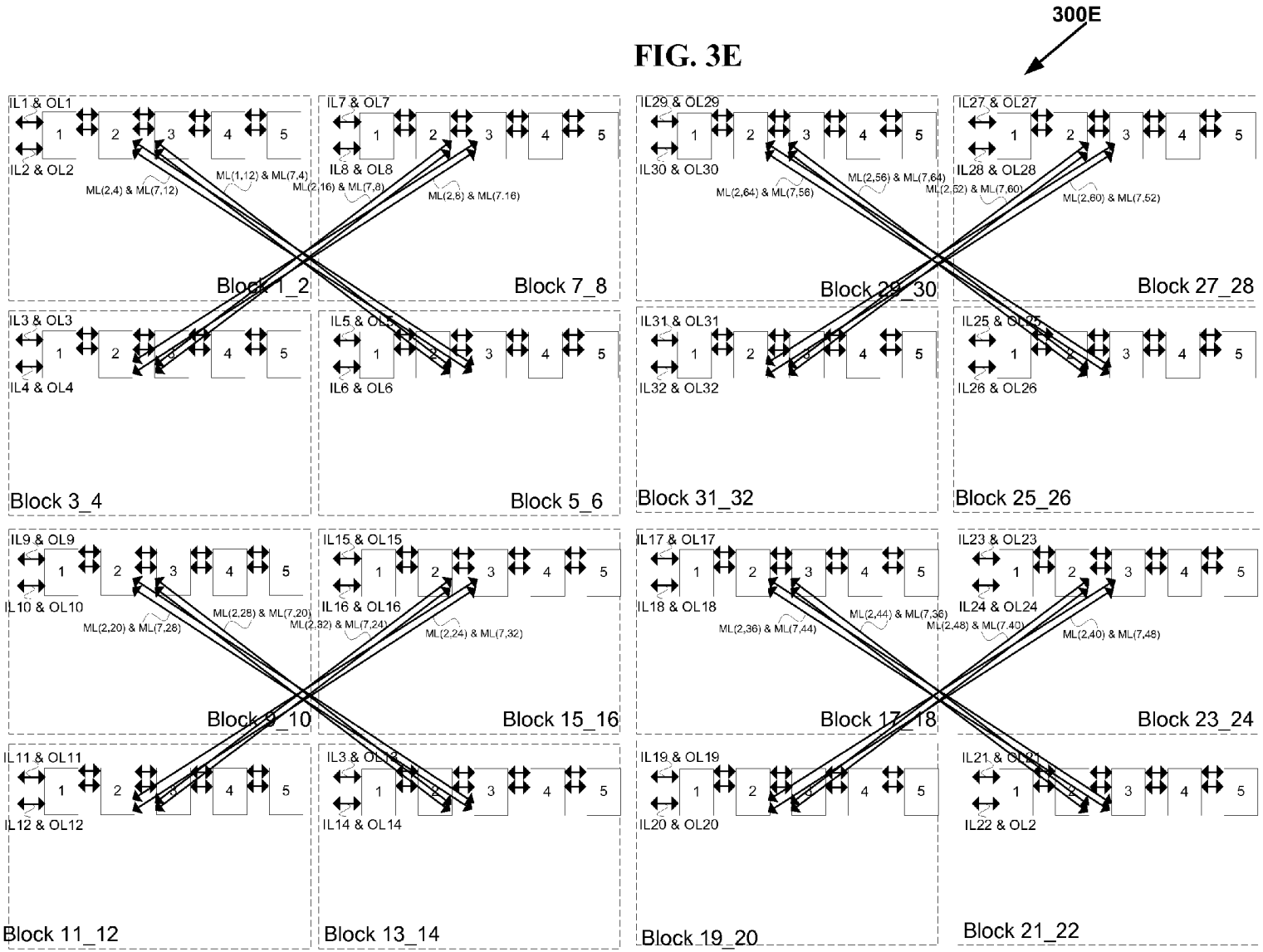
FIG. 3E is a diagram 300E layout of the network $V_{hcube}$ (N, d, s) shown in FIG. 3B, in one embodiment, illustrating the connection links ML(2,i) for i=[1, 64] and ML(7,i) for i=[1, 64].

Layout 300E of FIG. 3E illustrates the inter-block links between switches 2 and 3 of each block. For example middle links ML(2,3), ML(2,4), ML(7,11), and ML(7,12) are connected between switch 2 of Block 1_2 and switch 3 of Block 3_4. Similarly middle links ML(2,11), ML(2,12), ML(7,3), and ML(7,4) are connected between switch 3 of Block 1_2 and switch 2 of Block 3_4. Applicant notes that the inter-block links illustrated in layout 300E of FIG. 3E can be implemented as diagonal tracks in one embodiment. Also in one embodiment inter-block links are implemented as two different tracks (for example middle links ML(2,12) and ML(7,4) are implemented as two different tracks); or in an alternative embodiment inter-block links are implemented as a time division multiplexed single track (for example middle links ML(2,12) and ML(7,4) are implemented as a time division multiplexed single track).

Figure 3F:
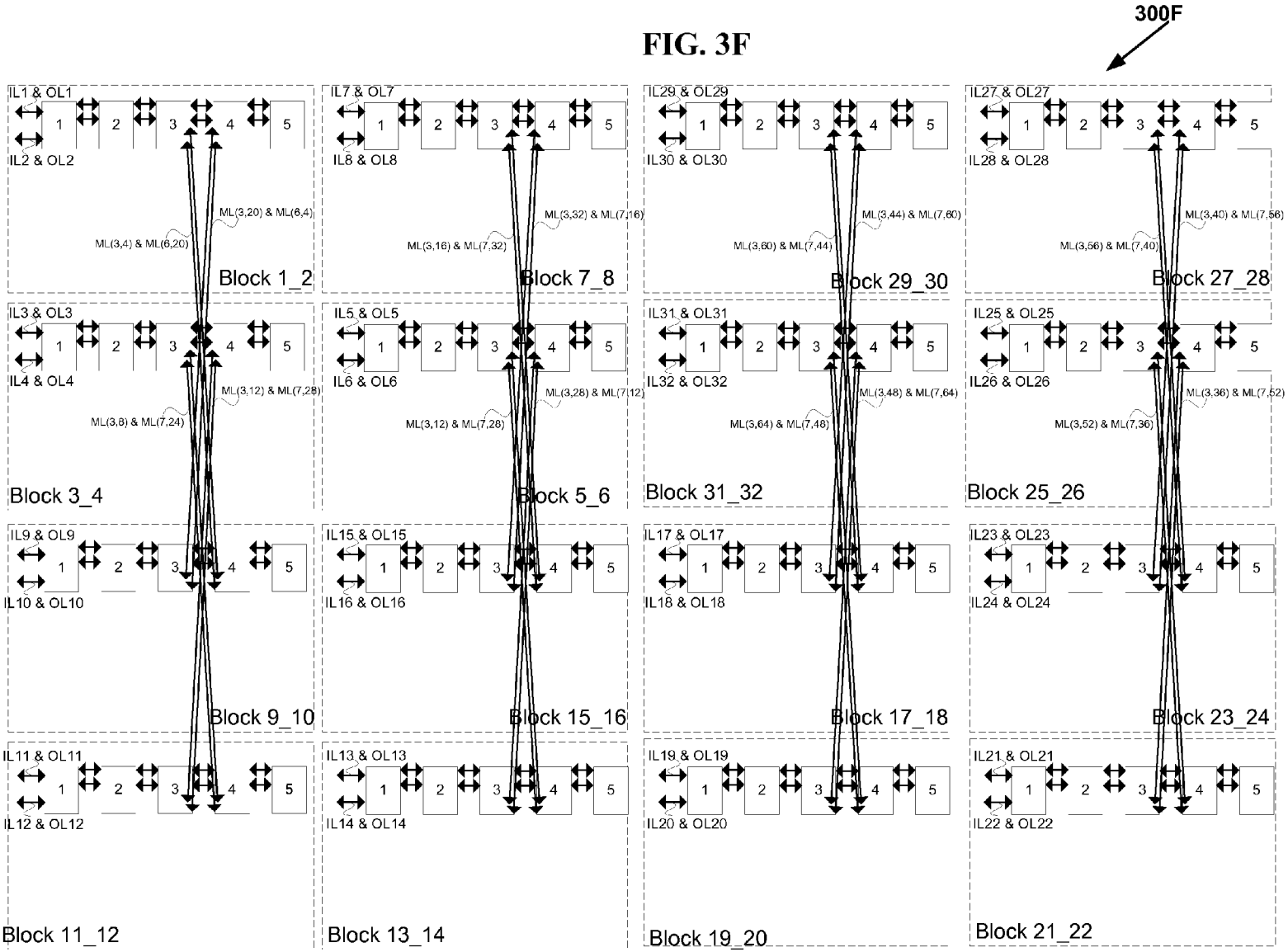
FIG. 3F is a diagram 300F layout of the network $V_{hcube}$ (N, d, s) shown in FIG. 3B, in one embodiment, illustrating the connection links ML(3,i) for i=[1, 64] and ML(6,i) for i=[1, 64].

Layout 300F of FIG. 3F illustrates the inter-block links between switches 3 and 4 of each block. For example middle links ML(3,3), ML(3,4), ML(6,19), and ML(6,20) are connected between switch 3 of Block 1_2 and switch 4 of Block 3_4. Similarly middle links ML(3,19), ML(3,20), ML(6,3), and ML(6,4) are connected between switch 4 of Block 1_2 and switch 3 of Block 3_4. Applicant notes that the inter-block links illustrated in layout 300F of FIG. 3F can be implemented as vertical tracks in one embodiment. Also in one embodiment inter-block links are implemented as two different tracks (for example middle links ML(3,4) and ML(6,20) are implemented as two different tracks); or in an alternative embodiment inter-block links are implemented as a time division multiplexed single track (for example middle links ML(3,4) and ML(6,20) are implemented as a time division multiplexed single track).

Figure 3G:
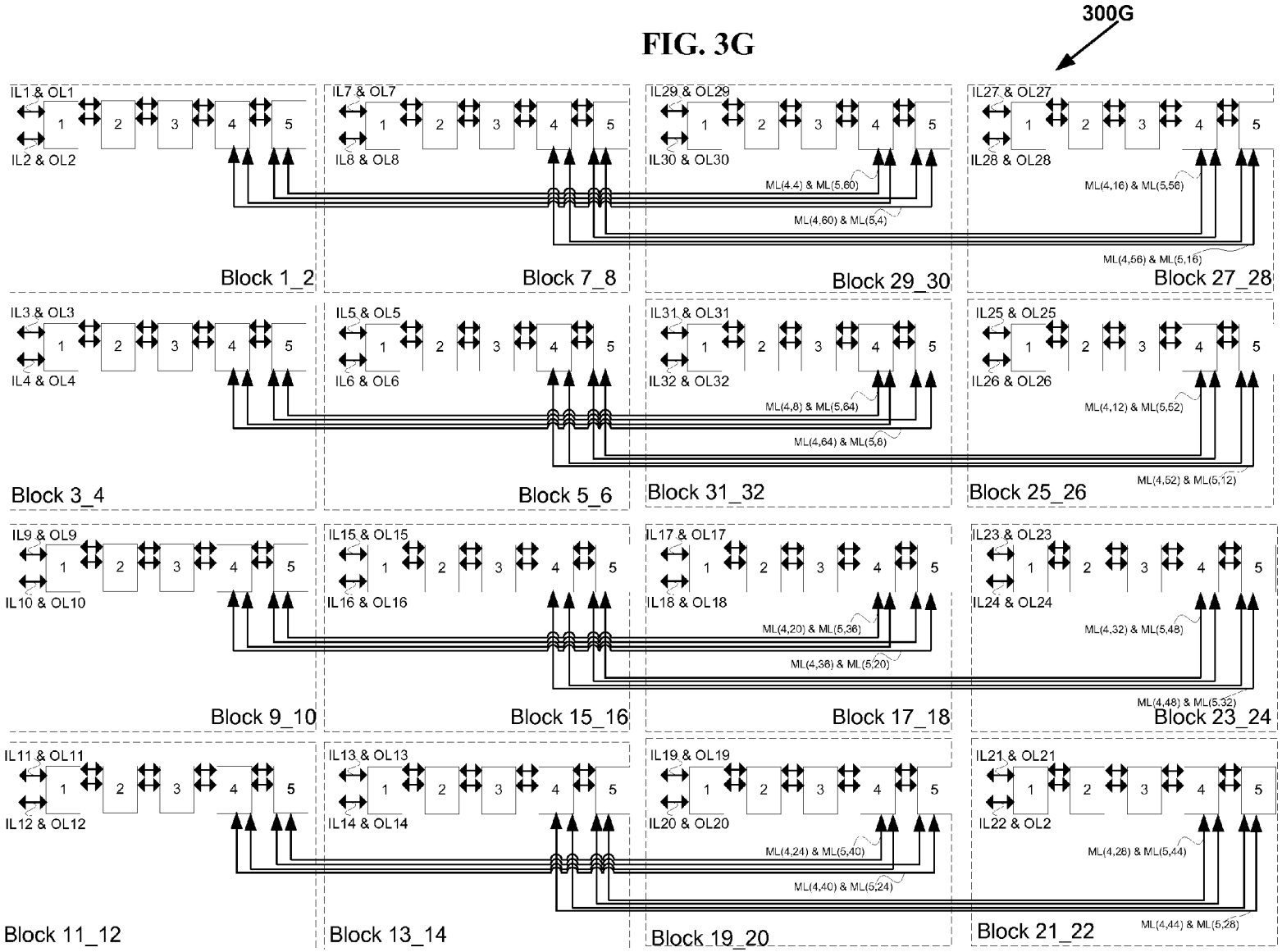
FIG. 3G is a diagram 300G layout of the network $V_{hcube}$ (N, d, s) shown in FIG. 3B, in one embodiment, illustrating the connection links ML(4,i) for i=[1, 64] and ML(5,i) for i=[1, 64].

Layout 300G of FIG. 3G illustrates the inter-block links between switches 4 and 5 of each block. For example middle links ML(4,3), ML(4,4), ML(5,35), and ML(5,36) are connected between switch 4 of Block 1_2 and switch 5 of Block 3_4. Similarly middle links ML(4,35), ML(4,36), ML(5,3), and ML(5,4) are connected between switch 5 of Block 1_2 and switch 4 of Block 3_4. Applicant notes that the inter-block links illustrated in layout 300G of FIG. 3G can be implemented as horizontal tracks in one embodiment. Also in one embodiment inter-block links are implemented as two different tracks (for example middle links ML(4,4) and ML(5,36) are implemented as two different tracks); or in an alternative embodiment inter-block links are implemented as a time division multiplexed single track (for example middle links ML(4,4) and ML(5,36) are implemented as a time division multiplexed single track).

The complete layout for the network 300B of FIG. 3B is given by combining the links in layout diagrams of 300C, 300D, 300E, 300F, and 300G. Applicant notes that in the layout 300C of FIG. 3C, the inter-block links between switch 1 and switch 2 are vertical tracks as shown in layout 300D of FIG. 3D; the inter-block links between switch 2 and switch 3 are horizontal tracks as shown in layout 300E of FIG. 3E; the inter-block links between switch 3 and switch 4 are vertical tracks as shown in layout 300F of FIG. 3F; and finally the inter-block links between switch 4 and switch 5 are horizontal tracks as shown in layout 300G of FIG. 3G. The pattern is either vertical tracks, horizontal tracks or diagonal tracks. It continues recursively for larger networks of N>32 as will be illustrated later.

Figure 3H:
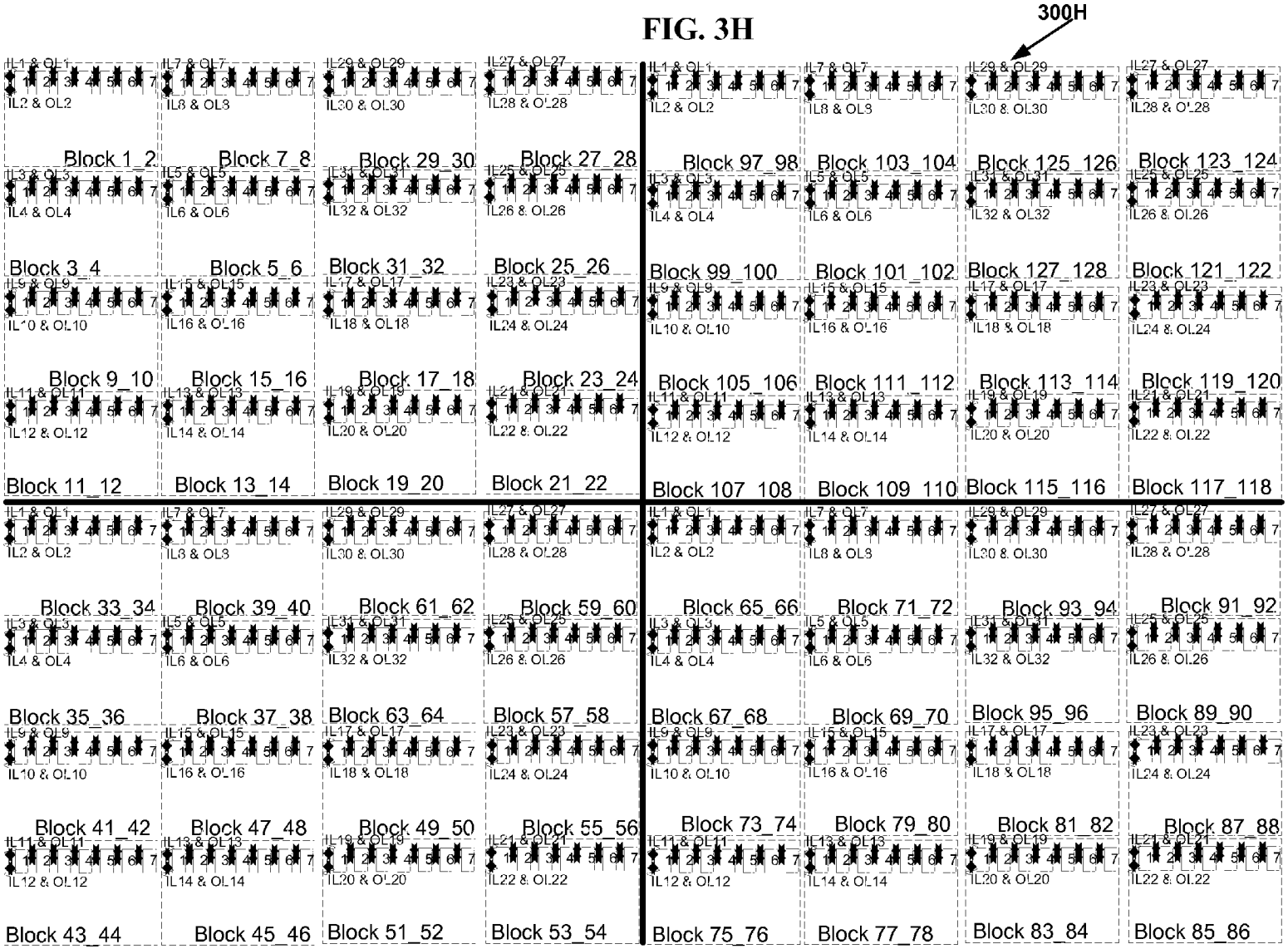
FIG. 3H is a diagram 300H layout of a network $V_{hcube}$(N, d, s) where N=128, d=2, and s=2, in one embodiment, illustrating the connection links belonging with in each block only.

Some of the key aspects of the current invention related to layout diagram 300C of FIG. 3C are noted. 1) All the switches in one row of the multi-stage network 300B are implemented in a single block. 2) The blocks are placed in such a way that all the inter-block links are either horizontal tracks, vertical tracks or diagonal tracks; 3) The length of the longest wire is about half of the width (or length) of the complete layout (For example middle link ML(4,4) is about half the width of the complete layout.);

The layout 300C in FIG. 3C can be recursively extended for any arbitrarily large generalized folded multi link multi-stage network $V_{fold\text{-}mlink}(N_1, N_2, d, s)$. Referring to layout 300H of FIG. 3H, illustrates the extension of layout 300C for the network $V_{fold\text{-}mlink}(N_1, N_2, d, s)$ where $N_1=N_2=128$; d=2; and s=2. There are four super-quadrants in layout 300H namely top-left super-quadrant, bottom-left super-quadrant, top-right super-quadrant, bottom-right super-quadrant. Total number of blocks in the layout 300H is sixty four. Top-left super-quadrant implements the blocks from block 1_2 to block 31_32. Each block in all the super-quadrants has two more switches namely switch 6 and switch 7 in addition to the switches [1-5] illustrated in layout 300C of FIG. 3C. The inter-block link connection topology is the exactly the same between the switches 1 and 2; switches 2 and 3; switches 3 and 4; switches 4 and 5 as it is shown in the layouts of FIG. 3D, FIG. 3E, FIG. 3F, and FIG. 3G respectively.

Bottom-left super-quadrant implements the blocks from block 33_34 to block 63_64. Top-right super-quadrant implements the blocks from block 65_66 to block 95_96. And bottom-right super-quadrant implements the blocks from block 97_98 to block 127_128. In all these three super-quadrants also, the inter-block link connection topology is the exactly the same between the switches 1 and 2; switches 2 and 3; switches 3 and 4; switches 4 and 5 as that of the top-left super-quadrant.

Recursively in accordance with the current invention, the inter-block links connecting the switch 5 and switch 6 will be vertical tracks between the corresponding switches of top-left super-quadrant and bottom-left super-quadrant. And similarly the inter-block links connecting the switch 5 and switch 6 will be vertical tracks between the corresponding switches of top-right super-quadrant and bottom-right super-quadrant. The inter-block links connecting the switch 6 and switch 7 will be horizontal tracks between the corresponding switches of top-left super-quadrant and top-right super-quadrant. And similarly the inter-block links connecting the switch 6 and switch 7 will be horizontal tracks between the corresponding switches of bottom-left super-quadrant and bottom-right super-quadrant.

Figure 4A:
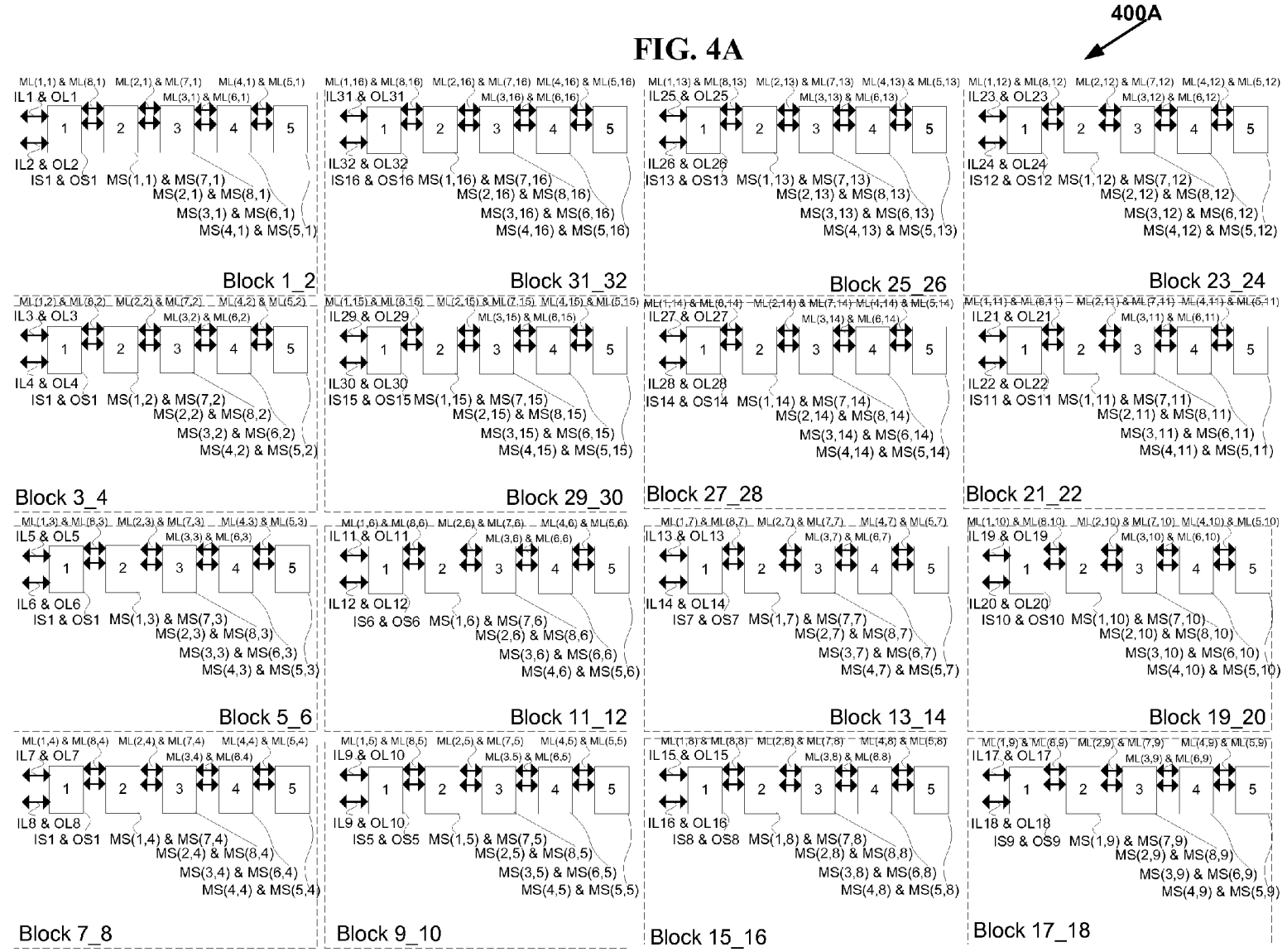
FIG. 4A is a diagram 400A layout of the network $V_{fold\text{-}mlink}$(N, d, s) shown in FIG. 1B, in one embodiment, illustrating the connection links belonging with in each block only.
Figure 4B:
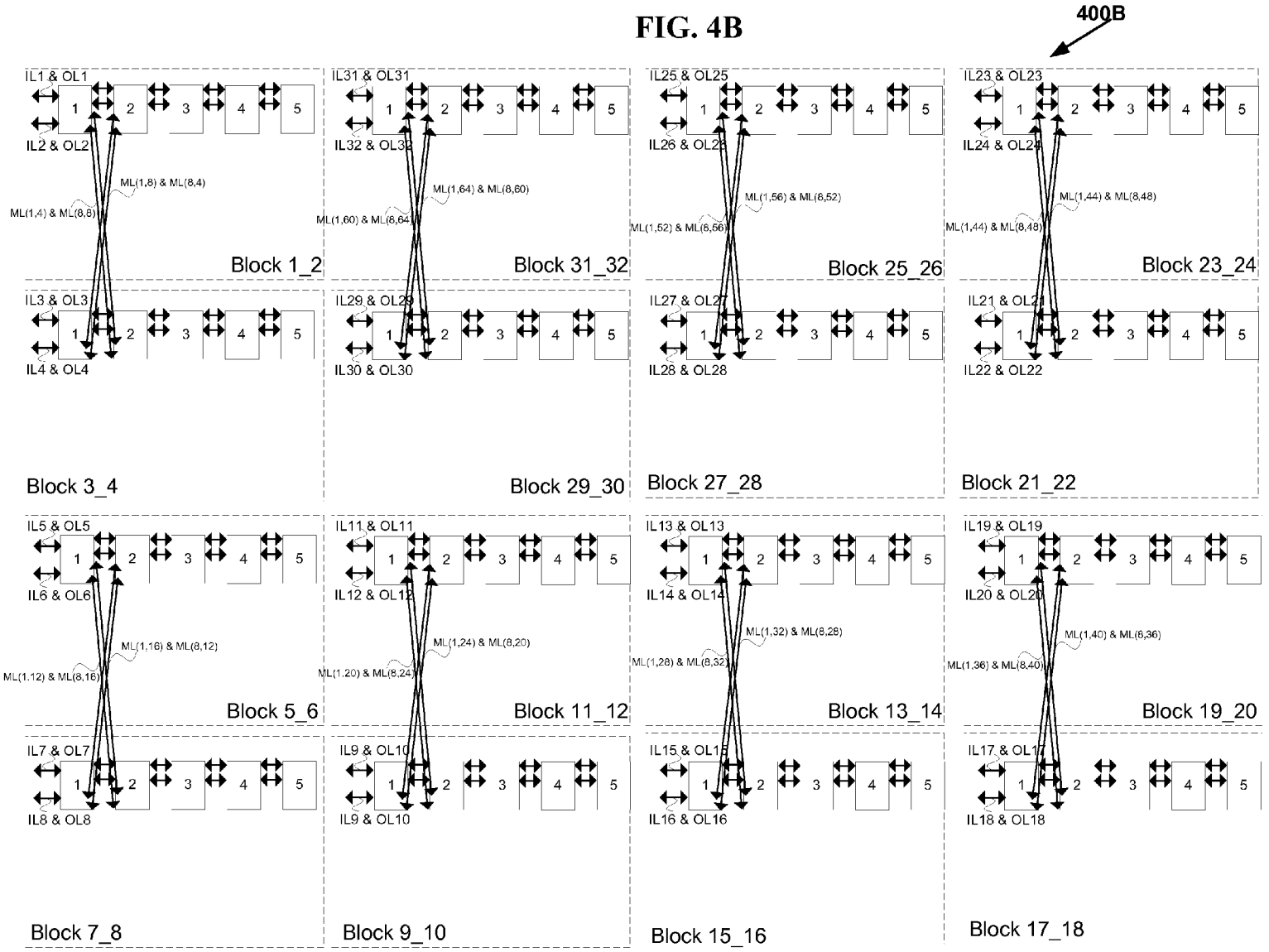
FIG. 4B is a diagram 400B layout of the network $V_{fold\text{-}mlink}$(N, d, s) shown in FIG. 1B, in one embodiment, illustrating the connection links ML(1,i) for i=[1, 64] and ML(8,i) for i=[1,64].
Figure 4C:
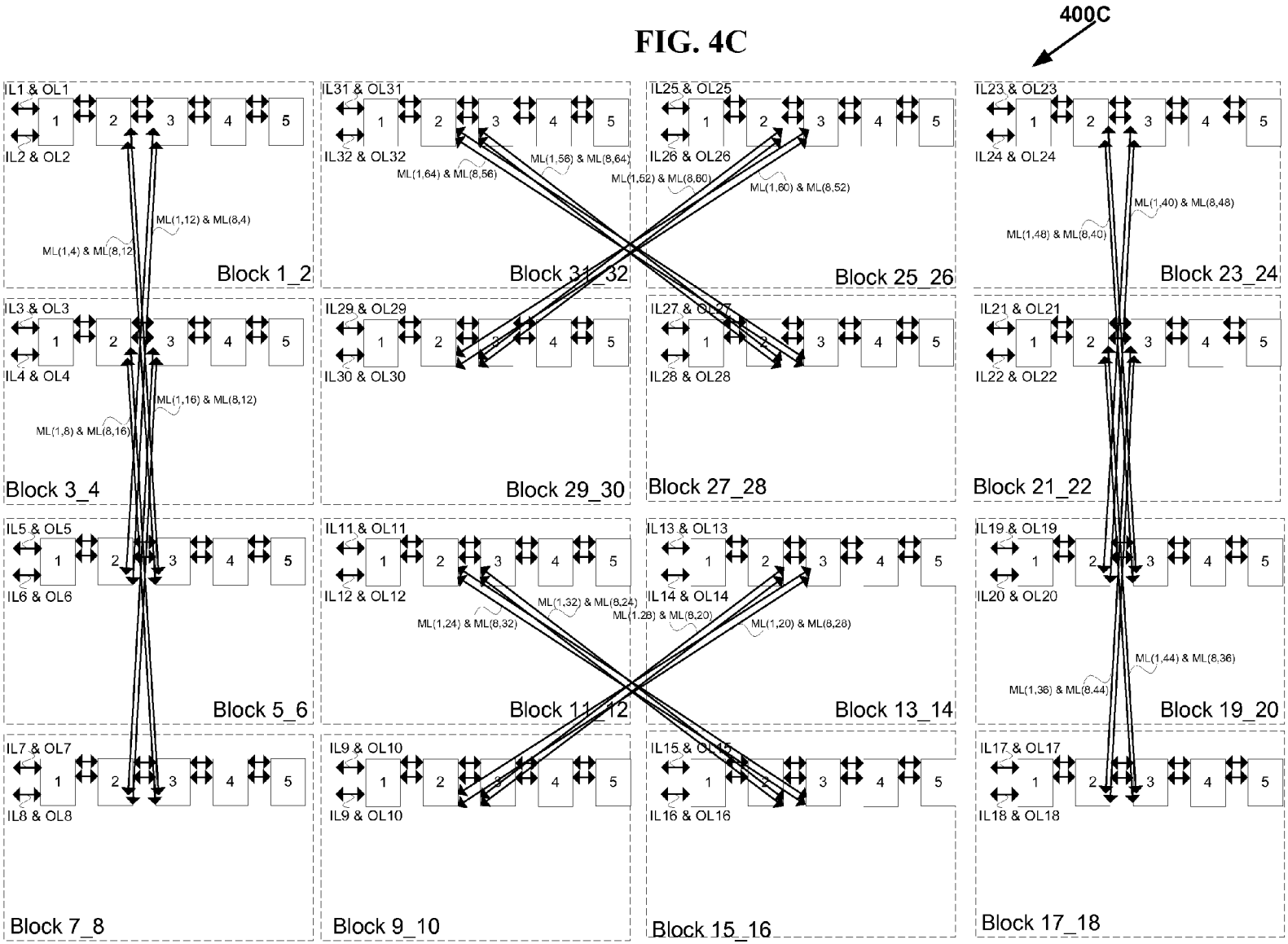
FIG. 4C is a diagram 400C layout of the network $V_{fold\text{-}mlink}$(N, d, s) shown in FIG. 4C, in one embodiment, illustrating the connection links ML(2,i) for i=[1, 64] and ML(7,i) for i=[1,64].

Ring Topology Layout Schemes:

Layout diagram 400C of FIG. 4C is another embodiment for the generalized folded multi-link multi-stage network $V_{fold\text{-}mlink}(N_1, N_2, d, s)$ diagram 100B in FIG. 1B.

Referring to layout 400C of FIG. 4C, there are sixteen blocks namely Block 1_2, Block 3_4, Block 5_6, Block 7_8, Block 9_10, Block 11_12, Block 13_14, Block 15_16, Block 17_18, Block 19_20, Block 21_22, Block 23_24, Block 25_26, Block 27_28, Block 29_30, and Block 31_32. Each block implements all the switches in one row of the network 100B of FIG. 1B, one of the key aspects of the current invention. For example Block 1_2 implements the input switch IS1, output Switch OS1, middle switch MS(1,1), middle switch MS(7,1), middle switch MS(2,1), middle switch MS(6,1), middle switch MS(3,1), middle switch MS(5,1), and middle switch MS(4,1). For the simplification of illustration, Input switch IS1 and output switch OS1 together are denoted as switch 1; Middle switch MS(1,1) and middle switch MS(7,1) together are denoted by switch 2; Middle switch MS(2,1) and middle switch MS(6,1) together are denoted by switch 3; Middle switch MS(3,1) and middle switch MS(5,1) together are denoted by switch 4; And middle switch MS(4,1) is denoted by switch 5.

All the straight middle links are illustrated in layout 400C of FIG. 4C. For example in Block 1_2, inlet links IL1-IL2, outlet links OL1-OL2, middle link ML(1,1), middle link ML(1,2), middle link ML(8,1), middle link ML(8,2), middle link ML(2,1), middle link ML(2,2), middle link ML(7,1), middle link ML(7,2), middle link ML(3,1), middle link ML(3,2), middle link ML(6,1), middle link ML(6,2), middle link ML(4,1), middle link ML(4,2), middle link ML(5,1) and middle link ML(5,2) are illustrated in layout 400C of FIG. 4C.

Even though it is not illustrated in layout 400C of FIG. 4C, in each block, in addition to the switches there may be Configurable Logic Blocks (CLB) or any arbitrary digital circuit or sub-integrated circuit block depending on the applications in different embodiments. The topology of the layout 400C in FIG. 4C is a ring. For each of the neighboring rows in diagram 100B of FIG. 1B the corresponding blocks are also physically neighbors in layout diagram 400C of FIG. 4C. In addition the topmost row is also logically considered as neighbor to the bottommost row. For example Block 1_2 (implementing the switches belonging to a row in diagram 100B of FIG. 1B) has Block 3_4 as neighbor since Block 3_4 implements the switches in its neighboring row. Similarly Block 1_2 also has Block 31_32 as neighbor since Block 1_2 implements topmost row of switches and Block 31_32 implements bottommost row of switches in diagram 100B of FIG. 1B. The ring layout scheme illustrated in 400C of FIG. 4C can be generalized for a large multi-stage network $V_{fold\text{-}mlink}(N_1, N_2, d, s)$ where $N_1=N_2>32$, in accordance with the current invention.

Layout 400B of FIG. 4B illustrates the inter-block links (in the layout 400A of FIG. 4A all the cross middle links are inter-block links) between switches 1 and 2 of each block. For example middle links ML(1,3), ML(1,4), ML(8,7), and ML(8,8) are connected between switch 1 of Block 1_2 and switch 2 of Block 3_4. Similarly middle links ML(1,7), ML(1,8), ML(8,3), and ML(8,4) are connected between switch 2 of Block 1_2 and switch 1 of Block 3_4. Applicant notes that the inter-block links illustrated in layout 400B of FIG. 4B are implemented as vertical tracks or horizontal tracks or diagonal tracks. Also in one embodiment inter-block links are implemented as two different tracks (for example middle links ML(1,4) and ML(8,8) are implemented as two different tracks); or in an alternative embodiment inter-block links are implemented as a time division multiplexed single track (for example middle links ML(1,4) and ML(8,8) are implemented as a time division multiplexed single track).

Layout 400C of FIG. 4C illustrates the inter-block links between switches 2 and 3 of each block. For example middle links ML(2,3), ML(2,4), ML(7,11), and ML(7,12) are connected between switch 2 of Block 1_2 and switch 3 of Block 3_4. Similarly middle links ML(2,11), ML(2,12), ML(7,3), and ML(7,4) are connected between switch 3 of Block 1_2 and switch 2 of Block 3_4. Applicant notes that the inter-block links illustrated in layout 400C of FIG. 4C are implemented as vertical tracks or horizontal tracks or diagonal tracks. Also in one embodiment inter-block links are implemented as two different tracks (for example middle links ML(2,12) and ML(7,4) are implemented as two different tracks); or in an alternative embodiment inter-block links are implemented as a time division multiplexed single track (for example middle links ML(2,12) and ML(7,4) are implemented as a time division multiplexed single track).

Figure 4D:
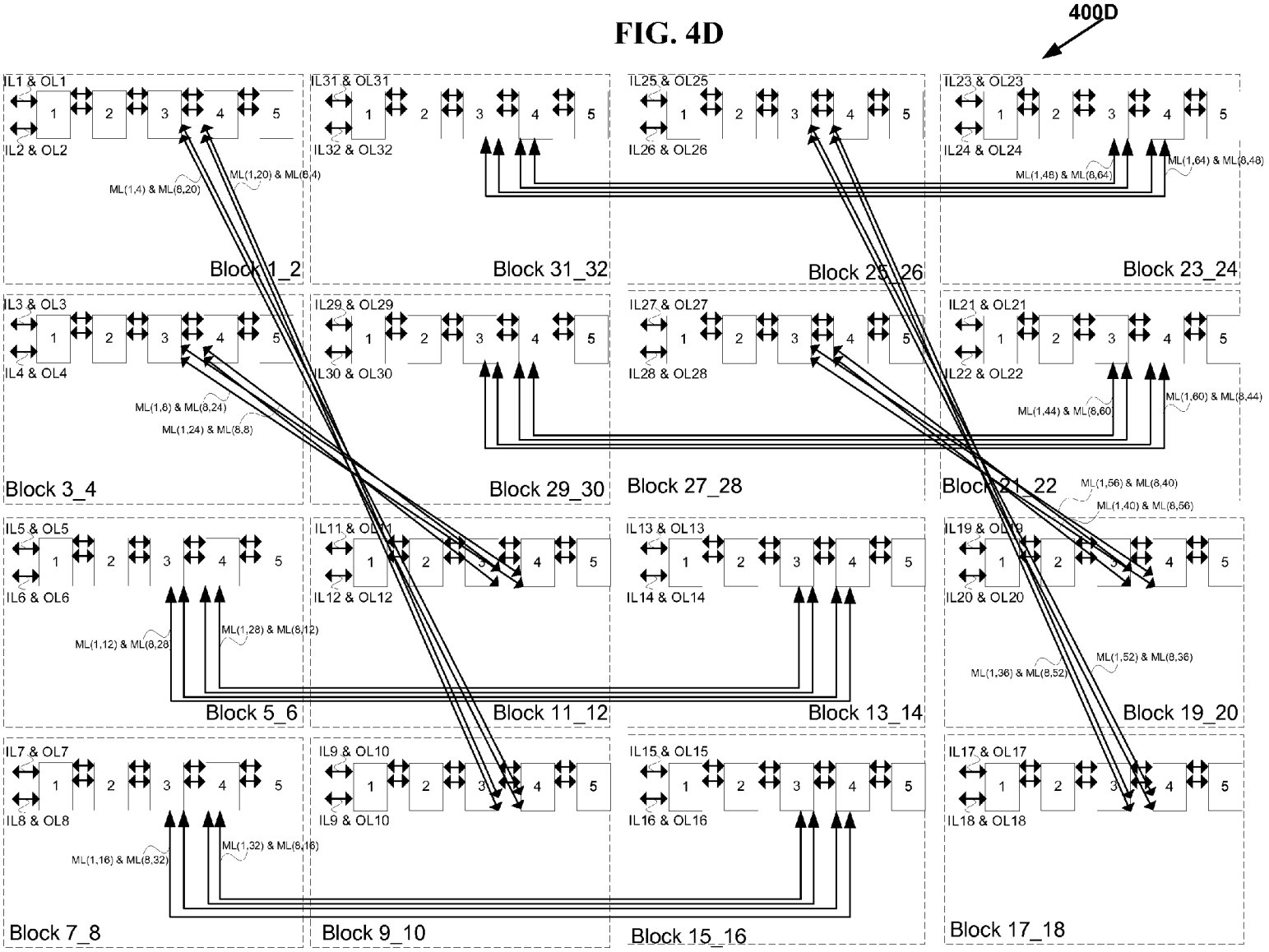
FIG. 4D is a diagram 400D layout of the network $V_{fold\text{-}mlink}(N, d, s)$ shown in FIG. 4D, in one embodiment, illustrating the connection links ML(3,i) for i=[1, 64] and ML(6,i) for i=[1,64].

Layout 400D of FIG. 4D illustrates the inter-block links between switches 3 and 4 of each block. For example middle links ML(3,3), ML(3,4), ML(6,19), and ML(6,20) are connected between switch 3 of Block 1_2 and switch 4 of Block 3_4. Similarly middle links ML(3,19), ML(3,20), ML(6,3), and ML(6,4) are connected between switch 4 of Block 1_2 and switch 3 of Block 3_4. Applicant notes that the inter-block links illustrated in layout 400D of FIG. 4D are implemented as vertical tracks or horizontal tracks or diagonal tracks. Also in one embodiment inter-block links are implemented as two different tracks (for example middle links ML(3,4) and ML(6,20) are implemented as two different tracks); or in an alternative embodiment inter-block links are implemented as a time division multiplexed single track (for example middle links ML(3,4) and ML(6,20) are implemented as a time division multiplexed single track).

Figure 4E:
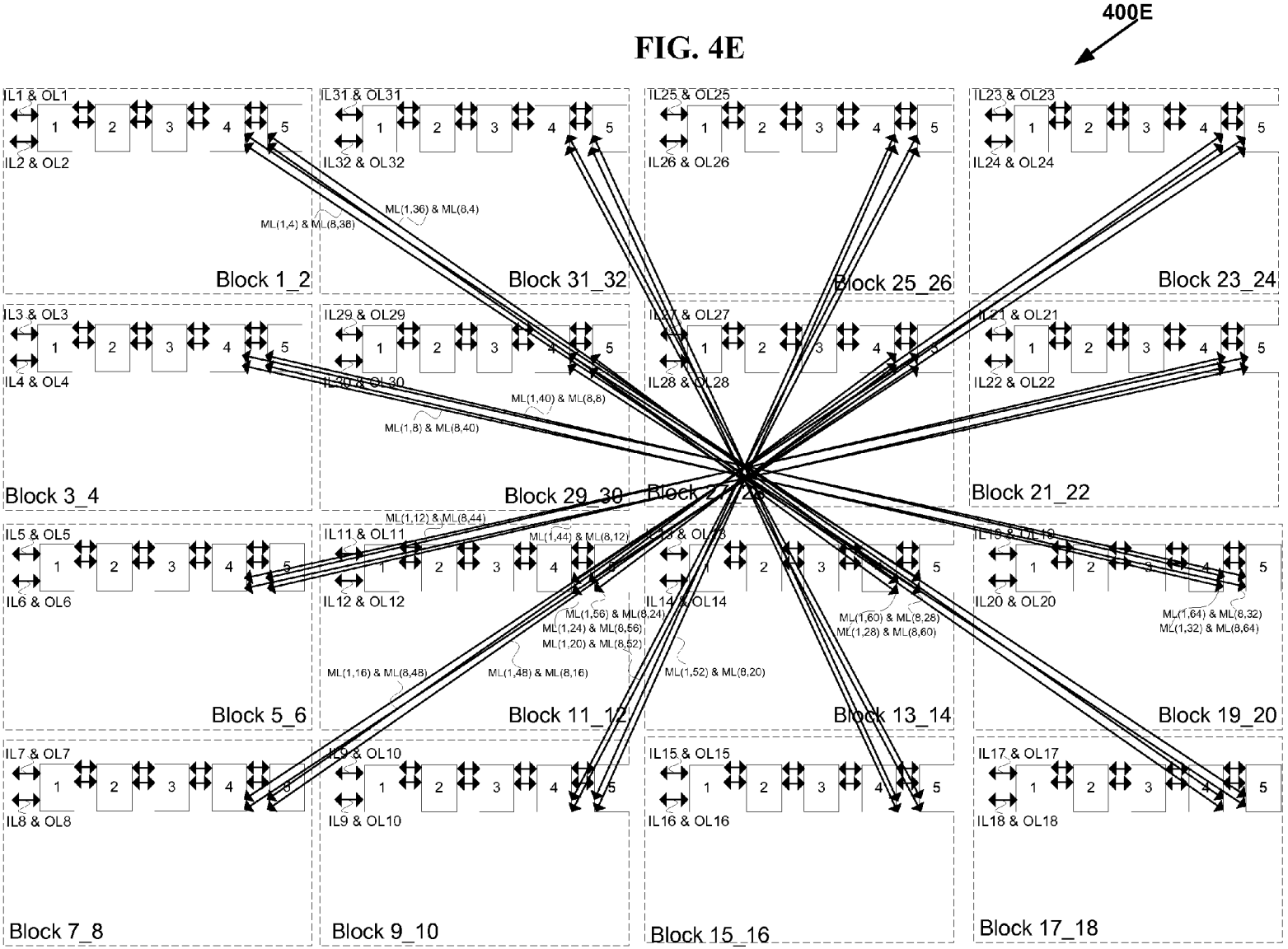
FIG. 4E is a diagram 400E layout of the network $V_{fold\text{-}mlink}(N, d, s)$ shown in FIG. 4E, in one embodiment, illustrating the connection links ML(4,i) for i=[1, 64] and ML(5,i) for i=[1,64].

Layout 400E of FIG. 4E illustrates the inter-block links between switches 4 and 5 of each block. For example middle links ML(4,3), ML(4,4), ML(5,35), and ML(5,36) are connected between switch 4 of Block 1_2 and switch 5 of Block 3_4. Similarly middle links ML(4,35), ML(4,36), ML(5,3), and ML(5,4) are connected between switch 5 of Block 1_2 and switch 4 of Block 3_4. Applicant notes that the inter-block links illustrated in layout 400E of FIG. 4E are implemented as vertical tracks or horizontal tracks or diagonal tracks. Also in one embodiment inter-block links are implemented as two different tracks (for example middle links ML(4,4) and ML(5,36) are implemented as two different tracks); or in an alternative embodiment inter-block links are implemented as a time division multiplexed single track (for example middle links ML(4,4) and ML(5,36) are implemented as a time division multiplexed single track).

The complete layout for the network 100B of FIG. 1B is given by combining the links in layout diagrams of 400A, 400B, 400C, 400D, and 400E.

Some of the key aspects of the current invention related to layout diagram 400A of FIG. 4A are noted. 1) All the switches in one row of the multi-stage network 100B are implemented in a single block. 2) The blocks are placed in such a way that all the inter-block links are either horizontal tracks, vertical tracks or diagonal tracks; 3) Length of the different wires between the same two middle stages is not the same. However it gives an opportunity to implement the most connected circuits to place and route through the blocks which have shorter wires.

Layout diagram 400C1 of FIG. 4C1 is another embodiment for the generalized folded multi-link multi-stage network $V_{fold\text{-}mlink}(N_1, N_2, d, s)$ diagram 100B in FIG. 1B. Referring to layout 400C1 of FIG. 4C1, there are sixteen blocks namely Block 1_2, Block 3_4, Block 5_6, Block 7_8, Block 9_10, Block 11_12, Block 13_14, Block 15_16, Block 17_18, Block 19_20, Block 21_22, Block 23_24, Block 25_26, Block 27_28, Block 29_30, and Block 31_32. Each block implements all the switches in one row of the network 100B of FIG. 1B, one of the key aspects of the current invention. For example Block 1_2 implements the input switch IS1, output Switch OS1, middle switch MS(1,1), middle switch MS(7,1), middle switch MS(2,1), middle switch MS(6,1), middle switch MS(3,1), middle switch MS(5,1), and middle switch MS(4,1). For the simplification of illustration, Input switch IS1 and output switch OS1 together are denoted as switch 1; Middle switch MS(1,1) and middle switch MS(7,1) together are denoted by switch 2; Middle switch MS(2,1) and middle switch MS(6,1) together are denoted by switch 3; Middle switch MS(3,1) and middle switch MS(5,1) together are denoted by switch 4; And middle switch MS(4,1) is denoted by switch 5.

All the straight middle links are illustrated in layout 400C1 of FIG. 4C1. For example in Block 1_2, inlet links IL1-IL2, outlet links OL1-OL2, middle link ML(1,1), middle link ML(1,2), middle link ML(8,1), middle link ML(8,2), middle link ML(2,1), middle link ML(2,2), middle link ML(7,1), middle link ML(7,2), middle link ML(3,1), middle link ML(3,2), middle link ML(6,1), middle link ML(6,2), middle link ML(4,1), middle link ML(4,2), middle link ML(5,1) and middle link ML(5,2) are illustrated in layout 400C1 of FIG. 4C1.

Even though it is not illustrated in layout 400C1 of FIG. 4C1, in each block, in addition to the switches there may be Configurable Logic Blocks (CLB) or any arbitrary digital circuit or sub-integrated circuit block depending on the applications in different embodiments. The topology of the layout 400C1 in FIG. 4C1 is another embodiment of ring layout topology. For each of the neighboring rows in diagram 100B of FIG. 1B the corresponding blocks are also physically neighbors in layout diagram 400C of FIG. 4C. In addition the topmost row is also logically considered as neighbor to the bottommost row. For example Block 1_2 (implementing the switches belonging to a row in diagram 100B of FIG. 1B) has Block 3_4 as neighbor since Block 3_4 implements the switches in its neighboring row. Similarly Block 1_2 also has Block 31_32 as neighbor since Block 1_2 implements topmost row of switches and Block 31_32 implements bottommost row of switches in diagram 100B of FIG. 1B. The ring layout scheme illustrated in 400C of FIG. 4C can be generalized for a large multi-stage network $V_{fold\text{-}mlink}(N_1, N_2, d, s)$ where $N_1=N_2>32$, in accordance with the current invention.

All the layout embodiments disclosed in the current invention are applicable to generalized multi-stage networks $V(N_1, N_2, d, s)$, generalized folded multi-stage networks $V_{fold}(N_1, N_2, d, s)$, generalized butterfly fat tree networks $V_{bft}(N_1, N_2, d, s)$, generalized multi-link multi-stage networks $V_{mlink}(N_1, N_2, d, s)$, generalized folded multi-link multi-stage networks $V_{fold\text{-}mlink}(N_1, N_2, d, s)$, generalized multi-link butterfly fat tree networks $V_{mlink\text{-}bft}(N_1, N_2, d, s)$, and generalized hypercube networks $V_{hcube}(N_1, N_2, d, s)$ for s=1, 2, 3 or any number in general, and for both $N_1=N=N$ and $N_1 \neq N_2$, and d is any integer.

Conversely applicant makes another important observation that generalized hypercube networks $V_{hcube}(N_1, N_2, d, s)$ are implemented with the layout topology being the hypercube topology shown in layout 100C of FIG. 1C with large scale cross point reduction as any one of the networks described in the current invention namely: generalized multi-stage networks $V(N_1, N_2, d, s)$, generalized folded multi-stage networks $V_{fold}(N_1, N_2, d, s)$, generalized butterfly fat tree networks $V_{bft}(N_1, N_2, d, s)$, generalized multi-link multi-stage networks $V_{mlink}(N_1, N_2, d, s)$, generalized folded multi-link multi-stage networks $V_{fold\text{-}mlink}(N_1, N_2, d, s)$, generalized multi-link butterfly fat tree networks $V_{mlink\text{-}bft}(N_1, N_2, d, s)$ for s=1, 2, 3 or any number in general, and for both $N_1=N_2=N$ and $N_1 \neq N_2$, and d is any integer.

Applications Embodiments

All the embodiments disclosed in the current invention are useful in many varieties of applications. FIG. 5A1 illustrates the diagram of 500A1 which is a typical two by two switch with two inlet links namely IL1 and IL2, and two outlet links namely OL1 and OL2. The two by two switch also implements four crosspoints namely CP(1,1), CP(1,2), CP(2,1) and CP(2,2) as illustrated in FIG. 5A1. For example the diagram of 500A1 may the implementation of middle switch MS(1,1) of the diagram 100K of FIG. 1K where inlet link IL1 of diagram 500A1 corresponds to middle link ML(1,1) of diagram 100K, inlet link IL2 of diagram 500A1 corresponds to middle link ML(1,7) of diagram 100K, outlet link OL1 of diagram 500A1 corresponds to middle link ML(2,1) of diagram 100K, outlet link OL2 of diagram 500A1 corresponds to middle link ML(2,3) of diagram 100K.

1) Programmable Integrated Circuit Embodiments

All the embodiments disclosed in the current invention are useful in programmable integrated circuit applications. FIG. 5A2 illustrates the detailed diagram 500A2 for the implementation of the diagram 500A1 in programmable integrated circuit embodiments. Each crosspoint is implemented by a transistor coupled between the corresponding inlet link and outlet link, and a programmable cell in programmable integrated circuit embodiments. Specifically crosspoint CP(1,1) is implemented by transistor C(1,1) coupled between inlet link IL1 and outlet link OL1, and programmable cell P(1,1); crosspoint CP(1,2) is implemented by transistor C(1,2) coupled between inlet link IL1 and outlet link OL2, and programmable cell P(1,2); crosspoint CP(2,1) is implemented by transistor C(2,1) coupled between inlet link IL2 and outlet link OL1, and programmable cell P(2,1); and crosspoint CP(2,2) is implemented by transistor C(2,2) coupled between inlet link IL2 and outlet link OL2, and programmable cell P(2,2).

If the programmable cell is programmed ON, the corresponding transistor couples the corresponding inlet link and outlet link. If the programmable cell is programmed OFF, the corresponding inlet link and outlet link are not connected. For example if the programmable cell P(1,1) is programmed ON, the corresponding transistor C(1,1) couples the corresponding inlet link IL1 and outlet link OL1. If the programmable cell P(1,1) is programmed OFF, the corresponding inlet link IL1 and outlet link OL1 are not connected. In volatile programmable integrated circuit embodiments the programmable cell may be an SRAM (Static Random Address Memory) cell. In non-volatile programmable integrated circuit embodiments the programmable cell may be a Flash memory cell. Also the programmable integrated circuit embodiments may implement field programmable logic arrays (FPGA) devices, or programmable Logic devices (PLD), or Application Specific Integrated Circuits (ASIC) embedded with programmable logic circuits or 3D-FPGAs.

FIG. 5A2 also illustrates a buffer B1 on inlet link IL2. The signals driven along inlet link IL2 are amplified by buffer B1. Buffer B1 can be inverting or non-inverting buffer. Buffers such as B1 are used to amplify the signal in links which are usually long.

2) One-Time Programmable Integrated Circuit Embodiments

All the embodiments disclosed in the current invention are useful in one-time programmable integrated circuit applications. FIG. 5A3 illustrates the detailed diagram 500A3 for the implementation of the diagram 500A1 in one-time programmable integrated circuit embodiments. Each crosspoint is implemented by a via coupled between the corresponding inlet link and outlet link in one-time programmable integrated circuit embodiments. Specifically crosspoint CP(1,1) is implemented by via V(1,1) coupled between inlet link IL1 and outlet link OL1; crosspoint CP(1,2) is implemented by via V(1,2) coupled between inlet link IL1 and outlet link OL2; crosspoint CP(2,1) is implemented by via V(2,1) coupled between inlet link IL2 and outlet link OL1; and crosspoint CP(2,2) is implemented by via V(2,2) coupled between inlet link IL2 and outlet link OL2.

If the via is programmed ON, the corresponding inlet link and outlet link are permanently connected which is denoted by thick circle at the intersection of inlet link and outlet link. If the via is programmed OFF, the corresponding inlet link and outlet link are not connected which is denoted by the absence of thick circle at the intersection of inlet link and outlet link For example in the diagram 500A3 the via V(1,1)

is programmed ON, and the corresponding inlet link IL1 and outlet link OL1 are connected as denoted by thick circle at the intersection of inlet link IL1 and outlet link OL1; the via V(2,2) is programmed ON, and the corresponding inlet link IL2 and outlet link OL2 are connected as denoted by thick circle at the intersection of inlet link IL2 and outlet link OL2; the via V(1,2) is programmed OFF, and the corresponding inlet link IL1 and outlet link OL2 are not connected as denoted by the absence of thick circle at the intersection of inlet link IL1 and outlet link OL2; the via V(2,1) is programmed OFF, and the corresponding inlet link IL2 and outlet link OL1 are not connected as denoted by the absence of thick circle at the intersection of inlet link IL2 and outlet link OL1. One-time programmable integrated circuit embodiments may be anti-fuse based programmable integrated circuit devices or mask programmable structured ASIC devices.

3) Integrated Circuit Placement and Route Embodiments

All the embodiments disclosed in the current invention are useful in Integrated Circuit Placement and Route applications, for example in ASIC backend Placement and Route tools. FIG. 5A4 illustrates the detailed diagram 500A4 for the implementation of the diagram 500A1 in Integrated Circuit Placement and Route embodiments. In an integrated circuit since the connections are known a-priori, the switch and crosspoints are actually virtual. However the concept of virtual switch and virtual crosspoint using the embodiments disclosed in the current invention reduces the number of required wires, wire length needed to connect the inputs and outputs of different netlists and the time required by the tool for placement and route of netlists in the integrated circuit.

Each virtual crosspoint is used to either to hardwire or provide no connectivity between the corresponding inlet link and outlet link. Specifically crosspoint CP(1,1) is implemented by direct connect point DCP(1,1) to hardwire (i.e., to permanently connect) inlet link IL1 and outlet link OL1 which is denoted by the thick circle at the intersection of inlet link IL1 and outlet link OL1; crosspoint CP(2,2) is implemented by direct connect point DCP(2,2) to hardwire inlet link IL2 and outlet link OL2 which is denoted by the thick circle at the intersection of inlet link IL2 and outlet link OL2. The diagram 500A4 does not show direct connect point DCP(1,2) and direct connect point DCP(1,3) since they are not needed and in the hardware implementation they are eliminated. Alternatively inlet link IL1 needs to be connected to outlet link OL1 and inlet link IL1 does not need to be connected to outlet link OL2. Also inlet link IL2 needs to be connected to outlet link OL2 and inlet link IL2 does not need to be connected to outlet link OL1. Furthermore in the example of the diagram 500A4, there is no need to drive the signal of inlet link IL1 horizontally beyond outlet link OL1 and hence the inlet link IL1 is not even extended horizontally until the outlet link OL2. Also the absence of direct connect point DCP(2,1) illustrates there is no need to connect inlet link IL2 and outlet link OL1.

In summary in integrated circuit placement and route tools, the concept of virtual switches and virtual cross points is used during the implementation of the placement & routing algorithmically in software, however during the hardware implementation cross points in the cross state are implemented as hardwired connections between the corresponding inlet link and outlet link, and in the bar state are implemented as no connection between inlet link and outlet link.

3) More Application Embodiments:

All the embodiments disclosed in the current invention are also useful in the design of SoC interconnects, Field programmable interconnect chips, parallel computer systems and in time-space-time switches.

Numerous modifications and adaptations of the embodiments, implementations, and examples described herein will be apparent to the skilled artisan in view of the disclosure.

What is claimed is:

[1. An integrated circuit device comprising a plurality of sub-integrated circuit blocks and a routing network, and Said each plurality of sub-integrated circuit blocks comprising a plurality of inlet links and a plurality of outlet links; and Said routing network comprising of a plurality of stages y, in each said sub-integrated circuit block, starting from the lowest stage of 1 to the highest stage of y, where $y \geq 1$; and Said routing network comprising a plurality of switches of size d×d, where $d \geq 2$, in each said stage and each said switch of size d×d having d inlet links and d outlet links; and Said plurality of outlet links of said each sub-integrated circuit block are directly connected to said inlet links of said switches of its corresponding said lowest stage of 1, and said plurality of inlet links of said each sub-integrated circuit block are directly connected from said outlet links of said switches of its corresponding said lowest stage of 1; and Said each sub-integrated circuit block comprising a plurality of forward connecting links connecting from switches in a lower stage to switches in its immediate succeeding higher stage, and also comprising a plurality of backward connecting links connecting from switches in a higher stage to switches in its immediate preceding lower stage; and Said each sub-integrated circuit block comprising a plurality straight links in said forward connecting links from switches in said each lower stage to switches in its immediate succeeding higher stage and a plurality cross links in said forward connecting links from switches in said each lower stage to switches in its immediate succeeding higher stage, and further comprising a plurality of straight links in said backward connecting links from switches in said each higher stage to switches in its immediate preceding lower stage and a plurality of cross links in said backward connecting links from switches in said each higher stage to switches in its immediate preceding lower stage, said plurality of sub-integrated circuit blocks arranged in a two-dimensional grid of rows and columns, and said all straight links are connecting from switches in each said sub-integrated circuit block are connecting to switches in the same said sub-integrated circuit block; and said all cross links are connecting as either vertical or horizontal links between switches in two different said sub-integrated circuit blocks which are either placed vertically above or below, or placed horizontally to the left or to the right, each said plurality of sub-integrated circuit blocks comprising same number of said stages and said switches in each said stage, regardless of the size of said two-dimensional grid so that each said plurality of sub-integrated circuit block with its corresponding said stages and said switches in each stage is replicable in both vertical direction or horizontal direction of said two-dimensional grid.]

[2. The integrated circuit device of claim 1, said two-dimensional grid of said sub-integrated circuit blocks with their corresponding said stages and said switches in each stage is scalable by any power of 2, and, for each multiplication of 2 of the size of total said sub-integrated circuit blocks, by adding one more stage of switches and the layout is placed in hypercube format and also the cross links between said one more stage of switches are connected in hypercube format.]

[3. The integrated circuit device of claim 2, wherein said cross links in succeeding stages are connecting as alternative vertical and horizontal links between switches in said sub-integrated circuit blocks.]

[4. The integrated circuit device of claim 3, wherein said cross links from switches in a stage in one of said sub-integrated circuit blocks are connecting to switches in the succeeding stage in another of said sub-integrated circuit blocks so that said cross links are either vertical links or horizontal and vice versa, and hereinafter such cross links are "shuffle exchange links").]

[5. The integrated circuit device of claim 4, wherein said all horizontal shuffle exchange links between switches in any two corresponding said succeeding stages are substantially of equal length and said vertical shuffle exchange links between switches in any two corresponding said succeeding stages are substantially of equal length in the entire said integrated circuit device.]

[6. The integrated circuit device of claim 5, wherein the shortest horizontal shuffle exchange links are connecting at the lowest stage and between switches in two nearest neighboring said sub-integrated circuit blocks, and length of the horizontal shuffle exchange links is doubled in each succeeding stage; and the shortest vertical shuffle exchange links are connecting at the lowest stage and between switches in two nearest neighboring said sub-integrated circuit blocks, and length of the vertical shuffle exchange links is doubled in each succeeding stage.]

[7. The integrated circuit device of claim 6, wherein $y \geq (\log_2 N)$, where $N>1$, so that the length of the horizontal shuffle exchange links in the highest stage is equal to half the size of the horizontal size of said two dimensional grid of sub-integrated circuit blocks and the length of the vertical shuffle exchange links in the highest stage is equal to half the size of the vertical size of said two dimensional grid of sub-integrated circuit blocks.]

[8. The integrated circuit device of claim 7, wherein d=2 and there is only one switch in each said stage in each said sub-integrated circuit block connecting said forward connecting links and there is only one switch in each said stage in each said sub-integrated circuit block connecting said backward connecting links and said routing network is rearrangeably nonblocking for unicast Benes network with full bandwidth.]

[9. The integrated circuit device of claim 7, wherein d=2 and there are at least two switches in each said stage in each said sub-integrated circuit block connecting said forward connecting links and there are at least two switches in each said stage in each said sub-integrated circuit block connecting said backward connecting links and said routing network is strictly nonblocking for unicast Benes network and rearrangeably nonblocking for arbitrary fan-out multicast Benes network with full bandwidth.]

[10. The integrated circuit device of claim 7, wherein d=2 and there are at least three switches in each said stage in each said sub-integrated circuit block connecting said forward connecting links and there are at least three switches in each said stage in each said sub-integrated circuit block connecting said backward connecting links and said routing network is strictly nonblocking for arbitrary fan-out multicast Benes network with full bandwidth.]

[11. The integrated circuit device of claim 6, wherein $y \geq (\log_2 N)$, where $N>1$, so that the length of the horizontal shuffle exchange links in the highest stage is equal to half the size of the horizontal size of said two dimensional grid of sub-integrated circuit blocks and the length of the vertical shuffle exchange links in the highest stage is equal to half the size of the vertical size of said two dimensional grid of sub-integrated circuit blocks, and said each sub-integrated circuit block further comprising a plurality of U-turn links within switches in each of said stages in each of said sub-integrated circuit blocks.]

[12. The integrated circuit device of claim 11, wherein d=2 and there is only one switch in each said stage in each said sub-integrated circuit block connecting said forward connecting links and there is only one switch in each said stage in each said sub-integrated circuit block connecting said backward connecting links and said routing network is rearrangeably nonblocking for unicast butterfly fat tree network with full bandwidth.]

[13. The integrated circuit device of claim 11, wherein d=2 and there are at least two switches in each said stage in each said sub-integrated circuit block connecting said forward connecting links and there are at least two switches in each said stage in each said sub-integrated circuit block connecting said backward connecting links and said routing network is strictly nonblocking for unicast butterfly fat tree network and rearrangeably nonblocking for arbitrary fan-out multicast butterfly fat tree network with full bandwidth.]

[14. The integrated circuit device of claim 11, wherein d=2 and there are at least three switches in each said stage in each said sub-integrated circuit block connecting said forward connecting links and there are at least three switches in each said stage in each said sub-integrated circuit block connecting said backward connecting links and said routing network is strictly nonblocking for arbitrary fan-out multicast butterfly fat tree network with full bandwidth.]

[15. The integrated circuit device of claim 1, wherein said horizontal and vertical links are implemented on two or more metal layers.]

[16. The integrated circuit device of claim 1, wherein said switches comprising active and reprogrammable cross points and said each cross point is programmable by an SRAM cell or a Flash Cell.]

[17. The integrated circuit device of claim 1, wherein said sub-integrated circuit blocks are of equal die size.]

[18. The integrated circuit device of claim 15, wherein said sub-integrated circuit blocks are Lookup Tables (hereinafter "LUTs") and said integrated circuit device is a field programmable gate array (FPGA) device or field programmable gate array (FPGA) block embedded in another integrated circuit device.]

[19. The integrated circuit device of claim 15, wherein said sub-integrated circuit blocks are AND or OR gates and said integrated circuit device is a programmable logic device (PLD).]

[20. The integrated circuit device of claim 1, wherein said sub-integrated circuit blocks comprising any arbitrary hardware logic or memory circuits.]

[21. The integrated circuit device of claim 1, wherein said switches comprising active one-time programmable cross points and said integrated circuit device is a mask programmable gate array (MPGA) device or a structured ASIC device.]

[22. The integrated circuit device of claim 1, wherein said switches comprising passive cross points or just connection of two links or not and said integrated circuit device is a Application Specific Integrated Circuit (ASIC) device.]

[23. The integrated circuit device of claim 1, wherein said sub-integrated circuit blocks further recursively comprise one or more super-sub-integrated circuit blocks and a sub-routing network.]

[24. The integrated circuit device of claim 4, wherein said all horizontal shuffle exchange links between switches in any two corresponding said succeeding stages are of different length and said vertical shuffle exchange links between switches in any two corresponding said succeeding stages are of different length and $y \geq (\log_2 N)$ where $N>1$.]

[25. The integrated circuit device of claim 24, wherein $d=2$ and there is only one switch in each said stage in each said sub-integrated circuit block connecting said forward connecting links and there is only one switch in each said stage in each said sub-integrated circuit block connecting said backward connecting links and said routing network is rearrangeably nonblocking for unicast generalized multi-stage network with full bandwidth.]

[26. The integrated circuit device of claim 24, wherein $d=2$ and there are at least two switches in each said stage in each said sub-integrated circuit block connecting said forward connecting links and there are at least two switches in each said stage in each said sub-integrated circuit block connecting said backward connecting links and said routing network is strictly nonblocking for unicast generalized multi-stage network and rearrangeably nonblocking for arbitrary fan-out multicast generalized multi-stage network with full bandwidth.]

[27. The integrated circuit device of claim 24, wherein $d=2$ and there are at least three switches in each said stage in each said sub-integrated circuit block connecting said forward connecting links and there are at least three switches in each said stage in each said sub-integrated circuit block connecting said backward connecting links and said routing network is strictly nonblocking for arbitrary fan-out multicast generalized multi-stage network with full bandwidth.]

[28. The integrated circuit device of claim 4, wherein said all horizontal shuffle exchange links between switches in any two corresponding said succeeding stages are of different length and said vertical shuffle exchange links between switches in any two corresponding said succeeding stages are of different length and $y \geq (\log_2 N)$, where $N>1$, and said each sub-integrated circuit block further comprising a plurality of U-turn links within switches in each of said stages in each of said sub-integrated circuit blocks.]

[29. The integrated circuit device of claim 28, wherein $d=2$ and there is only one switch in each said stage in each said sub-integrated circuit block connecting said forward connecting links and there is only one switch in each said stage in each said sub-integrated circuit block connecting said backward connecting links and said routing network is rearrangeably nonblocking for unicast generalized butterfly fat tree network with full bandwidth.]

[30. The integrated circuit device of claim 28, wherein $d=2$ and there are at least two switches in each said stage in each said sub-integrated circuit block connecting said forward connecting links and there are at least two switches in each said stage in each said sub-integrated circuit block connecting said backward connecting links and said routing network is strictly nonblocking for unicast generalized butterfly fat tree Network and rearrangeably nonblocking for arbitrary fan-out multicast generalized butterfly fat tree network with full bandwidth.]

[31. The integrated circuit device of claim 28, wherein $d=2$ and there are at least three switches in each said stage in each said sub-integrated circuit block connecting said forward connecting links and there are at least three switches in each said stage in each said sub-integrated circuit block connecting said backward connecting links and said routing network is strictly nonblocking for arbitrary fan-out multicast generalized butterfly fat tree network with full bandwidth.]

[32. The integrated circuit device of claim 1, wherein said straight links connecting from switches in each said sub-integrated circuit block are connecting to switches in the same said sub-integrated circuit block; and said cross links are connecting as vertical or horizontal or diagonal links between two different said sub-integrated circuit blocks.]

[33. The integrated circuit device of claim 7, wherein $d=4$ and there is only one switch in each said stage in each said sub-integrated circuit block connecting said forward connecting links and there is only one switch in each said stage in each said sub-integrated circuit block connecting said backward connecting links and said routing network is rearrangeably nonblocking for unicast multi-link Benes network with full bandwidth.]

[34. The integrated circuit device of claim 7, wherein $d=4$ and there are at least two switches in each said stage in each said sub-integrated circuit block connecting said forward connecting links and there are at least two switches in each said stage in each said sub-integrated circuit block connecting said backward connecting links and said routing network is strictly nonblocking for unicast multi-link Benes network and rearrangeably nonblocking for arbitrary fan-out multicast multi-link Benes network with full bandwidth.]

[35. The integrated circuit device of claim 7, wherein $d=4$ and there are at least three switches in each said stage in each said sub-integrated circuit block connecting said forward connecting links and there are at least three switches in each said stage in each said sub-integrated circuit block connecting said backward connecting links and said routing network is strictly nonblocking for arbitrary fan-out multicast multi-link Benes network with full bandwidth.]

[36. The integrated circuit device of claim 11, wherein $d=4$ and there is only one switch in each said stage in each said sub-integrated circuit block connecting said forward connecting links and there is only one switch in each said stage in each said sub-integrated circuit block connecting said backward connecting links and said routing network is rearrangeably nonblocking for unicast multi-link butterfly fat tree network with full bandwidth.]

[37. The integrated circuit device of claim 11, wherein $d=4$ and there are at least two switches in each said stage in each said sub-integrated circuit block connecting said forward connecting links and there are at least two switches in each said stage in each said sub-integrated circuit block connecting said backward connecting links and said routing network is strictly nonblocking for unicast multi-link butterfly fat tree network and rearrangeably nonblocking for arbitrary fan-out multicast multi-link butterfly fat tree network with full bandwidth.]

[38. The integrated circuit device of claim 11, wherein d=4 and there are at least three switches in each said stage in each said sub-integrated circuit block connecting said forward connecting links and there are at least three switches in each said stage in each said sub-integrated circuit block connecting said backward connecting links and said routing network is strictly nonblocking for arbitrary fan-out multicast multi-link butterfly fat tree network with full bandwidth.]

[39. The integrated circuit device of claim 4, wherein said all horizontal shuffle exchange links between switches in any two corresponding said succeeding stages are of different length and said vertical shuffle exchange links between switches in any two corresponding said succeeding stages are of different length and $y \geq (\log_2 N)$, where N>1.]

[40. The integrated circuit device of claim 39, wherein d=4 and there is only one switch in each said stage in each said sub-integrated circuit block connecting said forward connecting links and there is only one switch in each said stage in each said sub-integrated circuit block connecting said backward connecting links and said routing network is rearrangeably nonblocking for unicast generalized multi-link multi-stage network with full bandwidth.]

[41. The integrated circuit device of claim 39, wherein d=4 and there are at least two switches in each said stage in each said sub-integrated circuit block) connecting said forward connecting links and there are at least two switches in each said stage in each said sub-integrated circuit block connecting said backward connecting links and said routing network is strictly nonblocking for unicast generalized multi-link multi-stage network and rearrangeably nonblocking for arbitrary fan-out multicast generalized multi-link multi-stage network with full bandwidth.]

[42. The integrated circuit device of claim 39, wherein d=4 and there are at least three switches in each said stage in each said sub-integrated circuit block connecting said forward connecting links and there are at least three switches in each said stage in each said sub-integrated circuit block connecting said backward connecting links and said routing network is strictly nonblocking for arbitrary fan-out multicast generalized multi-link multi-stage network with full bandwidth.]

[43. The integrated circuit device of claim 4, wherein said all horizontal shuffle exchange links between switches in any two corresponding said succeeding stages are of different length and said vertical shuffle exchange links between switches in any two corresponding said succeeding stages are of different length and $y \geq (\log_2 N)$, where N>1, and said each sub-integrated circuit block further comprising a plurality of U-turn links within switches in each of said stages in each of said sub-integrated circuit blocks.]

[44. The integrated circuit device of claim 43, wherein d=4 and there is only one switch in each said stage in each said sub-integrated circuit block connecting said forward connecting links and there is only one switch in each said stage in each said sub-integrated circuit block connecting said backward connecting links and said routing network is rearrangeably nonblocking for unicast generalized multi-link butterfly fat tree network with full bandwidth.]

[45. The integrated circuit device of claim 43, wherein d=4 and there are at least two switches in each said stage in each said sub-integrated circuit block connecting said forward connecting links and there are at least two switches in each said stage in each said sub-integrated circuit block connecting said backward connecting links and said routing network is strictly nonblocking for unicast generalized multi-link butterfly fat tree Network and rearrangeably nonblocking for arbitrary fan-out multicast generalized multi-link butterfly fat tree network with full bandwidth.]

[46. The integrated circuit device of claim 43, wherein d=4 and there are at least three switches in each said stage in each said sub-integrated circuit block connecting said forward connecting links and there are at least three switches in each said stage in each said sub-integrated circuit block connecting said backward connecting links and said routing network is strictly nonblocking for arbitrary fan-out multicast generalized multi-link butterfly fat tree network with full bandwidth.]

[47. The integrated circuit device of claim 1, wherein said plurality of forward connecting links use a plurality of buffers to amplify signals driven through them and said plurality of backward connecting links use a plurality of buffers to amplify signals driven through them; and said buffers can be inverting or non-inverting buffers.]

[48. The integrated circuit device of claim 1, wherein said all switches of size d×d are either fully populated or partially populated.]

*49. A multi-stage network comprising: a plurality of blocks and a plurality of inlet links and a plurality of outlet links; and*

*wherein each block of said plurality of blocks comprising a y stages namely stage 1 to stage y, where y>2 and y is an integer, wherein stage 1 is hereinafter a input stage, stage y is hereinafter a output stage and remaining stages of said y stages hereinafter a middle stages, and*

*wherein each stage of said y stages comprising one or more switches of size $d_i \times d_0$, where $d_i, d_0$ are integers, and $d_i \geq 2$ and $d_0 \geq 2$, each switch of said one or more switches of size $d_i \times d_0$ having $d_i$ incoming links and $d_0$ outgoing links; and*

*wherein each outlet link of said plurality of outlet links is directly connected from a first outgoing link of said $d_0$ outgoing links of a first switch of said one or more switches of size $d_i \times d_0$ of the output stage of said y stages of a first block of said plurality of blocks and each inlet link of said plurality of inlet links is directly connected to a first incoming link of said $d_i$ incoming links of one or more switches of said one or more switches of size $d_i \times d_0$ of the input stage of said y stages of a first block of said plurality of blocks; and*

*each block of said plurality of blocks comprising a plurality of forward connecting links connecting from said one or more switches in each stage of said y stages except stage y to said one or more switches in an immediate succeeding stage of said y stages, and also comprising a plurality of backward connecting links connecting from said one or more switches in each stage of said y stages except stage 1 to said one or more switches in an immediate preceding stage of said y stages; and*

*said plurality of blocks arranged in a two-dimensional grid of a plurality of rows and a plurality of columns, and*

*said plurality of forward connecting links and said plurality of backward connecting links comprise a plurality of straight middle links connecting from said one or more switches of a first stage of said y stages in a first block of said plurality of blocks to said one or more switches of an immediate succeeding or an immediate*

*preceding stage of said first stage of said y stages in said first block of said plurality of blocks; and*

*said plurality of forward connecting links and said plurality of backward connecting links comprise a plurality of cross middle links connecting from switches of said one or more switches in a stage of said y stages in a first block of said plurality of blocks to switches of said one or more switches in a succeeding stage or a preceding stage of a second block of said plurality of blocks which is either placed vertically above or below, or placed horizontally to left or to right of said first block of said plurality of blocks, wherein said plurality of cross middle links are either vertical tracks or horizontal tracks, and*

*wherein each block of said plurality of blocks comprising same number of said y stages, and each stage of said y stages comprising same number of said one or more switches of size* $d_1 \times d_0$ *is replicable in both vertical direction or horizontal direction of said two-dimensional grid of said plurality of rows and said plurality of columns regardless of the size of said two-dimensional grid of said plurality of rows and said plurality of columns, and*

*said plurality of cross middle links in succeeding stages of said y stages are connected alternately as vertical tracks and horizontal tracks (hereinafter "a hypercube topology").*

*50. The multi-stage network of claim 49, said plurality of blocks comprising said y stages arranged in a two-dimensional grid is scalable by any power of 2, and,*

*for each multiplication of 2 of size of total said plurality of blocks, by adding one more stage to said y stages and said hypercube topology is extended and placed in said hypercube topology and the cross middle links between said one more stage to said y stages of switches of said one or more switches are connected in said hypercube topology.*

*51. The multi-stage network of claim 49, wherein said plurality of cross middle links between switches in any two same succeeding stages of said y stages are of equal length, and*

*a shortest cross middle links of said plurality of cross middle links are connected at stage 1 of said y stages and between switches of said one or more switches in two nearest neighboring said plurality of blocks, and length of the cross middle links is doubled in each succeeding stage of said y stages in either said vertical tracks or said horizontal tracks.*

*52. The multi-stage network of claim 51, wherein* $y \geq (\log_2 N)$*, where* $N>2$*, wherein length or width of the plurality of cross middle links in stage y is equal to half the length or width of said two dimensional grid of said plurality of blocks, and wherein* $d=2$ *and either*

*each stage of said y stages in each block of said plurality of blocks comprises only one switch of said one or more switches connecting said plurality of forward connecting links and each stage of said y stages in each block of said plurality of blocks comprises only one switch of said one or more switches connecting said plurality of backward connecting links and said multi-stage network is rearrangeably nonblocking for unicast Benes network, or*

*each stage of said y stages in each block of said plurality of blocks comprises at least two switches of said one or more switches connecting said plurality of forward connecting links and each stage of said y stages in each block of said plurality of blocks comprises at least two switches of said one or more switches connecting said plurality of backward connecting links and said multi-stage network is strictly nonblocking for unicast Benes network and is rearrangeably nonblocking for arbitrary fan-out multicast Benes network, or*

*each stage of said y stages in each block of said plurality of blocks comprises at least three switches of said one or more switches connecting said plurality of forward connecting links and each stage of said y stages in each block of said plurality of blocks comprises at least three switches of said one or more switches connecting said plurality of backward connecting links and said multi-stage network is strictly nonblocking for arbitrary fan-out multicast Benes network.*

*53. The multi-stage network of claim 51, wherein* $y \geq (\log_2 N)$*, where* $N>2$*, wherein length or width of the plurality of cross middle links in stage y is equal to half the length or width of said two dimensional grid of said plurality of blocks, and*

*each block of said plurality of blocks further comprising a plurality of U-turn links within switches of said one or more switches in each stage of said y stages in each block of said plurality of blocks, and wherein* $d=2$ *and either*

*each stage of said y stages in each block of said plurality of blocks comprises only one switch of said one or more switches connecting said plurality of forward connecting links and each stage of said y stages in each block of said plurality of blocks comprises only one switch of said one or more switches connecting said plurality of backward connecting links and said multi-stage network is rearrangeably nonblocking for unicast butterfly fat tree network, or*

*each stage of said y stages in each block of said plurality of blocks comprises at least two switches of said one or more switches connecting said plurality of forward connecting links and each stage of said y stages in each block of said plurality of blocks comprises at least two switches of said one or more switches connecting said plurality of backward connecting links and said multi-stage network is strictly nonblocking for unicast butterfly fat tree network and rearrangeably nonblocking for arbitrary fan-out multicast butterfly fat tree network, or*

*each stage of said y stages in each block of said plurality of blocks comprises at least three switches of said one or more switches connecting said plurality of forward connecting links and each stage of said y stages in each block of said plurality of blocks comprises at least three switches of said one or more switches connecting said plurality of backward connecting links and said multi-stage network is strictly nonblocking for arbitrary fan-out multicast butterfly fat tree network.*

*54. The multi-stage network of claim 49, wherein said one or more switches comprising a plurality of reprogrammable cross points and said plurality of reprogrammable cross point is programmable by SRAM cells or Flash Cells, or*

*said plurality of forward connecting links use a plurality of buffers to amplify a signals driven through them and said plurality of backward connecting links use a plurality of buffers to amplify a signals driven through them; and said plurality of buffers are either inverting or non-inverting buffers.*

*55. The multi-stage network of claim 49, wherein said one or more switches comprising passive cross points or just connection of two links or not.*

*56. The multi-stage network of claim 49, wherein said plurality of cross middle links between switches of said one or more switches in any two succeeding stages of said y stages are of different length and said plurality of cross middle links between switches of said one or more switches in any two succeeding stages of said y stages are of different width and* $y \geq (\log_2 N)$, *where* $N>2$, *and wherein* $d=2$ *and either*

*each stage of said y stages in each block of said plurality of blocks comprises only one switch of said one or more switches connecting said plurality of forward connecting links and each stage of said y stages in each block of said plurality of blocks comprises only one switch of said one or more switches connecting said plurality of backward connecting links and said multi-stage network is rearrangeably nonblocking for unicast generalized multi-stage network, or*

*each stage of said y stages in each block of said plurality of blocks comprises at least two switches of said one or more switches connecting said plurality of forward connecting links and each stage of said y stages in each block of said plurality of blocks comprises at least two switches of said one or more switches connecting said plurality of backward connecting links and said multi-stage network is strictly nonblocking for unicast generalized multi-stage network and rearrangeably nonblocking for arbitrary fan-out multicast generalized multi-stage network, or*

*each stage of said y stages in each block of said plurality of blocks comprises at least three switches of said one or more switches connecting said plurality of forward connecting links and each stage of said y stages in each block of said plurality of blocks comprises at least three switches of said one or more switches connecting said plurality of backward connecting links and said multi-stage network is strictly nonblocking for arbitrary fan-out multicast generalized multi-stage network.*

*57. The multi-stage network of claim 49, wherein said plurality of cross middle links between switches of said one or more switches in any two succeeding stages of said y stages are of different length and said plurality of cross middle links between switches of said one or more switches in any two succeeding stages of said y stages are of different width and* $y \geq (\log_2 N)$, *where* $N>2$, *and*

*each block of said plurality of blocks further comprising a plurality of U-turn links within switches of said one or more switches in each stage of said y stages in each block of said plurality of blocks, and*

*wherein* $d=2$ *and either*

*each stage of said y stages in each block of said plurality of blocks comprises only one switch of said one or more switches connecting said plurality of forward connecting links and each stage of said y stages in each block of said plurality of blocks comprises only one switch of said one or more switches connecting said plurality of backward connecting links and said multi-stage network is rearrangeably nonblocking for unicast generalized butterfly fat tree network, or*

*each stage of said y stages in each block of said plurality of blocks comprises at least two switches of said one or more switches connecting said plurality of forward connecting links and each stage of said y stages in each block of said plurality of blocks comprises at least two switches of said one or more switches connecting said plurality of backward connecting links and said multi-stage network is strictly nonblocking for unicast generalized butterfly fat tree Network and rearrangeably nonblocking for arbitrary fan-out multicast generalized butterfly fat tree network, or*

*each stage of said y stages in each block of said plurality of blocks comprises at least three switches of said one or more switches connecting said plurality of forward connecting links and each stage of said y stages in each block of said plurality of blocks comprises at least three switches of said one or more switches connecting said plurality of backward connecting links and said multi-stage network is strictly nonblocking for arbitrary fan-out multicast generalized butterfly fat tree network.*

*58. The multi-stage network of claim 51, wherein* $y \geq (\log_2 N)$, *where* $N>2$, *wherein length or width of said plurality of cross middle links in stage y is equal to half the size of said two dimensional grid of said plurality of blocks, and wherein* $d=4$ *and either*

*each stage of said y stages in each block of said plurality of blocks comprises only one switch of said one or more switches connecting said plurality of forward connecting links and each stage of said y stages in each block of said plurality of blocks comprises only one switch of said one or more switches connecting said plurality of backward connecting links and said multi-stage network is rearrangeably nonblocking for unicast multi-link Benes network, or*

*each stage of said y stages in each block of said plurality of blocks comprises at least two switches of said one or more switches connecting said plurality of forward connecting links and each stage of said y stages in each block of said plurality of blocks comprises at least two switches of said one or more switches connecting said plurality of backward connecting links and said multi-stage network is strictly nonblocking for unicast multi-link Benes network and rearrangeably nonblocking for arbitrary fan-out multicast multi-link Benes network, or*

*each stage of said y stages in each block of said plurality of blocks comprises at least three switches of said one or more switches connecting said plurality of forward connecting links and each stage of said y stages in each block of said plurality of blocks comprises at least three switches of said one or more switches connecting said plurality of backward connecting links and said multi-stage network is strictly nonblocking for arbitrary fan-out multicast multi-link Benes network.*

*59. The multi-stage network of claim 51, wherein* $y \geq (\log_2 N)$, *where* $N>2$, *wherein length or width of said plurality of cross middle links in stage y is equal to half the size of said two dimensional grid of said plurality of blocks, and*

*each block of said plurality of blocks further comprising a plurality of U-turn links within switches of said one or more switches in each stage of said y stages in each block of said plurality of blocks, and wherein* $d=4$ *and either*

*each stage of said y stages in each block of said plurality of blocks comprises only one switch of said one or more switches connecting said plurality of forward connecting links and each stage of said y stages in each block of said plurality of blocks comprises only one switch of said one or more switches connecting said plurality of backward connecting links and said multi-stage network is rearrangeably nonblocking for unicast multi-link butterfly fat tree network, or*

*each stage of said y stages in each block of said plurality of blocks comprises at least two switches of said one or more switches connecting said plurality of forward connecting links and each stage of said y stages in each*

*block of said plurality of blocks comprises at least two switches of said one or more switches connecting said plurality of backward connecting links and said multi-stage network is strictly nonblocking for unicast multi-link butterfly fat tree network and rearrangeably nonblocking for arbitrary fan-out multicast multi-link butterfly fat tree network, or*

*each stage of said y stages in each block of said plurality of blocks comprises at least three switches of said one or more switches connecting said plurality of forward connecting links and each stage of said y stages in each block of said plurality of blocks comprises at least three switches of said one or more switches connecting said plurality of backward connecting links and said multi-stage network is strictly nonblocking for arbitrary fan-out multicast multi-link butterfly fat tree network.*

*60. The multi-stage network of claim 51, wherein said plurality of cross middle links between switches of said one or more switches in any two succeeding stages of said y stages are of different length and said plurality of cross middle links between switches of said one or more switches in any two succeeding stages of said y stages are of different width and* $y \geq (\log_2 N)$*, where* $N>2$*, and wherein* $d=4$ *and either*

*each stage of said y stages in each block of said plurality of blocks comprises only one switch of said one or more switches connecting said plurality of forward connecting links and each stage of said y stages in each block of said plurality of blocks comprises only one switch of said one or more switches connecting said plurality of backward connecting links and said multi-stage network is rearrangeably nonblocking for unicast generalized multi-link multi-stage network, or*

*each stage of said y stages in each block of said plurality of blocks comprises at least two switches of said one or more switches connecting said plurality of forward connecting links and each stage of said y stages in each block of said plurality of blocks comprises at least two switches of said one or more switches connecting said plurality of backward connecting links and said multi-stage network is strictly nonblocking for unicast generalized multi-link multi-stage network and rearrangeably nonblocking for arbitrary fan-out multicast generalized multi-link multi-stage network, or*

*each stage of said y stages in each block of said plurality of blocks comprises at least three switches of said one or more switches connecting said plurality of forward connecting links and each stage of said y stages in each block of said plurality of blocks comprises at least three switches of said one or more switches connecting said plurality of backward connecting links and said multi-stage network is strictly nonblocking for arbitrary fan-out multicast generalized multi-link multi-stage network.*

*61. The multi-stage network of claim 51, wherein said plurality of cross middle links between switches of said one or more switches in any two succeeding stages of said y stages are of different length and said plurality of cross middle links between switches of said one or more switches in any two succeeding stages of said y stages are of different width and* $y \geq (\log_2 N)$*, where* $N>2$*, and*

*each block of said plurality of blocks further comprising a plurality of U-turn links within switches of said one or more switches in each stage of said y stages in each block of said plurality of blocks, and wherein* $d=4$ *and either*

*each stage of said y stages in each block of said plurality of blocks comprises only one switch of said one or more switches connecting said plurality of forward connecting links and each stage of said y stages in each block of said plurality of blocks comprises only one switch of said one or more switches connecting said plurality of backward connecting links and said multi-stage network is rearrangeably nonblocking for unicast generalized multi-link butterfly fat tree network, or*

*each stage of said y stages in each block of said plurality of blocks comprises at least two switches of said one or more switches connecting said plurality of forward connecting links and each stage of said y stages in each block of said plurality of blocks comprises at least two switches of said one or more switches connecting said plurality of backward connecting links and said multi-stage network is strictly nonblocking for unicast generalized multi-link butterfly fat tree Network and rearrangeably nonblocking for arbitrary fan-out multicast generalized multi-link butterfly fat tree network, or each stage of said y stages in each block of said plurality of blocks comprises at least three switches of said one or more switches connecting said plurality of forward connecting links and each stage of said y stages in each block of said plurality of blocks comprises at least three switches of said one or more switches connecting said plurality of backward connecting links and said multi-stage network is strictly nonblocking for arbitrary fan-out multicast generalized multi-link butterfly fat tree network.*

* * * * *